(12) United States Patent
Yashima

(10) Patent No.: US 9,188,853 B2
(45) Date of Patent: Nov. 17, 2015

(54) CHARGED PARTICLE BEAM DRAWING APPARATUS AND CONTROL METHOD THEREOF

(75) Inventor: Jun Yashima, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 249 days.

(21) Appl. No.: 13/111,311

(22) Filed: May 19, 2011

(65) Prior Publication Data

US 2011/0291029 A1    Dec. 1, 2011

(30) Foreign Application Priority Data

May 26, 2010   (JP) .................................. 2010-120378

(51) Int. Cl.
| | | |
|---|---|---|
| *A61N 5/00* | (2006.01) | |
| *G03F 1/78* | (2012.01) | |
| *B82Y 10/00* | (2011.01) | |
| *B82Y 40/00* | (2011.01) | |
| *H01J 37/317* | (2006.01) | |

(52) U.S. Cl.
CPC . *G03F 1/78* (2013.01); *B82Y 10/00* (2013.01); *B82Y 40/00* (2013.01); *H01J 37/3174* (2013.01)

(58) Field of Classification Search
CPC .................................. G06N 7/00; H01J 31/00
USPC ............. 250/491.1, 492.1, 492.2, 492.3, 306, 250/307, 311
See application file for complete search history.

(56) References Cited

U.S. PATENT DOCUMENTS

| | | | | |
|---|---|---|---|---|
| 5,149,976 A | * | 9/1992 | Sipma .......................... | 250/492.2 |
| 6,072,185 A | * | 6/2000 | Arai et al. ................. | 250/492.22 |
| 6,182,089 B1 | * | 1/2001 | Ganapathy et al. .................... | 1/1 |
| 2008/0067426 A1 | * | 3/2008 | Kimura et al. ............. | 250/492.2 |
| 2008/0067431 A1 | * | 3/2008 | Horiuchi et al. ........... | 250/492.3 |

FOREIGN PATENT DOCUMENTS

| | | |
|---|---|---|
| JP | 02-260049 A | 10/1990 |
| JP | 09-293057 A | 11/1997 |
| JP | 2003-124100 A | 4/2003 |
| JP | 2005-252394 A | 9/2005 |
| JP | 2007-052563 A | 3/2007 |
| JP | 2007-226587 A | 9/2007 |
| JP | 2008-71929 | 3/2008 |
| JP | 2008-218767 | 9/2008 |
| JP | 2010-73918 | 4/2010 |

OTHER PUBLICATIONS

U.S. Appl. No. 13/288,530, filed Nov. 3, 2011, Yashima.
U.S. Appl. No. 13/235,432, filed Sep. 18, 2011, Nakayamada, et al.
U.S. Appl. No. 13/765,140, filed Feb. 12, 2013, Kato, et al.
Combined Office Action and Search Report issued Sep. 18, 2013 in Taiwanese Patent Application No. 100117851 with English language translation.
Office Action issued Jan. 28, 2014 in Japanese Patent Application No. 2010-120378 (with English language translation).

\* cited by examiner

*Primary Examiner* — Jack Berman
*Assistant Examiner* — Jason McCormack
(74) *Attorney, Agent, or Firm* — Oblon, McClelland, Maier & Neustadt, L.L.P.

(57) ABSTRACT

In a charged particle beam drawing apparatus, if at least one of calculating portions is free and at least one memory includes a free portion, a report that a next process can be additionally started by using at least one free calculating portion and the free portion of the memory, is transferred from a daemon to a writing control unit, and the next process is additionally started by the daemon on the basis of a start request transferred from the writing control unit to the daemon. If there is a possibility of a shortage of the calculating portions and the memory, and if a start request for starting a next process is transferred from the writing control unit to the daemon, the start request for starting the next process is refused by the daemon.

10 Claims, 18 Drawing Sheets

CHARGED PARTICLE BEAM DRAWING APPARATUS AND CONTROL METHOD THEREOF

CROSS-REFERENCE TO RELATED APPLICATION

This application is based upon and claims the benefit of priority from the prior Japanese Patent Application No. 2010-120378 filed on May 26, 2010 in Japan, the entire contents of which are incorporated herein by reference.

BACKGROUND OF THE INVENTION

1. Field of the Invention

The present invention relates to a charged particle beam drawing apparatus and control method thereof, wherein patterns corresponding to figures included in a drawing data are drawn in a drawing area of a workpiece by applying a charged particle beam to the workpiece, wherein a resist is applied to an upper surface of the workpiece.

2. Description of Related Art

As is known in the prior art, in a charged particle beam drawing apparatus, patterns corresponding to figures included in a drawing data are drawn in a drawing area of a workpiece by applying a charged particle beam to the workpiece, wherein a resist is applied to an upper surface of the workpiece. For example, the charged particle beam drawing apparatus in the prior art is described in paragraphs 0013, 0021, 0024, 0025, and 0033 of Japanese Unexamined Patent Publication No. 2010-73918. In the charged particle beam drawing apparatus described in Japanese Unexamined Patent Publication No. 2010-73918, shot data for applying the charged particle beam is formed on the basis of the drawing data, by means of a shot forming system (shot data forming portion) (see paragraphs from 0033 to 0038 of Japanese Unexamined Patent Publication No. 2010-73918).

Also, as is known in the prior art, in a charged particle beam drawing apparatus, a parallel processing unit (PPU) is provided. For example, the charged particle beam drawing apparatus in the prior art is described in paragraphs 0022 and 0028 of Japanese Unexamined Patent Publication No. 2008-218767. And, as is known in the prior art, in a charged particle beam drawing apparatus, a writing control unit (WCU) is provided. For example, the charged particle beam drawing apparatus in the prior art is described in a paragraphs 0021 of Japanese Unexamined Patent Publication No. 2008-71929.

In a conventional charged particle beam drawing apparatus in the prior art, such as the charged particle beam drawing apparatus described in Japanese Unexamined Patent Publication Nos. 2010-73918, 2008-218767 and 2008-71929, a process, such as an Area process corresponding to a block frame, and another process, such as an Area process corresponding to another block frame, are performed in parallel by central processing units (CPUs) of the parallel processing unit (PPU). A predetermined number of central processing units (CPUs) are simultaneously used, so that a memory utilization rate of the parallel processing unit (PPU) does not exceed a predetermined value.

In one case, an actual processing load while a process corresponding to a block frame is performed, may be considerably smaller than an estimated processing load, because of diversification of the drawing data inputted to the charged particle beam drawing apparatus. In that case, in a conventional charged particle beam drawing apparatus in the prior art, only the predetermined number of central processing units (CPUs) are simultaneously used. Namely, in the conventional charged particle beam drawing apparatus in the prior art, if the actual processing load is considerably smaller than the estimated processing load, the number of central processing units (CPUs) are simultaneously used, wherein the number of central processing units (CPUs) is smaller than a number of usable central processing units (CPUs). Consequently, in the conventional charged particle beam drawing apparatus in the prior art, if the actual processing load is considerably smaller than the estimated processing load, throughput cannot be sufficiently increased.

In another case, an actual processing load may be considerably larger than an estimated processing load, while a process corresponding to a block frame is performed, because of diversification of the drawing data inputted to the charged particle beam drawing apparatus and miniaturization of figures included in the drawing data. In that case, in a conventional charged particle beam drawing apparatus in the prior art, the predetermined number of central processing units (CPUs) are simultaneously used. Namely, in the conventional charged particle beam drawing apparatus in the prior art, if the actual processing load is considerably larger than the estimated processing load, the memory utilization rate of the parallel processing unit (PPU) may exceed a limit value. In the conventional charged particle beam drawing apparatus in the prior art, if the memory utilization rate of the parallel processing unit (PPU) exceeds the limit value, a process of the parallel processing unit (PPU) is performed by using a storage device, wherein processing speed and accessing speed of the storage device is slower than processing speed and accessing speed of a memory of the parallel processing unit (PPU), accordingly, throughput may be considerably decreased.

SUMMARY OF THE INVENTION

An object of the present invention is to provide an charged particle beam drawing apparatus and control method thereof, which can increase throughput.

In detail, the object of the present invention is to provide the charged particle beam drawing apparatus and control method thereof, which can increase throughput if an actual processing load is smaller than an estimated processing load and if an actual processing load is larger than an estimated processing load.

In detail, the object of the present invention is to provide the charged particle beam drawing apparatus and control method thereof, which can increase throughput when a processing portion has at least one free calculating portion and a memory of the processing portion has a free portion, and when a possibility of a shortage of calculating portions and a memory of a processing portion exists.

In accordance with one aspect of the present invention, a charged particle beam drawing apparatus, comprising: a drawing portion for drawing patterns corresponding to figures included in a drawing data, in a drawing area of a workpiece, by irradiating the workpiece with a charged particle beam, wherein the workpiece is formed by applying a resist to an upper surface of the workpiece; a shot forming system for forming and outputting a shot data on the basis of the drawing data, in order to apply the charged particle beam; at least one processing portion for performing a process for forming the shot data, and for performing a process for outputting the shot data, wherein the at least one processing portion is provided with the shot forming system; a writing control unit for performing a process for managing the at least one processing portion, wherein the writing control unit is provided with the shot forming system; a plurality of calculating portions provided with the at least one processing portion; at least one memory provided with the at least one processing portion, wherein the memory is used by the plurality of calculating portions; and at least one daemon provided with the at least one processing portion, wherein the daemon judges if at least one of the calculating portions is free, judges if the memory includes a free portion, and judges if there is a possibility of a shortage of the calculating portions and the memory, and wherein if at least one of the calculating portions is free and the memory includes the free portion, a report that a next process can be additionally started by using at least one free calculating portion and the free portion of the memory, is transferred from the daemon to the writing control unit, and the next process is additionally started by the daemon on the basis of a start request transferred from the writing control unit to the daemon, and wherein if there is a possibility of a shortage of the calculating portions and the memory, and if a start request for starting a next process is transferred from the writing control unit to the daemon, the start request for starting the next process is refused by the daemon is provided.

In accordance with another aspect of the present invention, a control method of a charged particle beam drawing apparatus for drawing patterns corresponding to figures included in a drawing data, in a drawing area of a workpiece, by irradiating the workpiece with a charged particle beam, wherein the workpiece is formed by applying a resist to an upper surface of the workpiece, comprising: performing a process for forming a shot data and a process for outputting the shot data, by using at least one processing portion provided with a shot forming system, on the basis of the drawing data, in order to apply the charged particle beam; performing a process for managing the at least one processing portion, by using a writing control unit provided with the shot forming system; judging if at least one of calculating portions provided with the at least one processing portion is free, by using at least one daemon provided with the at least one processing portion; judging if at least one memory provided with the at least one processing portion includes a free portion, by using the at least one daemon, wherein the memory is used by the calculating portions; and judging if there is a possibility of a shortage of the calculating portions and the memory, by using the at least one daemon, wherein if at least one of the calculating portions is free and the memory includes the free portion, a report that a next process can be additionally started by using at least one free calculating portion and the free portion of the memory, is transferred from the daemon to the writing control unit, and the next process is additionally started by the daemon on the basis of a start request transferred from the writing control unit to the daemon, and wherein if there is a possibility of a shortage of the calculating portions and the memory, and if a start request for starting a next process is transferred from the writing control unit to the daemon, the start request for starting the next process is refused by the daemon is provided.

Other and further objects, features and advantages of the invention will appear more fully from the following description.

DETAILED DESCRIPTION OF THE INVENTION

Figure 1:
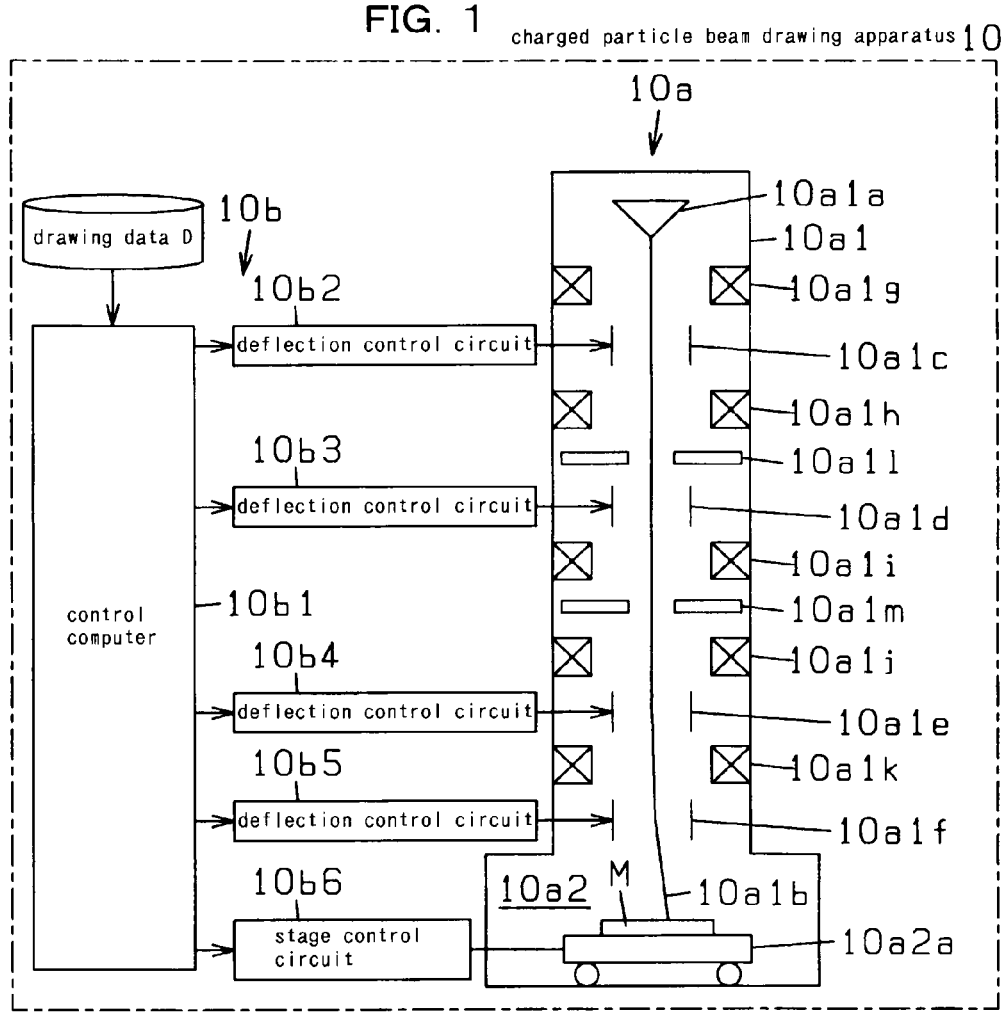
FIG. 1 is a schematic illustration of a first embodiment of a charged particle beam drawing apparatus 10 according to the present invention.
Figure 2:
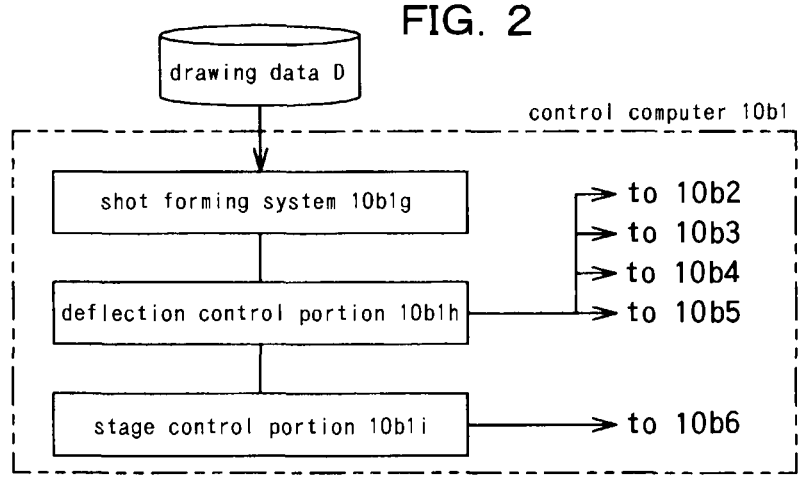
FIG. 2 shows a control computer 10$b$1 of a control portion 10$b$ of the charged particle beam drawing apparatus 10 of the first embodiment shown in FIG. 1, in detail.

FIG. 1 is a schematic illustration of a first embodiment of a charged particle beam drawing apparatus 10 according to the present invention. FIG. 2 shows a control computer 10$b$1 of a control portion 10$b$ of the charged particle beam drawing apparatus 10 of the first embodiment shown in FIG. 1, in detail. As shown in FIG. 1, the charged particle beam drawing apparatus 10 of the first embodiment has a drawing portion 10a for drawing patterns PA1, PA2, PA3 (see FIG. 5) in a drawing area DA (see FIG. 5) of a workpiece M, such as a mask substrate (reticle) and a wafer, by irradiating the workpiece M with a charged particle beam 10a1b, wherein the workpiece M is formed by applying a resist to an upper surface of the workpiece M.

In the charged particle beam drawing apparatus 10 of the first embodiment, an electron beam is used as the charged particle beam 10a1b. In the charged particle beam drawing apparatus 10 of a second embodiment, a charged particle beam such as an ion beam, except the electron beam can be used as the charged particle beam 10a1b.

In the charged particle beam drawing apparatus 10 of the first embodiment, as shown in FIG. 1, the drawing portion 10a has a charged particle beam gun 10a1a, deflectors 10a1c, 10a1d, 10a1e, 10a1f for deflecting the charged particle beam 10a1b emitted from the charged particle beam gun 10a1a, and a movable stage 10a2a for supporting the workpiece M. Patterns are drawn on the workpiece M by the charged particle beam 10a1b deflected by the deflectors 10a1c, 10a1d, 10a1e, 10a1f.

In the charged particle beam drawing apparatus 10 of the first embodiment, as shown in FIG. 1, a drawing chamber 10a2 composes a part of the drawing portion 10a. The movable stage 10a2a for supporting the workpiece M is placed in the drawing chamber 10a2. The stage 10a2a is movable in x axis direction (right and left direction in FIGS. 1 and 5) and movable in y axis direction (up and down direction in FIG. 5), y axis direction is perpendicular to x axis direction.

In the charged particle beam drawing apparatus 10 of the first embodiment, as shown in FIG. 1, an optical column 10a1 composes a part of the drawing portion 10a. The charged particle beam gun 10a1a, the deflectors 10a1c, 10a1d, 10a1e, 10a1f, lenses 10a1g, 10a1h, 10a1i, 10a1j, 10a1k, a first forming aperture member 10a1l and a second forming aperture member 10a1m are placed in the optical column 10a1.

In detail, in the charged particle beam drawing apparatus 10 of the first embodiment, as shown in FIGS. 1 and 2, a drawing data D corresponding to the drawing data DA (see FIG. 5) of the workpiece M is inputted to the control computer 10b1 of the control portion 10b, and then, the drawing data D is transferred to a shot forming system 10b1g. Then, the drawing data D transferred to the shot forming system 10b1g is processed by the shot forming system 10b1g, so that a shot data for applying the charged particle beam 10a1b is formed in order to draw patterns PA1, PA2, PA3 (see FIG. 5) on the resist in the drawing area DA (see FIG. 5) of the workpiece.

Then, in the charged particle beam drawing apparatus 10 of the first embodiment, as shown in FIGS. 1 and 2, the shot data formed by the shot forming system 10b1g, is transferred to a deflection control portion 10b1h. Then, the deflectors 10a1c, 10a1d, 10a1e, 10a1f are controlled by the deflection control portion 10b1h on the basis of the shot data. Accordingly, the charged particle beam 10a1b emitted from the charged particle beam gun 10a1a is applied to a predetermined position in the drawing area DA (see FIG. 5) of the workpiece M.

In detail, in the charged particle beam drawing apparatus 10 of the first embodiment, as shown in FIGS. 1 and 2, the charged particle beam 10a1b emitted from the charged particle beam gun 10a1a is passed through an opening 10a1l' (see FIG. 3) of the first forming aperture member 10a1l and the workpiece M is irradiated with the charged particle beam 10a1b, or the charged particle beam 10a1b emitted from the charged particle beam gun 10a1a is interrupted by a part of the first forming aperture member 10a1l except the opening 10a1l' and the workpiece M is not irradiated with the charged particle beam 10a1b, by controlling a blanking deflector 10a1c via a deflection control circuit 10b2 by means of the deflection control portion 10b1h on the basis of the shot data formed by the shot forming system 10b1g. In other words, in the charged particle beam drawing apparatus 10 of the first embodiment, dose (beam irradiation time) of the charged particle beam 10a1b can be controlled by controlling the blanking deflector 10a1c.

In the charged particle beam drawing apparatus 10 of the first embodiment, as shown in FIGS. 1 and 2, a beam size changing deflector 10a1d is controlled via a deflection control circuit 10b3 by the deflection control portion 10b1h on the basis of the shot data formed by the shot forming system 10b1g, so that the charged particle beam 10a1b passed through the opening 10a1l' (see FIG. 3) of the first forming aperture member 10a1l is deflected by the beam size changing deflector 10a1d. And then, a part of the charged particle beam 10a1b deflected by the beam size changing deflector 10a1d is passed through an opening 10a1m' (see FIG. 3) of the second forming aperture member 10a1m. In other words, in the charged particle beam drawing apparatus 10 of the first embodiment, size or shape of the charged particle beam 10a1b applied to the drawing area DA (see FIG. 5) of the workpiece M can be adjusted by adjusting deflecting amount or deflecting direction of the charged particle beam 10a1b deflected by the beam size changing deflector 10a1d.

Figure 3:
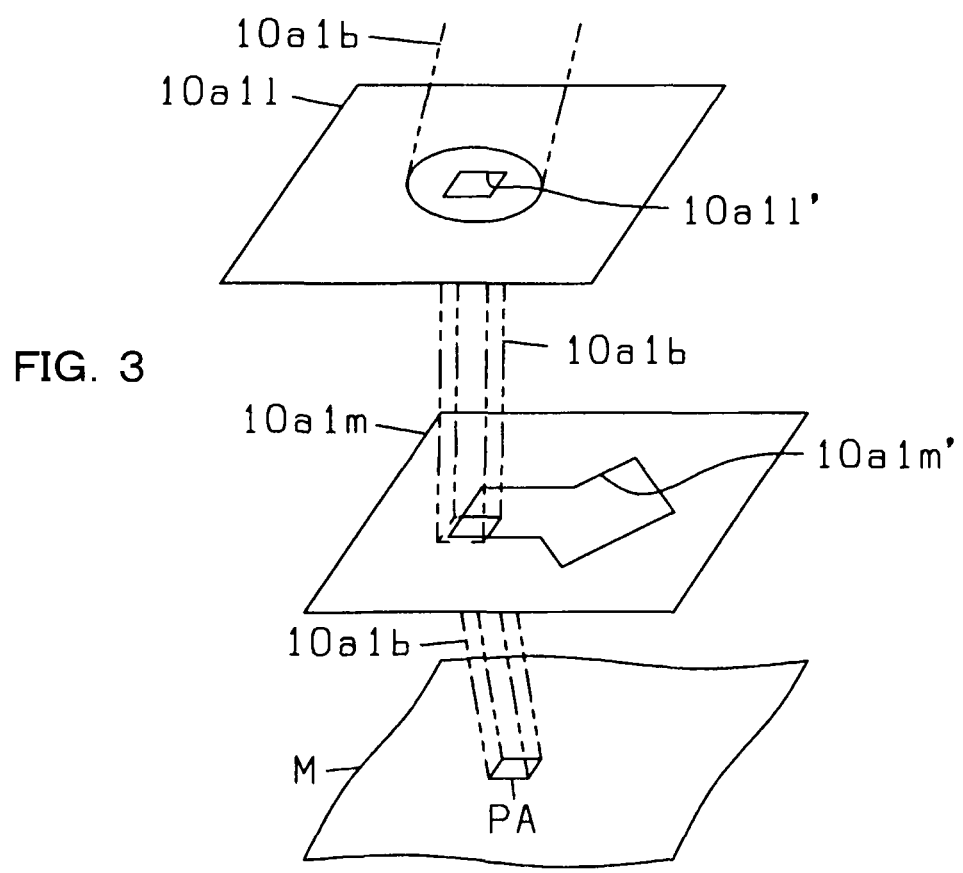
FIG. 3 shows an example of a pattern PA which can be drawn on the resist of the workpiece M by a shot of the charged particle beam 10$a$1$b$ in the charged particle beam drawing apparatus 10 of the first embodiment.

FIG. 3 shows an example of a pattern PA which can be drawn on the resist of the workpiece M by a shot of the charged particle beam 10a1b in the charged particle beam drawing apparatus 10 of the first embodiment. In the charged particle beam drawing apparatus 10 of the first embodiment, as shown in FIGS. 1 and 3, when the pattern PA (see FIG. 3) is drawn on the resist of the workpiece M by the charged particle beam 10a1b, a part of the charged particle beam 10a1b emitted from the charged particle beam gun 10a1a (see FIG. 1) is passed through the square opening 10a1l' (see FIG. 3) of the first forming aperture member 10a1l. So that, a horizontal sectional shape of the charged particle beam 10a1b passed through the opening 10a1l' of the first forming aperture member 10a1l is almost square. And then, a part of the charged particle beam 10a1b passed through the opening 10a1l' of the first forming aperture member 10a1l is passed through the opening 10a1m' (see FIG. 3) of the second forming aperture member 10a1m.

In the charged particle beam drawing apparatus 10 of the first embodiment, as shown in FIGS. 1 and 3, a horizontal sectional shape of the charged particle beam 10a1b passed through the opening 10a1m' (see FIG. 3) of the second forming aperture member 10a1m can be rectangular (square or oblong) or triangular, by deflecting the charged particle beam 10a1b passed through the opening 10a1l' (see FIG. 3) of the first forming aperture member 10a1l by means of the beam size changing deflector 10a1d.

In the charged particle beam drawing apparatus 10 of the first embodiment, as shown in FIGS. 1 and 3, the pattern PA (see FIG. 3) having the same shape as the horizontal sectional shape of the charged particle beam 10a1b passed through the opening 10a1m' (see FIG. 3) of the second forming aperture member 10a1m can be drawn on the resist of the workpiece M, by applying the charged particle beam 10a1b passed through the opening 10a1m' (see FIG. 3) of the second forming aperture member 10a1m, to a predetermined position on the resist of the workpiece M, for a predetermined time.

In the charged particle beam drawing apparatus 10 of the first embodiment, as shown in FIGS. 1 and 2, the deflector 10a1e is controlled via a deflection control circuit 10b4 by the deflection control portion 10b1h on the basis of the shot data formed by the shot forming system 10b1g, so that the charged particle beam 10a1b passed through the opening 10a1m' (see FIG. 3) of the second forming aperture member 10a1m is deflected by the deflector 10a1e.

In the charged particle beam drawing apparatus 10 of the first embodiment, as shown in FIGS. 1 and 2, the deflector 10a1f is controlled via a deflection control circuit 10b5 by the deflection control portion 10b1h on the basis of the shot data formed by the shot forming system 10b1g, so that the charged particle beam 10a1b deflected by the deflector 10a1e is deflected by the deflector 10a1f. In the charged particle beam drawing apparatus 10 of the first embodiment, the irradiation position of the charged particle beam 10a1b in the drawing area DA (see FIG. 5) of the workpiece M can be adjusted by adjusting deflecting amount and deflecting direction of the charged particle beam 10a1b by means of the deflector 10a1e and the deflector 10a1f.

In the charged particle beam drawing apparatus 10 of the first embodiment, as shown in FIGS. 1 and 2, movement of the movable stage 10a2a is controlled via a stage control circuit 10b6 by a stage control portion 10b1i on the basis of the shot data formed by the shot forming system 10b1g.

In the example shown in FIGS. 1 and 2, a CAD data (layout data, design data) prepared by a designer such as a semiconductor integrated circuit designer, is converted into the drawing data D of the format of the charged particle beam drawing apparatus 10. And then, the drawing data D is inputted to the control computer 10b1 of the control portion 10b of the charged particle beam drawing apparatus 10. In general, a plurality of small patterns are included in the CAD data (layout data, design data), so that the amount of the CAD data (layout data, design data) is very large. In general, after the CAD data (layout data, design data) is converted into a different format data, the amount of the data increases. Therefore, in order to compress the amount of the CAD data (layout data, design data) and the drawing data D inputted to the control computer 10b1 of the control portion 10b of the charged particle beam drawing apparatus 10, the CAD data (layout data, design data) and the drawing data D have hierarchical structure.

Figure 4:
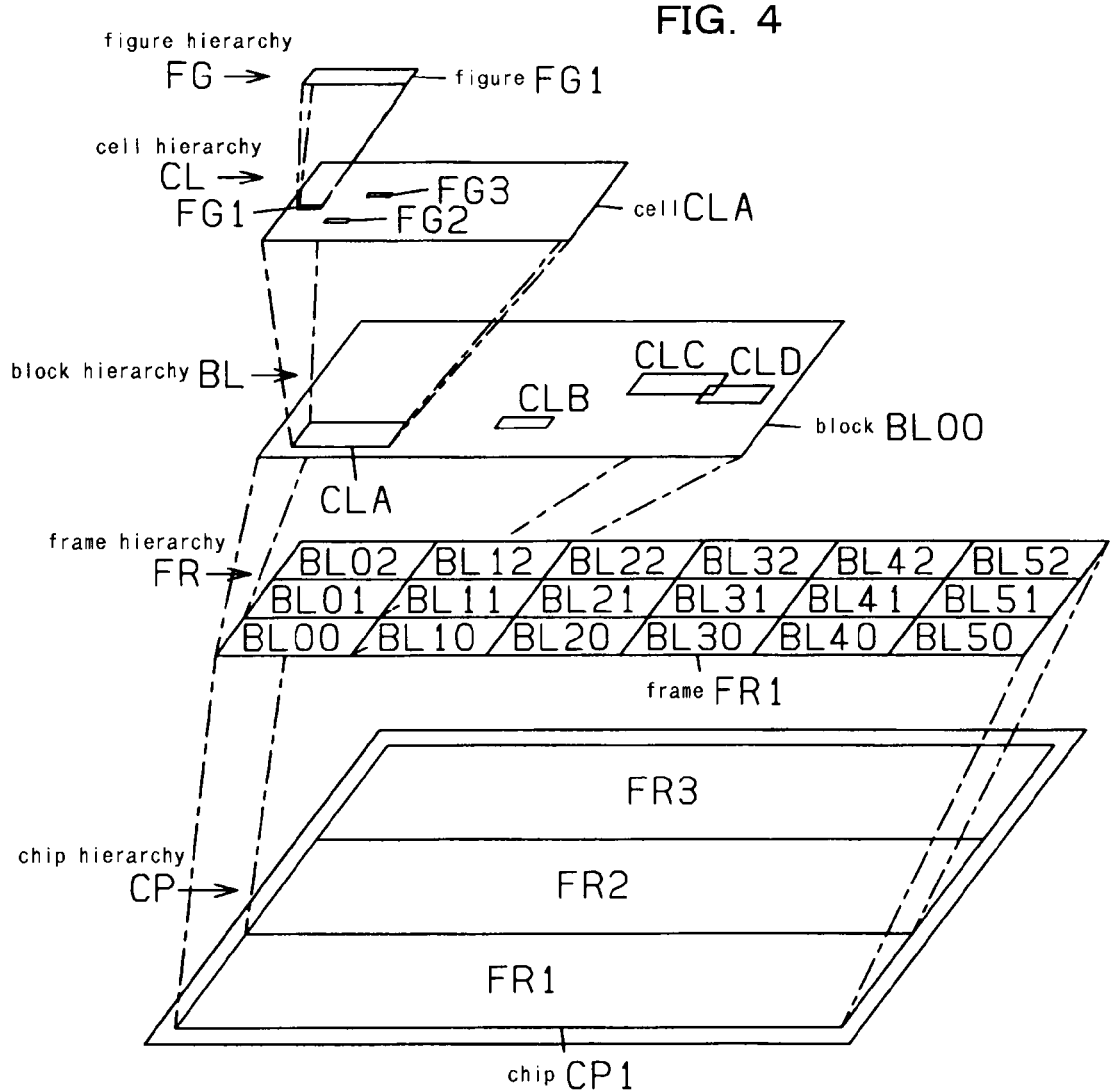
FIG. 4 shows an example of a portion of the drawing data D shown in FIGS. 1 and 2.

FIG. 4 shows an example of a part of the drawing data D shown in FIGS. 1 and 2. In the example shown in FIG. 4, the drawing data D (see FIGS. 1 and 2) applied to the charged particle beam drawing apparatus 10 of the first embodiment, has a chip hierarchy CP, a frame hierarchy FR which is lower than the chip hierarchy CP, a block hierarchy BL which is lower than the frame hierarchy FR, a cell hierarchy CL which is lower than the block hierarchy BL, and a figure hierarchy FG which is lower than the cell hierarchy CL.

In the example shown in FIG. 4, a chip CP1 is one of elements of the chip hierarchy CP, and corresponds to three frames FR1, FR2, FR3. The frame FR1 is one of elements of the frame hierarchy FR, and corresponds to eighteen blocks BL00, BL10, BL20, BL30, BL40, BL50, BL01, BL11, BL21, BL31, BL41, BL51, BL02, BL12, BL22, BL32, BL42, BL52. The block BL00 is one of elements of the block hierarchy BL, and corresponds to cells CLA, CLB, CLC, CLD. The cell CLA is one of elements of the cell hierarchy CL, and corresponds to a plurality of figures FG1, FG2, FG3. Each of the figures FG1, FG2, FG3 is one of elements of the figure hierarchy FG.

In the charged particle beam drawing apparatus 10 of the first embodiment, as shown in FIGS. 1, 2 and 4, the charged particle beam 10a1b (see FIG. 1) draws patterns PA1, PA2, PA3 (see FIG. 5) in the drawing area DA (see FIG. 5) of the workpiece M (see FIGS. 1 and 5), and the patterns PA1, PA2, PA3 (see FIG. 5) correspond to the plurality of figures FG1, FG2, FG3 (see FIG. 4) in the figure hierarchy FG (see FIG. 4) in the drawing data D (see FIGS. 1 and 2).

Figure 5:
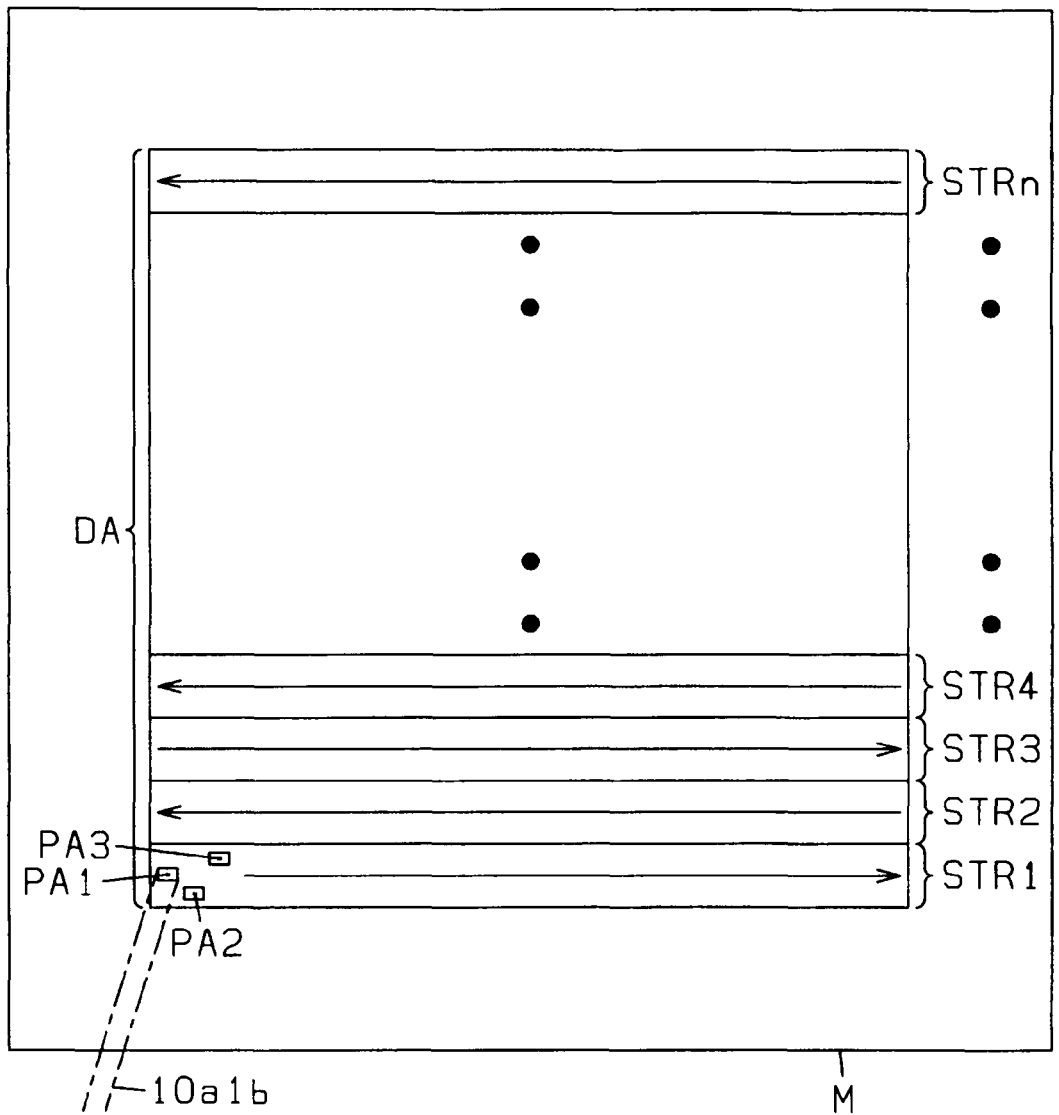
FIG. 5 explains a sequence of drawing of patterns PA1, PA2, PA3 corresponding to figures FG1, FG2, FG3 included in the drawing data D by means of the charged particle beam 10$a$1$b$.

FIG. 5 explains a sequence of drawing of patterns PA1, PA2, PA3 corresponding to figures FG1, FG2, FG3 included in the drawing data D by means of the charged particle beam 10a1b. In an example shown in FIG. 5, the drawing area DA of the workpiece M is virtually divided into belt-shaped (rectangular) stripe frames STR1, STR2, STR3, STR4 to STRn, wherein the number of the stripe frames STR1, STR2, STR3, STR4 to STRn is n.

In the example shown in FIG. 5, the charged particle beam 10a1b is scanned in the stripe frame STR1 from a left side of FIG. 5 to a right side of FIG. 5, so that the patterns PA1, PA2, PA3 etc. corresponding to the plurality of the figures FG1, FG2, FG3 (see FIG. 4) etc. included in the drawing data D (see FIGS. 1 and 2) are drawn in the stripe frame STR1 of the workpiece M by the charged particle beam 10a1b. Then, the charged particle beam 10a1b is scanned in the stripe frame STR2 from the right side of FIG. 5 to the left side of FIG. 5, so that patterns (not shown) corresponding to the plurality of figures included in the drawing data D are drawn in the stripe frame STR2 of the workpiece M by the charged particle beam 10a1b. Then, similarly, patterns (not shown) corresponding to the plurality of figures included in the drawing data D are drawn in the stripe frames STR3, STR4 to STRn of the workpiece M by the charged particle beam 10a1b.

In detail, in the example shown in FIG. 5, when the patterns PA1, PA2, PA3 are drawn in the stripe frame STR1 of the workpiece M by the charged particle beam 10a1b, the movable stage 10a2a (see FIG. 1) is controlled via the stage control circuit 10b6 (see FIG. 1) by the stage control portion 10b1i (see FIG. 2), so that the movable stage 10a2a is moved from the right side of FIG. 5 to the left side of FIG. 5. Then, before the patterns (not shown) are drawn in the stripe frame STR2 of the workpiece M by the charged particle beam 10a1b, the movable stage 10a2a (see FIG. 1) is controlled via the stage control circuit 10b6 (see FIG. 1) by the stage control portion 10b1i (see FIG. 2), so that the movable stage 10a2a is moved from an upper side of FIG. 5 to a lower side of FIG. 5.

Then, in the example shown in FIG. 5, when the patterns (not shown) are drawn in the stripe frame STR2 of the workpiece M by the charged particle beam 10a1b, the movable stage 10a2a (see FIG. 1) is controlled via the stage control circuit 10b6 (see FIG. 1) by the stage control portion 10b1i (see FIG. 2), so that the movable stage 10a2a is moved from the left side of FIG. 5 to the right side of FIG. 5.

Figure 6:
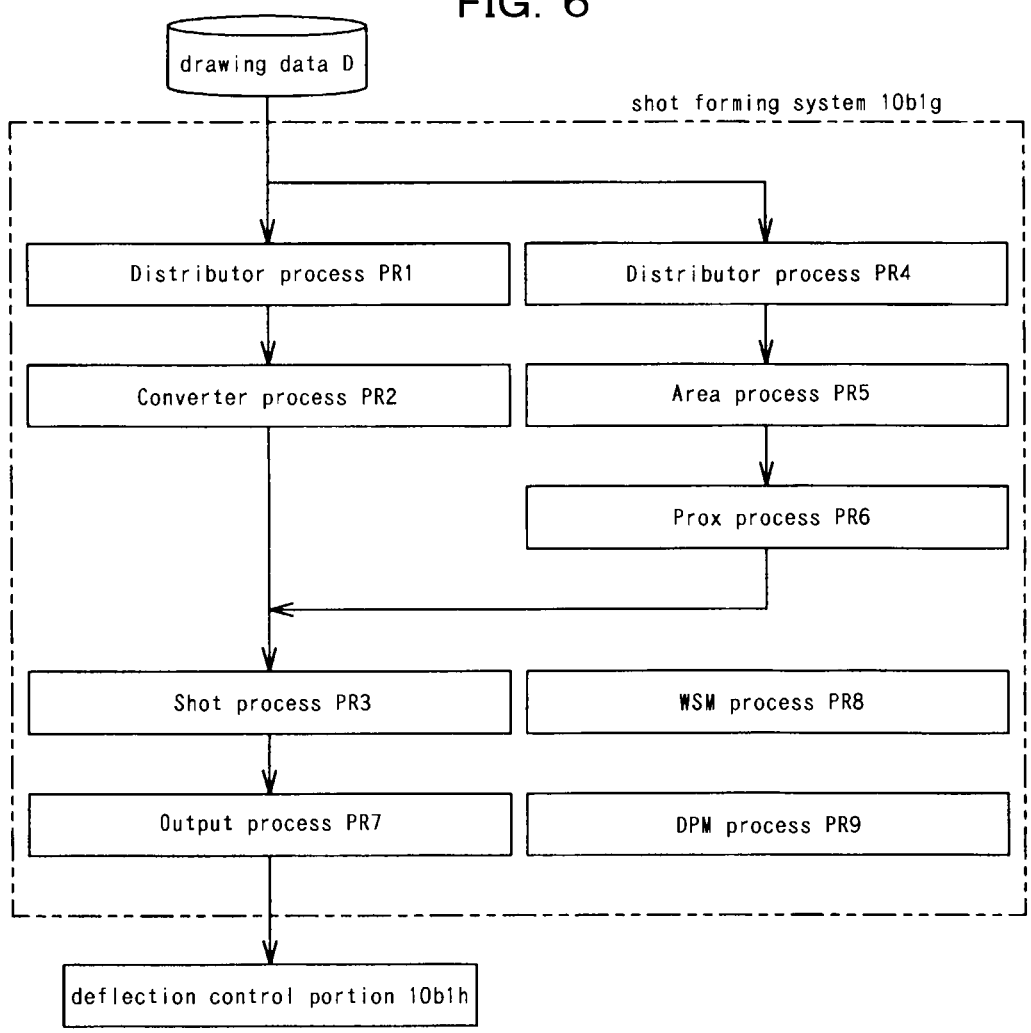
FIG. 6 explains processes PR1, PR2, PR3, PR4, PR5, PR6 for forming shot data, processes PR7 for outputting shot data and processes PR8, PR9 for managing the processes PR1, PR2, PR3, PR4, PR5, PR6, PR7, wherein the processes PR1, PR2, PR3, PR4, PR5, PR6 are performed by a shot forming system 10$b$1$g$.

FIG. 6 explains processes PR1, PR2, PR3, PR4, PR5, PR6 for forming shot data, processes PR7 for outputting shot data and processes PR8, PR9 for managing the processes PR1, PR2, PR3, PR4, PR5, PR6, PR7, wherein the processes PR1, PR2, PR3, PR4, PR5, PR6 are performed by a shot forming system 10b1g.

Figure 7:
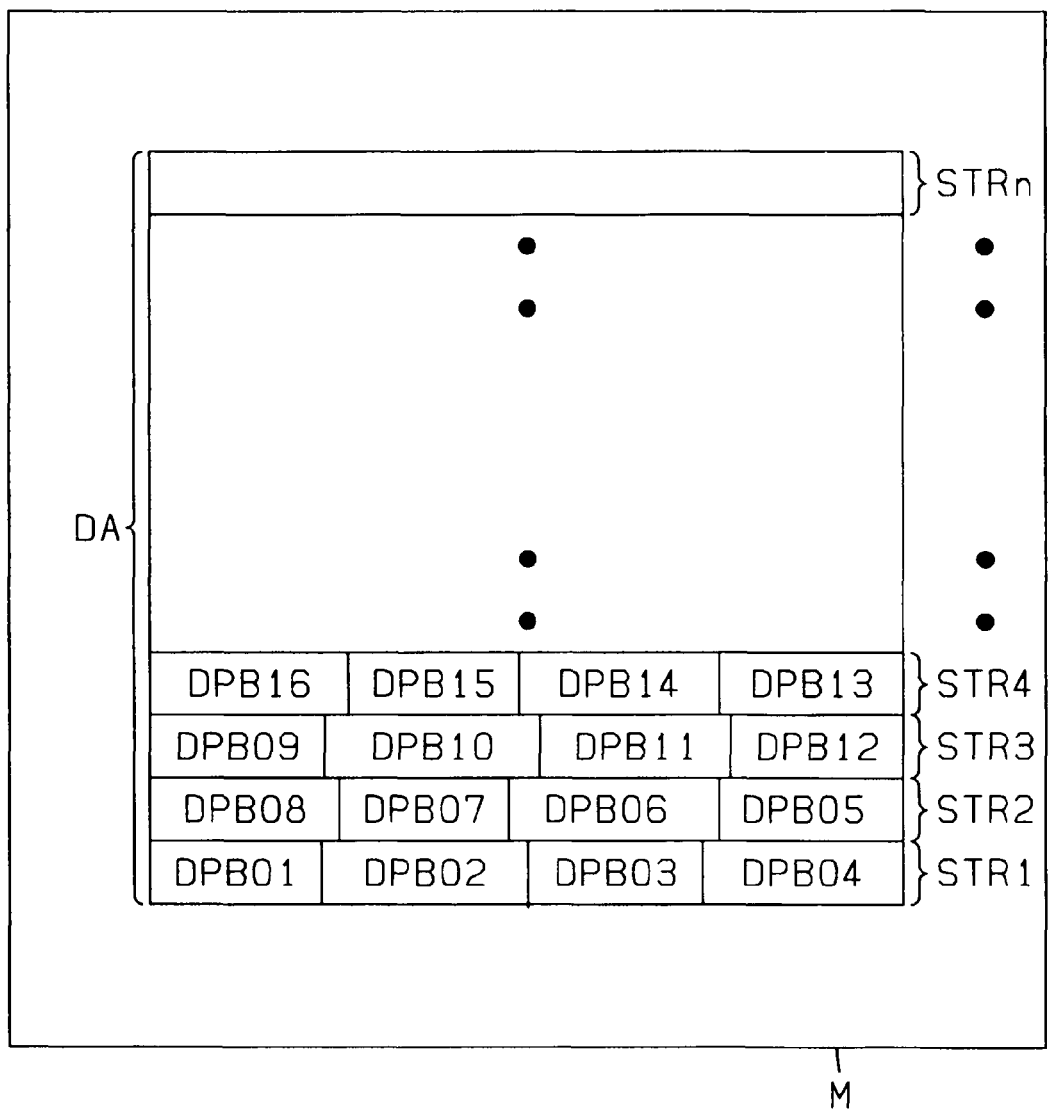
FIG. 7 explains block frames DPB01, DPB02, DPB03, DPB04, DPB05, DPB06, DPB07, DPB08, DPB09, DPB10, DPB11, DPB12, DPB13, DPB14, DPB15, DPB16 etc. formed by virtually dividing stripe frames STR1, STR2, STR3, STR4 to STRn.

FIG. 7 explains block frames DPB01, DPB02, DPB03, DPB04, DPB05, DPB06, DPB07, DPB08, DPB09, DPB10, DPB11, DPB12, DPB13, DPB14, DPB15, DPB16 etc. formed by virtually dividing stripe frames STR1, STR2, STR3, STR4 to STRn.

In the charged particle beam drawing apparatus 10 of the first embodiment, as shown in FIGS. 2 and 6, the drawing data D corresponding to the drawing area DA (see FIG. 5) of the workpiece M (see FIG. 5) is inputted to the shot forming system 10b1g, and then, the drawing area DA (see FIG. 5) of the workpiece M (see FIG. 5) is virtually divided on the basis of a request from a WSM (Write Sequence Manager) process PR8 (see FIG. 6), so that the stripe frames STR1, STR2, STR3, STR4 to STRn (see FIG. 5) are formed. Then, the stripe frames STR1, STR2, STR3, STR4 to STRn (see FIGS.

5 and 7) are virtually divided by a DPM process (Data Pass Manager process) PR9 (see FIG. 6), so that a plurality of block frames DPB01, DPB02, DPB03, DPB04, DPB05, DPB06, DPB07, DPB08, DPB09, DPB10, DPB11, DPB12, DPB13, DPB14, DPB15, DPB16 etc. are formed.

In detail, in the charged particle beam drawing apparatus 10 of the first embodiment, the number of shots of the charged particle beam 10a1b (see FIG. 3) for drawing patterns PA1, PA2, PA3 (see FIG. 5) etc. corresponding to figures FG1, FG2, FG3 (see FIG. 4) etc. in the block frames DPB01, DPB02, DPB03, DPB04, DPB05, DPB06, DPB07, DPB08, DPB09, DPB10, DPB11, DPB12, DPB13, DPB14, DPB15, DPB16 (see FIG. 7) etc. are estimated, and then, size of each of the block frames DPB01, DPB02, DPB03, DPB04, DPB05, DPB06, DPB07, DPB08, DPB09, DPB10, DPB11, DPB12, DPB13, DPB14, DPB15, DPB16 (see FIG. 7) etc. is decided, so that the number of shots of the charged particle beam 10a1b (see FIG. 3) in each of the block frames DPB01, DPB02, DPB03, DPB04, DPB05, DPB06, DPB07, DPB08, DPB09, DPB10, DPB11, DPB12, DPB13, DPB14, DPB15, DPB16 (see FIG. 7) etc. is approximately equal.

Then, in the charged particle beam drawing apparatus 10 of the first embodiment, as shown in FIG. 6, a localizing process is performed by Distributor processes PR1, PR4 (see FIG. 6).

Concretely, in the charged particle beam drawing apparatus 10 of the first embodiment, as shown in FIGS. 2 and 6, block frame unit data corresponding to the block frame DPB01, block frame unit data corresponding to the block frame DPB02, block frame unit data corresponding to the block frame DPB03, block frame unit data corresponding to the block frame DPB04, block frame unit data corresponding to the block frame DPB05, block frame unit data corresponding to the block frame DPB06, block frame unit data corresponding to the block frame DPB07, block frame unit data corresponding to the block frame DPB08, block frame unit data corresponding to the block frame DPB09, block frame unit data corresponding to the block frame DPB10, block frame unit data corresponding to the block frame DPB11, block frame unit data corresponding to the block frame DPB12, block frame unit data corresponding to the block frame DPB13, block frame unit data corresponding to the block frame DPB14, block frame unit data corresponding to the block frame DPB15, block frame unit data corresponding to the block frame DPB16 etc. are formed from the drawing data D corresponding to all of the drawing area DA (see FIGS. 5 and 7) of the workpiece M (see FIGS. 5 and 7) by the Distributor processes PR1, PR4 (see FIG. 6).

In detail, in the example shown in FIGS. 4 and 7, cell data corresponding to the cells CLA, CLB, CLC, CLD (see FIG. 4) etc. placed in the block frame DPB01 (see FIG. 7), and figure data corresponding to the figures FG1, FG2, FG3 (see FIG. 4) etc. placed in the cells CLA, CLB, CLC, CLD (see FIG. 4) etc. are included in the block frame unit data corresponding to the block frame DPB01 (see FIG. 7). Cell data corresponding to the cells (not shown) placed in the block frame DPB02 (see FIG. 7), and figure data corresponding to the figures (not shown) placed in the cells (not shown) are included in the block frame unit data corresponding to the block frame DPB02 (see FIG. 7).

In the charged particle beam drawing apparatus 10 of the first embodiment, as shown in FIG. 6, a managing process for starting the Distributor processes PR1, PR4 and for exiting the Distributor processes PR1, PR4, is performed by the DPM process PR9. A process for managing the DPM process PR9 is performed by the WSM process PR8.

Then, in the charged particle beam drawing apparatus 10 of the first embodiment, as shown in FIG. 6, the block frame unit data corresponding to the block frame DPB01 (see FIG. 7), the block frame unit data corresponding to the block frame DPB02 (see FIG. 7), the block frame unit data corresponding to the block frame DPB03 (see FIG. 7), the block frame unit data corresponding to the block frame DPB04 (see FIG. 7), the block frame unit data corresponding to the block frame DPB05 (see FIG. 7), the block frame unit data corresponding to the block frame DPB06 (see FIG. 7), the block frame unit data corresponding to the block frame DPB07 (see FIG. 7), the block frame unit data corresponding to the block frame DPB08 (see FIG. 7), the block frame unit data corresponding to the block frame DPB09 (see FIG. 7), the block frame unit data corresponding to the block frame DPB10 (see FIG. 7), the block frame unit data corresponding to the block frame DPB11 (see FIG. 7), the block frame unit data corresponding to the block frame DPB12 (see FIG. 7), the block frame unit data corresponding to the block frame DPB13 (see FIG. 7), the block frame unit data corresponding to the block frame DPB14 (see FIG. 7), the block frame unit data corresponding to the block frame DPB15 (see FIG. 7), the block frame unit data corresponding to the block frame DPB16 (see FIG. 7) etc. formed by the Distributor process PR1, are outputted to a Converter process PR2. And the block frame unit data corresponding to the block frame DPB01 (see FIG. 7), the block frame unit data corresponding to the block frame DPB02 (see FIG. 7), the block frame unit data corresponding to the block frame DPB03 (see FIG. 7), the block frame unit data corresponding to the block frame DPB04 (see FIG. 7), the block frame unit data corresponding to the block frame DPB05 (see FIG. 7), the block frame unit data corresponding to the block frame DPB06 (see FIG. 7), the block frame unit data corresponding to the block frame DPB07 (see FIG. 7), the block frame unit data corresponding to the block frame DPB08 (see FIG. 7), the block frame unit data corresponding to the block frame DPB09 (see FIG. 7), the block frame unit data corresponding to the block frame DPB10 (see FIG. 7), the block frame unit data corresponding to the block frame DPB11 (see FIG. 7), the block frame unit data corresponding to the block frame DPB12 (see FIG. 7), the block frame unit data corresponding to the block frame DPB13 (see FIG. 7), the block frame unit data corresponding to the block frame DPB14 (see FIG. 7), the block frame unit data corresponding to the block frame DPB15 (see FIG. 7), the block frame unit data corresponding to the block frame DPB16 (see FIG. 7) etc. formed by the Distributor process PR4, are outputted to an Area process PR5.

Then, in the charged particle beam drawing apparatus 10 of the first embodiment, as shown in FIG. 6, a data conversion process is performed by the Converter process PR2. In detail, the data conversion process is performed by the Converter process PR2 for each of the block frame unit data, wherein the data conversion process includes a process for converting data of the same format as the drawing data D (see FIG. 6) into data of drawing apparatus internal format, and wherein the data of drawing apparatus internal format is intermediate data for forming the shot data.

In the charged particle beam drawing apparatus 10 of the first embodiment, as shown in FIG. 6, a managing process for starting the Converter process PR2 and for exiting the Converter process PR2, is performed by the DPM process PR9. A process for managing the DPM process PR9 is performed by the WSM process PR8.

In the charged particle beam drawing apparatus 10 of the first embodiment, as shown in FIG. 6, an area density map (not shown) for proximity effect correction is formed by the Area process PR5, so that the plurality of figures FG1, FG2, FG3 (see FIG. 4) etc. included in the drawing data D are placed in the area density map (not shown) for proximity effect correction, wherein the area density map for proximity effect correction has a plurality of meshes, and wherein the size of each mesh is 1 μm×1 μm. The area density map for proximity effect correction is described in FIGS. 10A, 10C and paragraph 0095 of Japanese Unexamined Patent Publication No. 2003-318077, in detail.

In detail, in the charged particle beam drawing apparatus 10 of the first embodiment, as shown in FIG. 6, a process for forming the area density map (not shown) for proximity effect correction is performed for one of block frame unit data by the Area process PR5, and another process for forming the area density map (not shown) for proximity effect correction is performed for another block frame unit data by the Area process PR5, in parallel. A managing process for starting the Area process PR5 and for exiting the Area process PR5, is performed by the DPM process PR9. A process for managing the DPM process PR9 is performed by the WSM process PR8.

Then, in the charged particle beam drawing apparatus 10 of the first embodiment, as shown in FIG. 6, proximity effect correction dose of the charged particle beam is calculated for each mesh, by a Prox process PR6, wherein the size of each mesh is 1 μm×1 μm. The proximity effect correction dose (optimum dose) of the charged particle beam is described in FIG. 10D and paragraphs 0041, 0044, 0072 and 0109 of Japanese Unexamined Patent Publication No. 2003-318077, in detail.

In detail, in the charged particle beam drawing apparatus 10 of the first embodiment, as shown in FIG. 6, a process for calculating the proximity effect correction dose of the charged particle beam is performed for one of block frame unit data by the Prox process PR6, and another process for calculating the proximity effect correction dose of the charged particle beam is performed for another block frame unit data by the Prox process PR6, in parallel. A managing process for starting the Prox process PR6 and for exiting the Prox process PR6, is performed by the DPM process PR9. A process for managing the DPM process PR9 is performed by the WSM process PR8.

Then, in the charged particle beam drawing apparatus 10 of the first embodiment, as shown in FIG. 6, the shot data for applying the charged particle beam $10a1b$ (see FIG. 1) is formed by a Shot process PR3, on the basis of result of the process by the Converter process PR2 and result of the process by the Prox process PR6.

In detail, in the charged particle beam drawing apparatus 10 of the first embodiment, as shown in FIG. 6, a process for forming the shot data is performed for one of block frame unit data by the Shot process PR3, and another process for forming the shot data is performed for another block frame unit data by the Shot process PR3, in parallel. A managing process for starting the Shot process PR3 and for exiting the Shot process PR3, is performed by the DPM process PR9. A process for managing the DPM process PR9 is performed by the WSM process PR8.

Then, in the charged particle beam drawing apparatus 10 of the first embodiment, as shown in FIG. 6, the shot data formed by the Shot process PR3, is outputted to the deflection control portion $10b1h$ (see FIGS. 2 and 6) by an Output process PR7. A managing process for starting the Output process PR7 and for exiting the Output process PR7, is performed by the DPM process PR9. A process for managing the DPM process PR9 is performed by the WSM process PR8.

Figure 8:
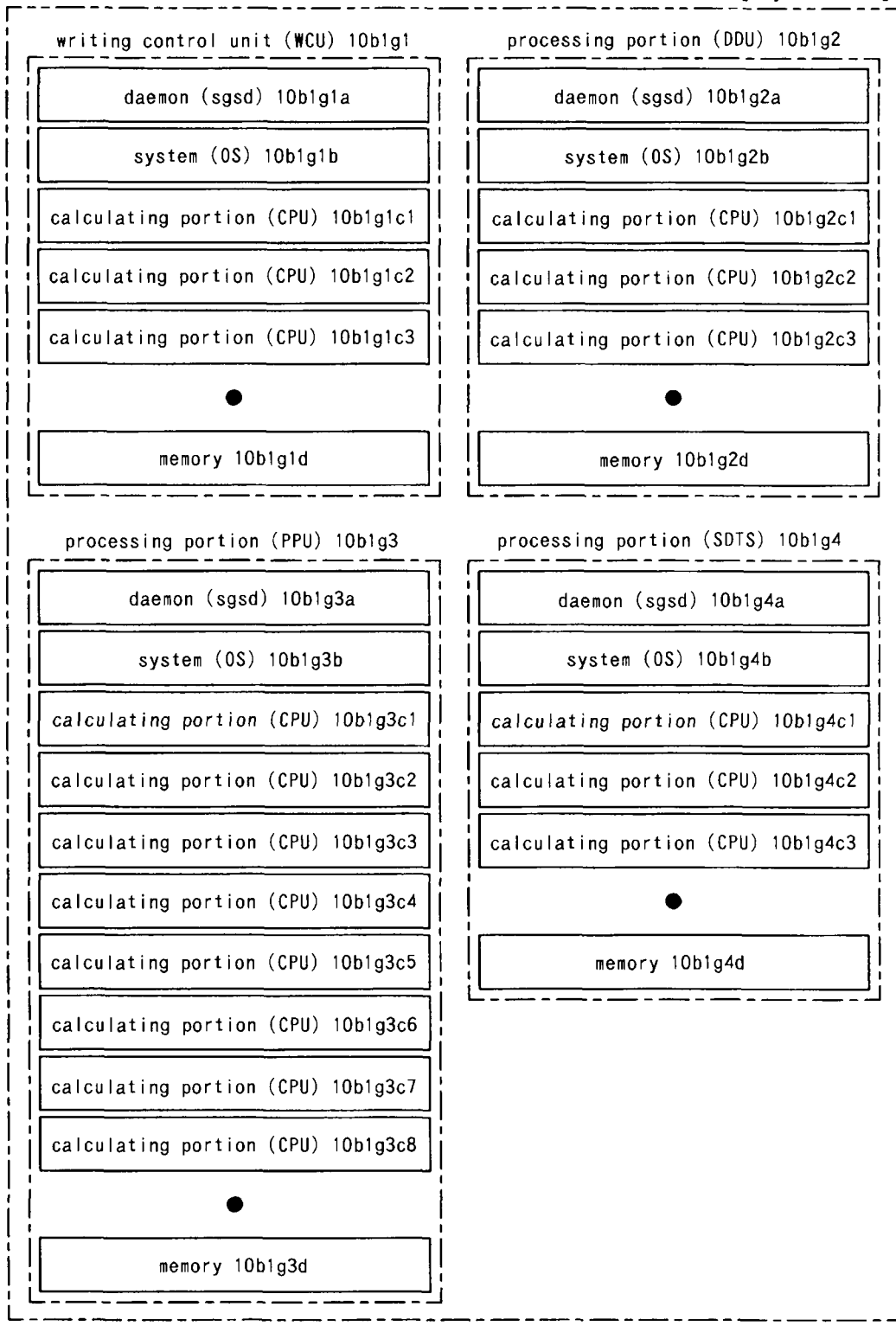
FIG. 8 shows an example of components of the shot forming system 10$b$1$g$.

FIG. 8 shows an example of components of the shot forming system $10b1g$ shown in FIGS. 2 and 6. In the charged particle beam drawing apparatus 10 of the first embodiment, as shown in FIG. 8, the shot forming system $10b1g$ has a writing control unit (WCU) $10b1g1$, a processing portion (DDU (Data Distribution Unit)) $10b1g2$, a processing portion (PPU (Parallel Processing Unit)) $10b1g3$, and a processing portion (SDTS (Shot Data Transfer Server)) $10b1g4$.

In detail, in the charged particle beam drawing apparatus 10 of the first embodiment, as shown in FIG. 8, management of a process performed by calculating portions (CPUs) $10b1g1c1$, $10b1g1c2$, $10b1g1c3$ etc. of the writing control unit (WCU) $10b1g1$, and management of a memory $10b1g1d$ used by the calculating portions (CPUs) $10b1g1c1$, $10b1g1c2$, $10b1g1c3$ etc. of the writing control unit (WCU) $10b1g1$, are performed by a daemon (sgsd) $10b1g1a$ of the writing control unit (WCU) $10b1g1$. Utilization rate of the calculating portions (CPUs) $10b1g1c1$, $10b1g1c2$, $10b1g1c3$ etc. of the writing control unit (WCU) $10b1g1$, and utilization rate of the memory $10b1g1d$ of the writing control unit (WCU) $10b1g1$, are managed by a system (OS) $10b1g1b$ of the writing control unit (WCU) $10b1g1$. The daemon $10b1g1a$ is managed by the system (OS) $10b1g1b$.

In the charged particle beam drawing apparatus 10 of the first embodiment, as shown in FIG. 8, management of a process performed by calculating portions (CPUs) $10b1g2c1$, $10b1g2c2$, $10b1g2c3$ etc. of the processing portion (DDU) $10b1g2$, and management of a memory $10b1g2d$ used by the calculating portions (CPUs) $10b1g2c1$, $10b1g2c2$, $10b1g2c3$ etc. of the processing portion (DDU) $10b1g2$, are performed by a daemon (sgsd) $10b1g2a$ of the processing portion (DDU) $10b1g2$. Utilization rate of the calculating portions (CPUs) $10b1g2c1$, $10b1g2c2$, $10b1g2c3$ etc. of the processing portion (DDU) $10b1g2$, and utilization rate of the memory $10b1g2d$ of the processing portion (DDU) $10b1g2$, are managed by a system (OS) $10b1g2b$ of the processing portion (DDU) $10b1g2$. The daemon $10b1g2a$ is managed by the system (OS) $10b1g2b$.

In the charged particle beam drawing apparatus 10 of the first embodiment, as shown in FIG. 8, management of a process performed by calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$, and management of a memory $10b1g3d$ used by the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$, are performed by a daemon (sgsd) $10b1g3a$ of the processing portion (PPU) $10b1g3$. Utilization rate of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$, and utilization rate of the memory $10b1g3d$ of the processing portion (PPU) $10b1g3$, are managed by a system (OS) $10b1g3b$ of the processing portion (PPU) $10b1g3$. The daemon $10b1g3a$ is managed by the system (OS) $10b1g3b$.

In the charged particle beam drawing apparatus 10 of the first embodiment, as shown in FIG. 8, management of a process performed by calculating portions (CPUs) $10b1g4c1$, $10b1g4c2$, $10b1g4c3$ etc. of the processing portion (SDTS) $10b1g4$, and management of a memory $10b1g4d$ used by the calculating portions (CPUs) $10b1g4c1$, $10b1g4c2$, $10b1g4c3$ etc. of the processing portion (SDTS) $10b1g4$, are performed by a daemon (sgsd) $10b1g4a$ of the processing portion (SDTS) $10b1g4$. Utilization rate of the calculating portions (CPUs) $10b1g4c1$, $10b1g4c2$, $10b1g4c3$ etc. of the processing portion (SDTS) $10b1g4$, and utilization rate of the memory $10b1g4d$ of the processing portion (SDTS) $10b1g4$, are managed by a system (OS) $10b1g4b$ of the processing portion (SDTS) $10b1g4$. The daemon $10b1g4a$ is managed by the system (OS) $10b1g4b$.

Concretely, in the charged particle beam drawing apparatus 10 of the first embodiment, the WSM process PR8 (see FIG. 6) receives a writing start indication, and then, a start request of a WSC (Write Sequence Creator) process (not shown) is transferred from the WSM process PR8 (see FIG. 6) to the daemon (sgsd) 10$b$1$g$1$a$ of the writing control unit (WCU) 10$b$1$g$1. Then, the WSC process (not shown) is started by using the calculating portion (CPU) 10$b$1$g$1$c$1 (see FIG. 8). Then, the drawing area DA (see FIG. 5) of the workpiece M (see FIG. 5) is virtually divided by the WSC process (not shown), so that the stripe frames STR1, STR2, STR3, STR4 to STR$n$ (see FIG. 5) are formed.

Then, in the charged particle beam drawing apparatus 10 of the first embodiment, the DPM process PR9 (see FIG. 6) is started by using the calculating portion (CPU) 10$b$1$g$1$c$2 (see FIG. 8) of the writing control unit (WCU) 10$b$1$g$1 (see FIG. 8), by means of the daemon (sgsd) 10$b$1$g$1$a$ (see FIG. 8) of the writing control unit (WCU) 10$b$1$g$1 (see FIG. 8), on the basis of a request from the WSM process PR8 (see FIG. 6) to the daemon (sgsd) 10$b$1$g$1$a$ (see FIG. 8) of the writing control unit (WCU) 10$b$1$g$1 (see FIG. 8). In detail, the stripe frames STR1, STR2, STR3, STR4 to STR$n$ (see FIGS. 5 and 7) are virtually divided by the DPM process PR9 (see FIG. 6), so that the block frames DBP01, DBP02, DBP03, DBPO4, DBP05, DBP06, DBP07, DBP08, DBP09, DBP10, DBP11, DBP12, DBP13, DBP14, DBP15, DBP16 etc. (see FIG. 7) are formed.

Then, in the charged particle beam drawing apparatus 10 of the first embodiment, the Distributor process PR1 (see FIG. 6) is started by using the calculating portion (CPU) 10$b$1$g$2$c$1 (see FIG. 8) of the processing portion (DDU) 10$b$1$g$2 (see FIG. 8), and the Distributor process PR4 (see FIG. 6) is started by using the calculating portion (CPU) 10$b$1$g$2$c$2 (see FIG. 8) of the processing portion (DDU) 10$b$1$g$2 (see FIG. 8), by means of the daemon (sgsd) 10$b$1$g$2$a$ (see FIG. 8) of the processing portion (DDU) 10$b$1$g$2 (see FIG. 8), on the basis of a request from the DPM process PR9 (see FIG. 6) to the daemon (sgsd) 10$b$1$g$2$a$ (see FIG. 8) of the processing portion (DDU) 10$b$1$g$2 (see FIG. 8).

Then, in the charged particle beam drawing apparatus 10 of the first embodiment, the Area process PR5 (see FIG. 6) corresponding to the block frames DPB01, DPB02, DPB03 (see FIG. 7) is started by using the calculating portions (CPUs) 10$b$1$g$3$c$1, 10$b$1$g$3$c$2, 10$b$1$g$3$c$3 (see FIG. 8) of the processing portion (PPU) 10$b$1$g$3 (see FIG. 8), by means of the daemon (sgsd) 10$b$1$g$3$a$ (see FIG. 8) of the processing portion (PPU) 10$b$1$g$3 (see FIG. 8), on the basis of a request from the DPM process PR9 (see FIG. 6) to the daemon (sgsd) 10$b$1$g$3$a$ (see FIG. 8) of the processing portion (PPU) 10$b$1$g$3 (see FIG. 8). In detail, the Area process PR5 (see FIG. 6) in the calculating portion (CPU) 10$b$1$g$3$c$1 (see FIG. 8) corresponding to the block frame DPB01 (see FIG. 7), the Area process PR5 (see FIG. 6) in the calculating portion (CPU) 10$b$1$g$3$c$2 (see FIG. 8) corresponding to the block frame DPB02 (see FIG. 7), and the Area process PR5 (see FIG. 6) in the calculating portion (CPU) 10$b$1$g$3$c$3 (see FIG. 8) corresponding to the block frame DPB03 (see FIG. 7), are performed in parallel.

Then, in the charged particle beam drawing apparatus 10 of the first embodiment, the Prox process PR6 (see FIG. 6) corresponding to the block frames DPB01, DPB02, DPB03 (see FIG. 7) is started by using the calculating portions (CPUs) 10$b$1$g$3$c$1, 10$b$1$g$3$c$2, 10$b$1$g$3$c$3 (see FIG. 8) of the processing portion (PPU) 10$b$1$g$3 (see FIG. 8), by means of the daemon (sgsd) 10$b$1$g$3$a$ (see FIG. 8) of the processing portion (PPU) 10$b$1$g$3 (see FIG. 8), on the basis of a request from the DPM process PR9 (see FIG. 6) to the daemon (sgsd) 10$b$1$g$3$a$ (see FIG. 8) of the processing portion (PPU) 10$b$1$g$3 (see FIG. 8). In detail, the Prox process PR6 (see FIG. 6) in the calculating portion (CPU) 10$b$1$g$3$c$1 (see FIG. 8) corresponding to the block frame DPB01 (see FIG. 7), the Prox process PR6 (see FIG. 6) in the calculating portion (CPU) 10$b$1$g$3$c$2 (see FIG. 8) corresponding to the block frame DPB02 (see FIG. 7), and the Prox process PR6 (see FIG. 6) in the calculating portion (CPU) 10$b$1$g$3$c$3 (see FIG. 8) corresponding to the block frame DPB03 (see FIG. 7), are performed in parallel.

Also, in the charged particle beam drawing apparatus 10 of the first embodiment, the Converter process PR2 (see FIG. 6) corresponding to the block frames DPB01, DPB02, DPB03 (see FIG. 7) is started by using the calculating portions (CPUs) 10$b$1$g$3$c$4, 10$b$1$g$3$c$5, 10$b$1$g$3$c$6 (see FIG. 8) of the processing portion (PPU) 10$b$1$g$3 (see FIG. 8), by means of the daemon (sgsd) 10$b$1$g$3$a$ (see FIG. 8) of the processing portion (PPU) 10$b$1$g$3 (see FIG. 8), on the basis of a request from the DPM process PR9 (see FIG. 6) to the daemon (sgsd) 10$b$1$g$3$a$ (see FIG. 8) of the processing portion (PPU) 10$b$1$g$3 (see FIG. 8). In detail, the Converter process PR2 (see FIG. 6) in the calculating portion (CPU) 10$b$1$g$3$c$4 (see FIG. 8) corresponding to the block frame DPB01 (see FIG. 7), the Converter process PR2 (see FIG. 6) in the calculating portion (CPU) 10$b$1$g$3$c$5 (see FIG. 8) corresponding to the block frame DPB02 (see FIG. 7), and the Converter process PR2 (see FIG. 6) in the calculating portion (CPU) 10$b$1$g$3$c$6 (see FIG. 8) corresponding to the block frame DPB03 (see FIG. 7), are performed in parallel.

Then, in the charged particle beam drawing apparatus 10 of the first embodiment, the Shot process PR3 (see FIG. 6) corresponding to the block frames DPB01, DPB02, DPB03 (see FIG. 7) is started by using the calculating portions (CPUs) 10$b$1$g$3$c$4, 10$b$1$g$3$c$5, 10$b$1$g$3$c$6 (see FIG. 8) of the processing portion (PPU) 10$b$1$g$3 (see FIG. 8), by means of the daemon (sgsd) 10$b$1$g$3$a$ (see FIG. 8) of the processing portion (PPU) 10$b$1$g$3 (see FIG. 8), on the basis of a request from the DPM process PR9 (see FIG. 6) to the daemon (sgsd) 10$b$1$g$3$a$ (see FIG. 8) of the processing portion (PPU) 10$b$1$g$3 (see FIG. 8). In detail, the Shot process PR3 (see FIG. 6) in the calculating portion (CPU) 10$b$1$g$3$c$4 (see FIG. 8) corresponding to the block frame DPB01 (see FIG. 7), the Shot process PR3 (see FIG. 6) in the calculating portion (CPU) 10$b$1$g$3$c$5 (see FIG. 8) corresponding to the block frame DPB02 (see FIG. 7), and the Shot process PR3 (see FIG. 6) in the calculating portion (CPU) 10$b$1$g$3$c$6 (see FIG. 8) corresponding to the block frame DPB03 (see FIG. 7), are performed in parallel.

Then, in the charged particle beam drawing apparatus 10 of the first embodiment, the Output process PR7 (see FIG. 6) is started by using the calculating portions (CPUs) 10$b$1$g$4$c$1, 10$b$1$g$4$c$2 (see FIG. 8) of the processing portion (SDTS) 10$b$1$g$4 (see FIG. 8), by means of the daemon (sgsd) 10$b$1$g$4$a$ (see FIG. 8) of the processing portion (SDTS) 10$b$1$g$4 (see FIG. 8), on the basis of a request from the DPM process PR9 (see FIG. 6) to the daemon (sgsd) 10$b$1$g$4$a$ (see FIG. 8) of the processing portion (SDTS) 10$b$1$g$4 (see FIG. 8).

Figure 9:
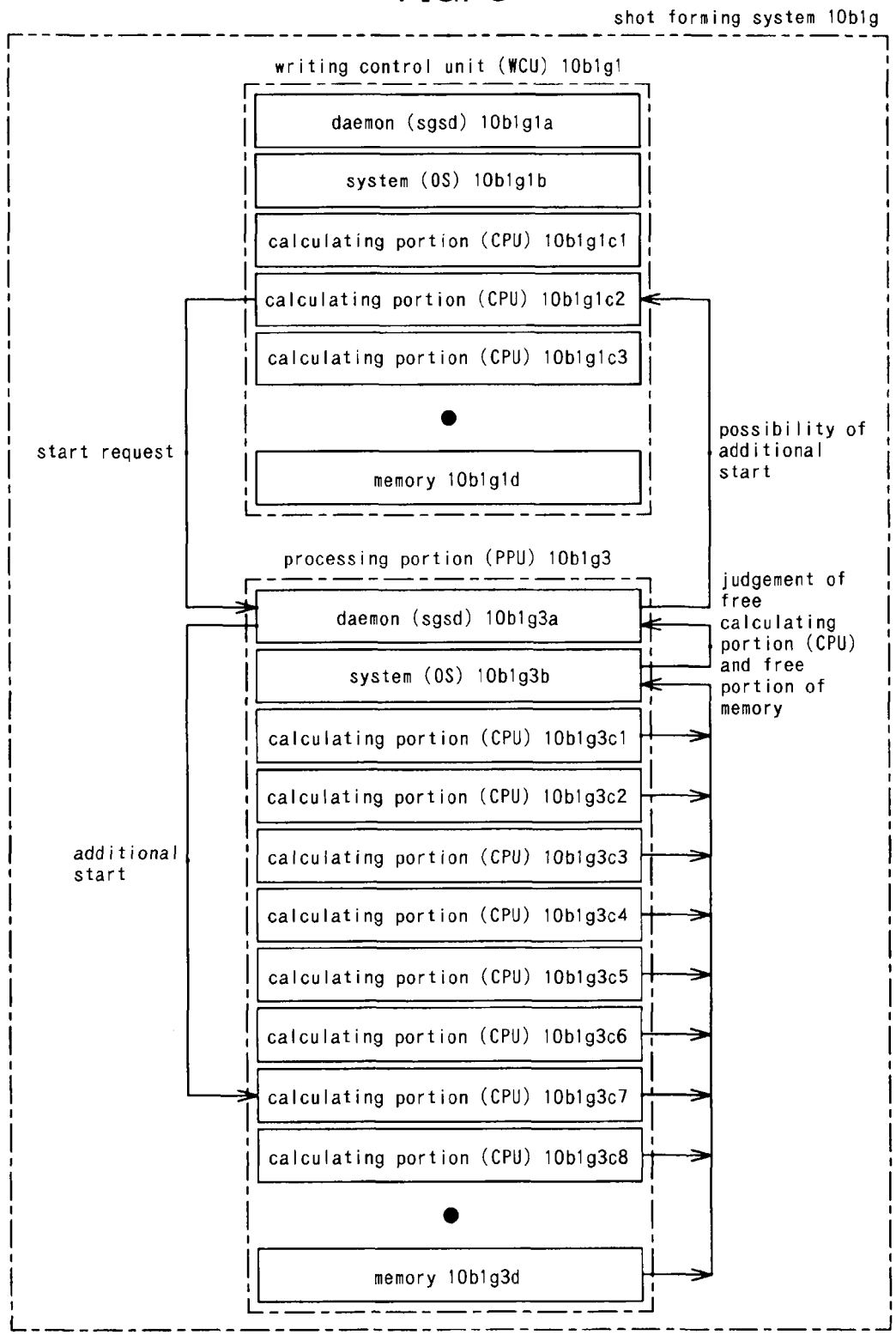
FIG. 9 shows an example in which a next process is additionally started by using a calculating portion (CPU) 10$b$1$g$3$c$7 of a processing portion (PPU) 10$b$1$g$3.

FIG. 9 shows an example in which a next process is additionally started by using the calculating portion (CPU) 10$b$1$g$3$c$7 of the processing portion (PPU) 10$b$1$g$3.

In the charged particle beam drawing apparatus 10 of the first embodiment, a processing load while the Area process PR5 (see FIG. 6), the Prox process PR6 (see FIG. 6), the Converter process PR2 (see FIG. 6) or the Shot process PR3 (see FIG. 6) corresponding to the block frame DPB01 (see FIG. 7) is performed, a processing load while the Area process PR5 (see FIG. 6), the Prox process PR6 (see FIG. 6), the Converter process PR2 (see FIG. 6) or the Shot process PR3 (see FIG. 6) corresponding to the block frame DPB02 (see FIG. 7) is performed, and a processing load while the Area process PR5 (see FIG. 6), the Prox process PR6 (see FIG. 6), the Converter process PR2 (see FIG. 6) or the Shot process PR3 (see FIG. 6) corresponding to the block frame DPB03 (see FIG. 7) is performed, are estimated, and then, a predetermined number of the calculating portions (CPUs) $10b1g3c1$, $10b1g3c2$, $10b1g3c3$ (see FIG. 8) etc. are simultaneously used, so that a memory utilization rate of the memory $10b1g3d$ (see FIG. 8) of the processing portion (PPU) $10b1g3$ (see FIG. 8) while the Area process PR5 (see FIG. 6), the Prox process PR6 (see FIG. 6), the Converter process PR2 (see FIG. 6) and/or the Shot process PR3 (see FIG. 6) are performed, does not exceed a predetermined value.

However, in one case, an actual processing load while the Area process PR5 (see FIG. 6) corresponding to the block frames DPB01, DPB02, DPB03 (see FIG. 7) is performed, may be considerably smaller than an estimated processing load, because of diversification of the drawing data D (see FIG. 6).

Consequently, in the charged particle beam drawing apparatus 10 of the first embodiment, as shown in FIG. 9, if the daemon (sgsd) $10b1g3a$ of the processing portion (PPU) $10b1g3$ judges that at least one of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. is free and that the memory $10b1g3d$ includes a free portion, on the basis of the utilization rate of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the utilization rate of the memory $10b1g3d$, managed by the system (OS) $10b1g3b$, a report that a next Area process PR5 (see FIG. 6), a next Prox process PR6 (see FIG. 6), a next Converter process PR2 (see FIG. 6) and/or a next Shot process PR3 (see FIG. 6) can be additionally started by using the free calculating portion (CPU) $10b1g3c7$ and the free portion of the memory $10b1g3d$, is transferred from the daemon (sgsd) $10b1g3a$ of the processing portion (PPU) $10b1g3$ to the DPM process PR9 performed by the calculating portion (CPU) $10b1g1c2$ of the writing control unit (WCU) $10b1g1$.

Then, in the charged particle beam drawing apparatus 10 of the first embodiment, as shown in FIG. 9, the next Area process PR5 (see FIG. 6), the next Prox process PR6 (see FIG. 6), the next Converter process PR2 (see FIG. 6) and/or the next Shot process PR3 (see FIG. 6) is additionally started by using the calculating portion (CPU) $10b1g3c7$ of the processing portion (PPU) $10b1g3$, by means of the daemon (sgsd) $10b1g3a$, on the basis of a start request from the DPM process PR9 (see FIG. 6) performed by the calculating portion (CPU) $10b1g1c2$ of the writing control unit (WCU) $10b1g1$.

In the charged particle beam drawing apparatus 10 of the first embodiment, as shown in FIG. 9, if the next Area process PR5 (see FIG. 6) corresponding to the block frame DPB04 (see FIG. 7) is additionally started, the Area process PR5 (see FIG. 6) corresponding to the block frames DPB01, DPB02, DPB03 (see FIG. 7) is performed by the calculating portions (CPUs) $10b1g3c1$, $10b1g3c2$, $10b1g3c3$, and in parallel, the next Area process PR5 (see FIG. 6) corresponding to the block frame DPB04 (see FIG. 7) is performed by the calculating portion (CPU) $10b1q3c7$.

In another case, an actual processing load while the Prox process PR6 (see FIG. 6) corresponding to the block frames DPB01, DPB02, DPB03 (see FIG. 7) is performed, may be considerably smaller than an estimated processing load, because of diversification of the drawing data D (see FIG. 6).

Consequently, in the charged particle beam drawing apparatus 10 of the first embodiment, as shown in FIG. 9, if the daemon (sgsd) $10b1g3a$ of the processing portion (PPU) $10b1g3$ judges that at least one of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. is free and that the memory $10b1g3d$ includes a free portion, on the basis of the utilization rate of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the utilization rate of the memory $10b1g3d$, managed by the system (OS) $10b1g3b$, a report that a next Area process PR5 (see FIG. 6), a next Prox process PR6 (see FIG. 6), a next Converter process PR2 (see FIG. 6) and/or a next Shot process PR3 (see FIG. 6) can be additionally started by using the free calculating portion (CPU) $10b1g3c7$ and the free portion of the memory $10b1g3d$, is transferred from the daemon (sgsd) $10b1g3a$ of the processing portion (PPU) $10b1g3$ to the DPM process PR9 performed by the calculating portion (CPU) $10b1g1c2$ of the writing control unit (WCU) $10b1g1$.

Then, in the charged particle beam drawing apparatus 10 of the first embodiment, as shown in FIG. 9, the next Area process PR5 (see FIG. 6), the next Prox process PR6 (see FIG. 6), the next Converter process PR2 (see FIG. 6) and/or the next Shot process PR3 (see FIG. 6) is additionally started by using the calculating portion (CPU) $10b1g3c7$ of the processing portion (PPU) $10b1g3$, by means of the daemon (sgsd) $10b1g3a$, on the basis of a start request from the DPM process PR9 (see FIG. 6) performed by the calculating portion (CPU) $10b1g1c2$ of the writing control unit (WCU) $10b1g1$.

In the charged particle beam drawing apparatus 10 of the first embodiment, as shown in FIG. 9, if the next Prox process PR6 (see FIG. 6) corresponding to the block frame DPB04 (see FIG. 7) is additionally started, the Prox process PR6 (see FIG. 6) corresponding to the block frames DPB01, DPB02, DPB03 (see FIG. 7) is performed by the calculating portions (CPUs) $10b1g3c1$, $10b1g3c2$, $10b1g3c3$, and in parallel, the next Prox process PR6 (see FIG. 6) corresponding to the block frame DPB04 (see FIG. 7) is performed by the calculating portion (CPU) $10b1g3c7$.

In another case, an actual processing load while the Converter process PR2 (see FIG. 6) corresponding to the block frames DPB01, DPB02, DPB03 (see FIG. 7) is performed, may be considerably smaller than an estimated processing load, because of diversification of the drawing data D (see FIG. 6).

Figure 10:
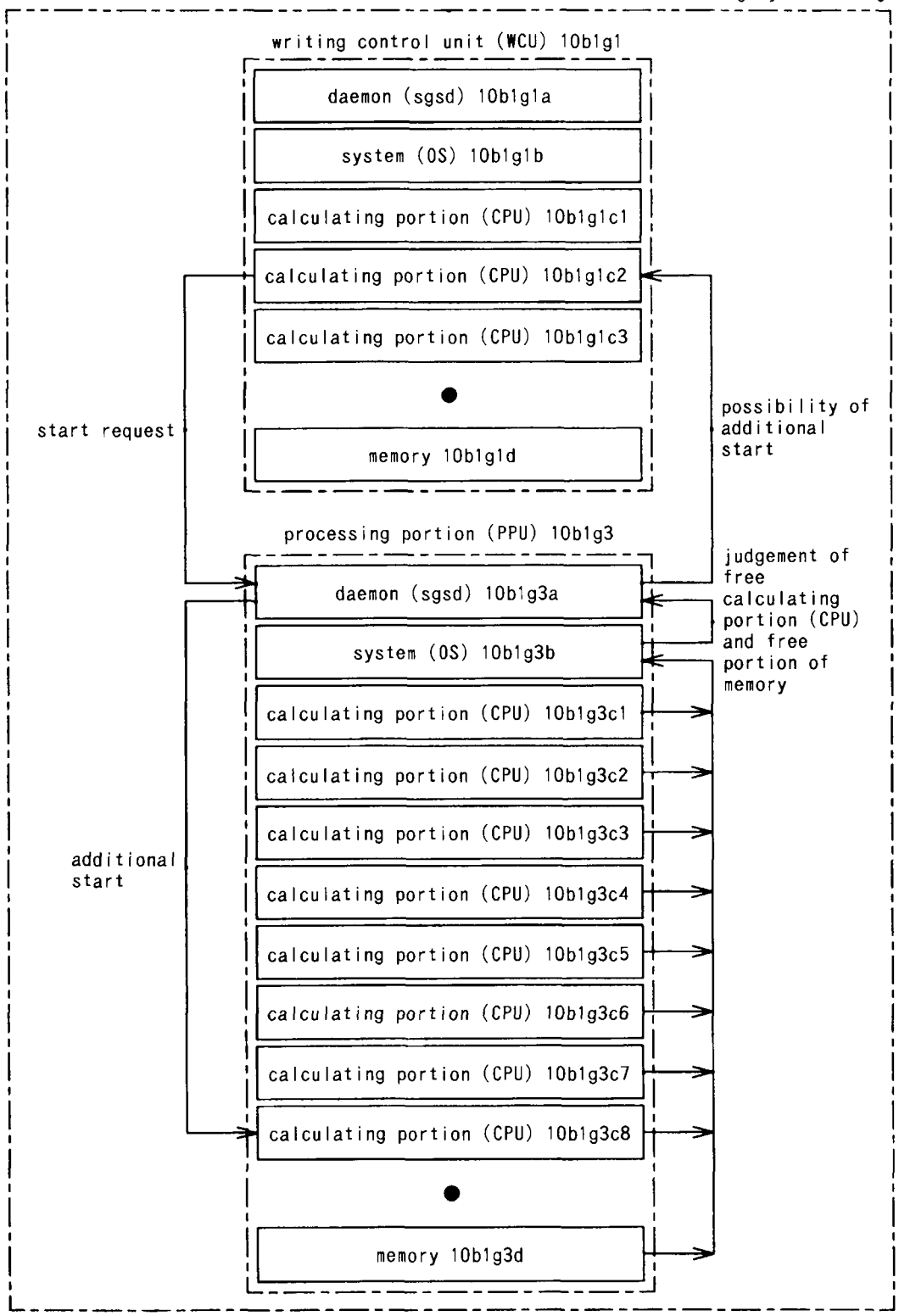
FIG. 10 shows an example in which a next process is additionally started by using a calculating portion (CPU) 10$b$1$g$3$c$8 of the processing portion (PPU) 10$b$1$g$3.

Consequently, in the charged particle beam drawing apparatus 10 of the first embodiment, as shown in FIG. 10, if the daemon (sgsd) $10b1g3a$ of the processing portion (PPU) $10b1g3$ judges that at least one of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. is free and that the memory $10b1g3d$ includes a free portion, on the basis of the utilization rate of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the utilization rate of the memory $10b1g3d$, managed by the system (OS) $10b1g3b$, a report that a next Area process PR5 (see FIG. 6), a next Prox process PR6 (see FIG. 6), a next Converter process PR2 (see FIG. 6) and/or a next Shot process PR3 (see FIG. 6) can be additionally started by using the free calculating portion (CPU) $10b1g3c8$ and the free portion of the memory $10b1g3d$, is transferred from the daemon (sgsd) $10b1g3a$ of the processing portion (PPU) $10b1g3$ to the DPM process PR9 performed by the calculating portion (CPU) $10b1g1c2$ of the writing control unit (WCU) $10b1g1$.

Then, in the charged particle beam drawing apparatus 10 of the first embodiment, as shown in FIG. 10, the next Area process PR5 (see FIG. 6), the next Prox process PR6 (see FIG. 6), the next Converter process PR2 (see FIG. 6) and/or the next Shot process PR3 (see FIG. 6) is additionally started by using the calculating portion (CPU) $10b1g3c8$ of the processing portion (PPU) $10b1g3$, by means of the daemon (sgsd) $10b1g3a$, on the basis of a start request from the DPM process PR9 (see FIG. 6) performed by the calculating portion (CPU) $10b1g1c2$ of the writing control unit (WCU) $10b1g1$.

In the charged particle beam drawing apparatus 10 of the first embodiment, as shown in FIG. 10, if the next Converter process PR2 (see FIG. 6) corresponding to the block frame DPB04 (see FIG. 7) is additionally started, the Converter process PR2 (see FIG. 6) corresponding to the block frames DPB01, DPB02, DPB03 (see FIG. 7) is performed by the calculating portions (CPUs) $10b1g3c4$, $10b1g3c5$, $10b1g3c6$, and in parallel, the next Converter process PR2 (see FIG. 6) corresponding to the block frame DPB04 (see FIG. 7) is performed by the calculating portion (CPU) $10b1g3c8$.

In another case, an actual processing load while the Shot process PR3 (see FIG. 6) corresponding to the block frames DPB01, DPB02, DPB03 (see FIG. 7) is performed, may be considerably smaller than an estimated processing load, because of diversification of the drawing data D (see FIG. 6).

Consequently, in the charged particle beam drawing apparatus 10 of the first embodiment, as shown in FIG. 10, if the daemon (sgsd) $10b1g3a$ of the processing portion (PPU) $10b1g3$ judges that at least one of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. is free and that the memory $10b1g3d$ includes a free portion, on the basis of the utilization rate of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the utilization rate of the memory $10b1g3d$, managed by the system (OS) $10b1g3b$, a report that a next Area process PR5 (see FIG. 6), a next Prox process PR6 (see FIG. 6), a next Converter process PR2 (see FIG. 6) and/or a next Shot process PR3 (see FIG. 6) can be additionally started by using the free calculating portion (CPU) $10b1g3c8$ and the free portion of the memory $10b1g3d$, is transferred from the daemon (sgsd) $10b1g3a$ of the processing portion (PPU) $10b1g3$ to the DPM process PR9 performed by the calculating portion (CPU) $10b1g1c2$ of the writing control unit (WCU) $10b1g1$.

Then, in the charged particle beam drawing apparatus 10 of the first embodiment, as shown in FIG. 10, the next Area process PR5 (see FIG. 6), the next Prox process PR6 (see FIG. 6), the next Converter process PR2 (see FIG. 6) and/or the next Shot process PR3 (see FIG. 6) is additionally started by using the calculating portion (CPU) $10b1g3c8$ of the processing portion (PPU) $10b1g3$, by means of the daemon (sgsd) $10b1g3a$, on the basis of a start request from the DPM process PR9 (see FIG. 6) performed by the calculating portion (CPU) $10b1g1c2$ of the writing control unit (WCU) $10b1g1$.

In the charged particle beam drawing apparatus 10 of the first embodiment, as shown in FIG. 10, if the next Shot process PR3 (see FIG. 6) corresponding to the block frame DPB04 (see FIG. 7) is additionally started, the Shot process PR3 (see FIG. 6) corresponding to the block frames DPB01, DPB02, DPB03 (see FIG. 7) is performed by the calculating portions (CPUs) $10b1g3c4$, $10b1g3c5$, $10b1g3c6$, and in parallel, the next Shot process PR3 (see FIG. 6) corresponding to the block frame DPB04 (see FIG. 7) is performed by the calculating portion (CPU) $10b1g3c8$.

In the charged particle beam drawing apparatus 10 of the first embodiment, a processing load while the Distributor processes PR1, PR4 (see FIG. 6) are performed, is estimated, and then, a predetermined number of the calculating portions (CPUs) $10b1g2c1$, $10b1g2c2$ (see FIG. 8) etc. are simultaneously used, so that a memory utilization rate of the memory $10b1g2d$ (see FIG. 8) of the processing portion (DDU) $10b1g2$ (see FIG. 8) while the Distributor processes PR1, PR4 (see FIG. 6) are performed, does not exceed a predetermined value.

However, in one case, an actual processing load while the Converter processes PR1, PR4 (see FIG. 6) are performed, may be considerably smaller than an estimated processing load, because of diversification of the drawing data D (see FIG. 6).

Consequently, in the charged particle beam drawing apparatus 10 of the first embodiment, as shown in FIG. 8, if the daemon (sgsd) $10b1g2a$ of the processing portion (DDU) $10b1g2$ judges that at least one of the calculating portions (CPUs) $10b1g2c1$, $10b1g2c2$, $10b1g2c3$ etc. is free and that the memory $10b1g2d$ includes a free portion, on the basis of the utilization rate of the calculating portions (CPUs) $10b1g2c1$, $10b1g2c2$, $10b1g2c3$ etc. and the utilization rate of the memory $10b1g2d$, managed by the system (OS) $10b1g2b$, a report that a next Area process PR5 (see FIG. 6), a next Prox process PR6 (see FIG. 6), a next Converter process PR2 (see FIG. 6) and/or a next Shot process PR3 (see FIG. 6) can be additionally started by using the free calculating portion (CPU) $10b1g2c3$ and the free portion of the memory $10b1g2d$, is transferred from the daemon (sgsd) $10b1g2a$ of the processing portion (DDU) $10b1g2$ to the DPM process PR9 performed by the calculating portion (CPU) $10b1g1c2$ of the writing control unit (WCU) $10b1g1$.

Then, in the charged particle beam drawing apparatus 10 of the first embodiment, as shown in FIG. 8, the next Area process PR5 (see FIG. 6), the next Prox process PR6 (see FIG. 6), the next Converter process PR2 (see FIG. 6) and/or the next Shot process PR3 (see FIG. 6) is additionally started by using the calculating portion (CPU) $10b1g2c3$ of the processing portion (DDU) $10b1g2$, by means of the daemon (sgsd) $10b1g2a$, on the basis of a start request from the DPM process PR9 (see FIG. 6) performed by the calculating portion (CPU) $10b1g1c2$ of the writing control unit (WCU) $10b1g1$.

In the charged particle beam drawing apparatus 10 of the first embodiment, a processing load while the Output process PR7 (see FIG. 6) is performed, is estimated, and then, a predetermined number of the calculating portions (CPUs) $10b1g4c1$, $10b1g4c2$ (see FIG. 8) etc. are simultaneously used, so that a memory utilization rate of the memory $10b1g4d$ (see FIG. 8) of the processing portion (SDTS) $10b1g4$ (see FIG. 8) while the Output process PR7 (see FIG. 6) is performed, does not exceed a predetermined value.

However, in one case, an actual processing load while the Output process PR7 (see FIG. 6) are performed, may be considerably smaller than an estimated processing load, because of diversification of the drawing data D (see FIG. 6).

Consequently, in the charged particle beam drawing apparatus 10 of the first embodiment, as shown in FIG. 8, if the daemon (sgsd) $10b1g4a$ of the processing portion (STDS) $10b1g4$ judges that at least one of the calculating portions (CPUs) $10b1g4c1$, $10b1g4c2$, $10b1g4c3$ etc. is free and that the memory $10b1g4d$ includes a free portion, on the basis of the utilization rate of the calculating portions (CPUs) $10b1g4c1$, $10b1g4c2$, $10b1g4c3$ etc. and the utilization rate of the memory $10b1g4d$, managed by the system (OS) $10b1g4b$, a report that a next Area process PR5 (see FIG. 6), a next Prox process PR6 (see FIG. 6), a next Converter process PR2 (see FIG. 6) and/or a next Shot process PR3 (see FIG. 6) can be additionally started by using the free calculating portion (CPU) 10*b*1*g*4*c*3 and the free portion of the memory 10*b*1*g*4*d*, is transferred from the daemon (sgsd) 10*b*1*g*4*a* of the processing portion (SDTS) 10*b*1*g*4 to the DPM process PR9 performed by the calculating portion (CPU) 10*b*1*g*1*c*2 of the writing control unit (WCU) 10*b*1*g*1.

Then, in the charged particle beam drawing apparatus 10 of the first embodiment, as shown in FIG. 8, the next Area process PR5 (see FIG. 6), the next Prox process PR6 (see FIG. 6), the next Converter process PR2 (see FIG. 6) and/or the next Shot process PR3 (see FIG. 6) is additionally started by using the calculating portion (CPU) 10*b*1*g*4*c*3 of the processing portion (SDTS) 10*b*1*g*4, by means of the daemon (sgsd) 10*b*1*g*4*a*, on the basis of a start request from the DPM process PR9 (see FIG. 6) performed by the calculating portion (CPU) 10*b*1*g*1*c*2 of the writing control unit (WCU) 10*b*1*g*1.

Accordingly, the charged particle beam drawing apparatus 10 of the first embodiment can increase throughput more than a charged particle beam drawing apparatus in which a next Converter process PR2, a next Shot process PR3, a next Distributor process PR4, a next Area process PR5 or a next Prox process PR6 is not additionally started, although the processing portions 10*b*1*g*2, 10*b*1*g*3, 10*b*1*g*4 has at least one free calculating portion (CPU) and the memories 10*b*1*g*2*d*, 10*b*1*g*3*d*, 10*b*1*g*4*d* of the processing portions 10*b*1*g*2, 10*b*1*g*3, 10*b*1*g*4 has a free portion.

Figure 11:
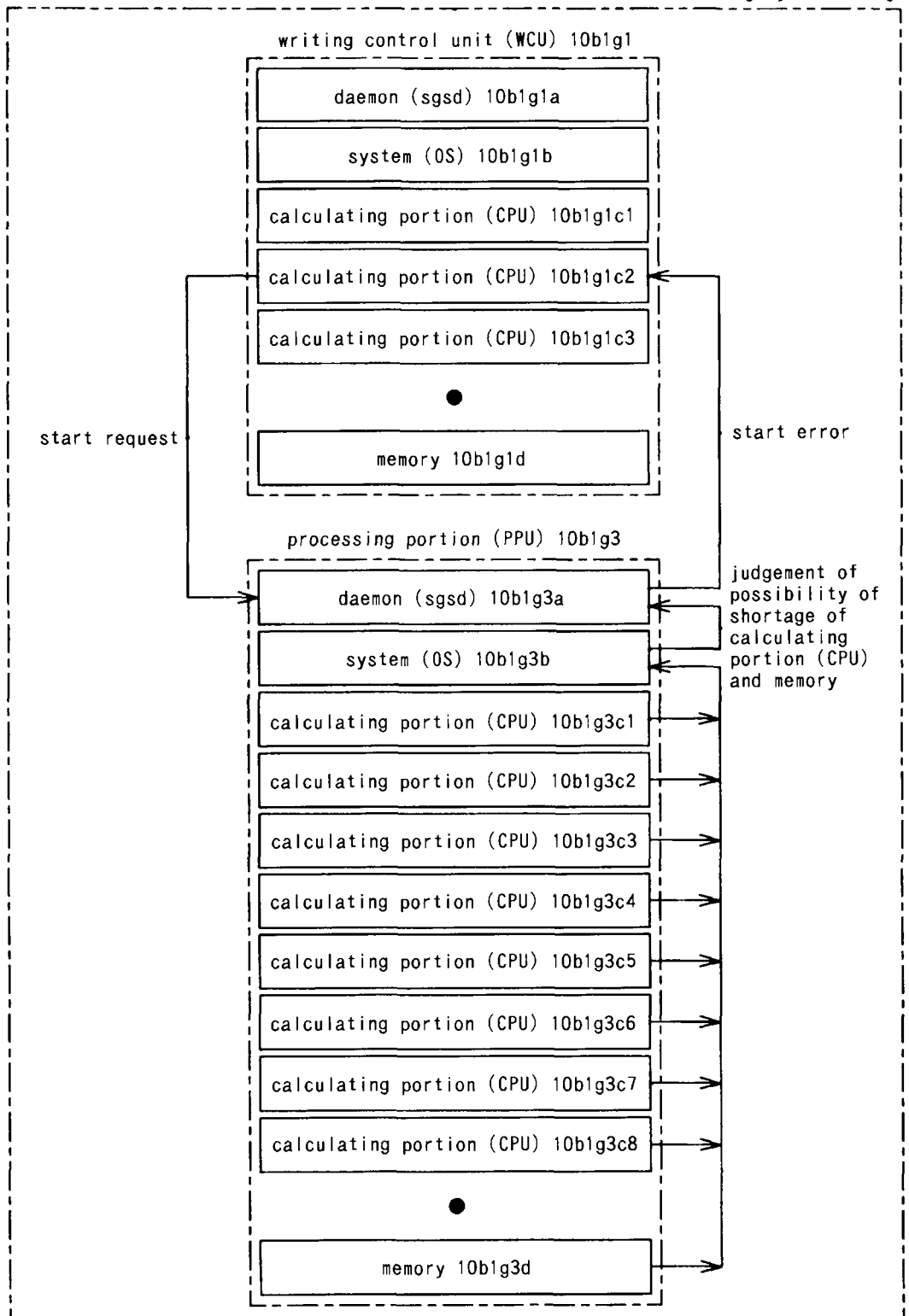
FIG. 11 shows an example in which a start request to a daemon (sgsd) 10$b$1$g$3$a$ of the processing portion (PPU) 10$b$1$g$3 is refused.

FIG. 11 shows an example in which a start request to a daemon (sgsd) 10*b*1*g*3*a* of the processing portion (PPU) 10*b*1*g*3 is refused.

As mentioned above, in the charged particle beam drawing apparatus 10 of the first embodiment, a processing load while the Area process PR5 (see FIG. 6), the Prox process PR6 (see FIG. 6), the Converter process PR2 (see FIG. 6) or the Shot process PR3 (see FIG. 6) corresponding to the block frame DPB01 (see FIG. 7) is performed, a processing load while the Area process PR5 (see FIG. 6), the Prox process PR6 (see FIG. 6), the Converter process PR2 (see FIG. 6) or the Shot process PR3 (see FIG. 6) corresponding to the block frame DPB02 (see FIG. 7) is performed, and a processing load while the Area process PR5 (see FIG. 6), the Prox process PR6 (see FIG. 6), the Converter process PR2 (see FIG. 6) or the Shot process PR3 (see FIG. 6) corresponding to the block frame DPB03 (see FIG. 7) is performed, are estimated, and then, a predetermined number of the calculating portions (CPUs) 10*b*1*g*3*c*1, 10*b*1*g*3*c*2, 10*b*1*g*3*c*3 (see FIG. 8) etc. are simultaneously used, so that a memory utilization rate of the memory 10*b*1*g*3*d* (see FIG. 8) of the processing portion (PPU) 10*b*1*g*3 (see FIG. 8) while the Area process PR5 (see FIG. 6), the Prox process PR6 (see FIG. 6), the Converter process PR2 (see FIG. 6) and/or the Shot process PR3 (see FIG. 6) are performed, does not exceed a predetermined value.

However, in one case, an actual processing load while the Area process PR5 (see FIG. 6) or the Prox process PR6 (see FIG. 6) corresponding to the block frames DPB01, DPB02, DPB03 (see FIG. 7) is performed, may be considerably larger than an estimated processing load, because of diversification of the drawing data D (see FIG. 6) and miniaturization of figures FG1, FG2, FG3 (see FIG. 4) etc. included in the drawing data D (see FIG. 6).

Consequently, in the charged particle beam drawing apparatus 10 of the first embodiment, as shown in FIG. 11, although a start request for starting the Converter process PR2 (see FIG. 6) corresponding to the block frames DPB01, DPB02, DPB03 (see FIG. 7) by using the calculating portions (CPUs) 10*b*1*g*3*c*4, 10*b*1*g*3*c*5, 10*b*1*g*3*c*6 of the processing portion (PPU) 10*b*1*g*3, is transferred from the DPM process PR9 (see FIG. 6) performed by the calculating portion (CPU) 10*b*1*g*1*c*2 of the writing control unit (WCU) 10*b*1*g*1 to the daemon (sgsd) 10*b*1*g*3*a*, if the daemon (sgsd) 10*b*1*g*3*a* of the processing portion (PPU) 10*b*1*g*3 judges that there is a possibility of a shortage of the calculating portions (CPUs) 10*b*1*g*3*c*1, 10*b*1*g*3*c*2, 10*b*1*g*3*c*3, 10*b*1*g*3*c*4, 10*b*1*g*3*c*5, 10*b*1*g*3*c*6, 10*b*1*g*3*c*7, 10*b*1*g*3*c*8 etc. and the memory 10*b*1*g*3*d*, on the basis of the utilization rate of the calculating portions (CPUs) 10*b*1*g*3*c*1, 10*b*1*g*3*c*2, 10*b*1*g*3*c*3, 10*b*1*g*3*c*4, 10*b*1*g*3*c*5, 10*b*1*g*3*c*6, 10*b*1*g*3*c*7, 10*b*1*g*3*c*8 etc. and the utilization rate of the memory 10*b*1*g*3*d*, managed by the system (OS) 10*b*1*g*3*b*, the start request for starting the Converter process PR2 (see FIG. 6) corresponding to the block frames DPB01, DPB02, DPB03 (see FIG. 7) by using the calculating portions (CPUs) 10*b*1*g*3*c*4, 10*b*1*g*3*c*5, 10*b*1*g*3*c*6, is refused by the daemon (sgsd) 10*b*1*g*3*a*, and then, a report that the start request from the DPM process PR9 (see FIG. 6) is refused, is transferred from the daemon (sgsd) 10*b*1*g*3*a* of the processing portion (PPU) 10*b*1*g*3 to the DPM process PR9 (see FIG. 6) performed by the calculating portion (CPU) 10*b*1*g*1*c*2 of the writing control unit (WCU) 10*b*1*g*1. Namely, the report shows that a start error has happened.

In detail, in the charged particle beam drawing apparatus 10 of the first embodiment, as shown in FIG. 11, the Area process PR5 (see FIG. 6) or the Prox process PR6 (see FIG. 6) corresponding to the block frames DPB01, DPB02, DPB03 (see FIG. 7) is performed, and then, the possibility of the shortage of the calculating portions (CPUs) 10*b*1*g*3*c*1, 10*b*1*g*3*c*2, 10*b*1*g*3*c*3, 10*b*1*g*3*c*4, 10*b*1*g*3*c*5, 10*b*1*g*3*c*6, 10*b*1*g*3*c*7, 10*b*1*g*3*c*8 etc. and the memory 10*b*1*g*3*d* of the processing portion (PPU) 10*b*1*g*3, does not exist. And then, the Converter process PR2 (see FIG. 6) corresponding to the block frames DPB01, DPB02, DPB03 (see FIG. 7) is started by using the calculating portions (CPUs) 10*b*1*g*3*c*4, 10*b*1*g*3*c*5, 10*b*1*g*3*c*6 of the processing portion (PPU) 10*b*1*g*3.

In another case, an actual processing load while the Converter process PR2 (see FIG. 6) corresponding to the block frames DPB01, DPB02, DPB03 (see FIG. 7) is performed, may be considerably larger than an estimated processing load, because of diversification of the drawing data D (see FIG. 6) and miniaturization of figures FG1, FG2, FG3 (see FIG. 4) etc. included in the drawing data D (see FIG. 6).

Consequently, in the charged particle beam drawing apparatus 10 of the first embodiment, as shown in FIG. 11, although a start request for starting the Area process PR5 (see FIG. 6) or the Prox process PR6 (see FIG. 6) corresponding to the block frames DPB01, DPB02, DPB03 (see FIG. 7) by using the calculating portions (CPUs) 10*b*1*g*3*c*1, 10*b*1*g*3*c*2, 10*b*1*g*3*c*3 of the processing portion (PPU) 10*b*1*g*3, is transferred from the DPM process PR9 (see FIG. 6) performed by the calculating portion (CPU) 10*b*1*g*1*c*2 of the writing control unit (WCU) 10*b*1*g*1 to the daemon (sgsd) 10*b*1*g*3*a*, if the daemon (sgsd) 10*b*1*g*3*a* of the processing portion (PPU) 10*b*1*g*3 judges that there is a possibility of a shortage of the calculating portions (CPUs) 10*b*1*g*3*c*1, 10*b*1*g*3*c*2, 10*b*1*g*3*c*3, 10*b*1*g*3*c*4, 10*b*1*g*3*c*5, 10*b*1*g*3*c*6, 10*b*1*g*3*c*7, 10*b*1*g*3*c*8 etc. and the memory 10*b*1*g*3*d*, on the basis of the utilization rate of the calculating portions (CPUs) 10*b*1*g*3*c*1, 10*b*1*g*3*c*2, 10*b*1*g*3*c*3, 10*b*1*g*3*c*4, 10*b*1*g*3*c*5, 10*b*1*g*3*c*6, 10*b*1*g*3*c*7, 10*b*1*g*3*c*8 etc. and the utilization rate of the memory 10*b*1*g*3*d*, managed by the system (OS) 10*b*1*g*3*b*, the start request for starting the Area process PR5 (see FIG. 6) or the Prox process PR6 (see FIG. 6) corresponding to the block frames DPB01, DPB02, DPB03 (see FIG. 7) by using the calculating portions (CPUs) 10*b*1*g*3*c*1, 10*b*1*g*3*c*2, 10*b*1*g*3*c*3, is refused by the daemon (sgsd) 10*b*1*g*3*a*, and then, a report that the start request from the DPM process PR9 (see FIG. 6)

is refused, is transferred from the daemon (sgsd) $10b1g3a$ of the processing portion (PPU) $10b1g3$ to the DPM process PR9 (see FIG. 6) performed by the calculating portion (CPU) $10b1g1c2$ of the writing control unit (WCU) $10b1g1$. Namely, the report shows that a start error has happened.

In detail, in the charged particle beam drawing apparatus 10 of the first embodiment, as shown in FIG. 11, the Converter process PR2 (see FIG. 6) corresponding to the block frames DPB01, DPB02, DPB03 (see FIG. 7) is performed, and then, the possibility of the shortage of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the memory $10b1g3d$ of the processing portion (PPU) $10b1g3$, does not exist. And then, the Area process PR5 (see FIG. 6) or the Prox process PR6 (see FIG. 6) corresponding to the block frames DPB01, DPB02, DPB03 (see FIG. 7) is started by using the calculating portions (CPUs) $10b1g3c1$, $10b1g3c2$, $10b1g3c3$ of the processing portion (PPU) $10b1g3$.

In another case, an actual processing load while the Shot process PR3 (see FIG. 6) corresponding to the block frames DPB01, DPB02, DPB03 (see FIG. 7) is performed, may be considerably larger than an estimated processing load, because of diversification of the drawing data D (see FIG. 6) and miniaturization of figures FG1, FG2, FG3 (see FIG. 4) etc. included in the drawing data D (see FIG. 6).

Consequently, in the charged particle beam drawing apparatus 10 of the first embodiment, as shown in FIG. 11, although a start request for starting the Area process PR5 (see FIG. 6) or the Prox process PR6 (see FIG. 6) corresponding to the block frames DPB04, DPB05, DPB06 (see FIG. 7) by using the calculating portions (CPUs) $10b1g3c1$, $10b1g3c2$, $10b1g3c3$ of the processing portion (PPU) $10b1g3$, is transferred from the DPM process PR9 (see FIG. 6) performed by the calculating portion (CPU) $10b1g1c2$ of the writing control unit (WCU) $10b1g1$ to the daemon (sgsd) $10b1g3a$, if the daemon (sgsd) $10b1g3a$ of the processing portion (PPU) $10b1g3$ judges that there is a possibility of a shortage of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the memory $10b1g3d$, on the basis of the utilization rate of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the utilization rate of the memory $10b1g3d$, managed by the system (OS) $10b1g3b$, the start request for starting the Area process PR5 (see FIG. 6) or the Prox process PR6 (see FIG. 6) corresponding to the block frames DPB04, DPB05, DPB06 (see FIG. 7) by using the calculating portions (CPUs) $10b1g3c1$, $10b1g3c2$, $10b1g3c3$, is refused by the daemon (sgsd) $10b1g3a$, and then, a report that the start request from the DPM process PR9 (see FIG. 6) is refused, is transferred from the daemon (sgsd) $10b1g3a$ of the processing portion (PPU) $10b1g3$ to the DPM process PR9 (see FIG. 6) performed by the calculating portion (CPU) $10b1g1c2$ of the writing control unit (WCU) $10b1g1$. Namely, the report shows that a start error has happened.

In detail, in the charged particle beam drawing apparatus 10 of the first embodiment, as shown in FIG. 11, the Shot process PR3 (see FIG. 6) corresponding to the block frames DPB01, DPB02, DPB03 (see FIG. 7) is performed, and then, the possibility of the shortage of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the memory $10b1g3d$ of the processing portion (PPU) $10b1g3$, does not exist. And then, the Area process PR5 (see FIG. 6) or the Prox process PR6 (see FIG. 6) corresponding to the block frames DPB04, DPB05, DPB06 (see FIG. 7) is started by using the calculating portions (CPUs) $10b1g3c1$, $10b1g3c2$, $10b1g3c3$ of the processing portion (PPU) $10b1g3$.

In another case, an actual processing load while the Distributor processes PR1, PR4 (see FIG. 6) is performed, may be considerably larger than an estimated processing load, because of diversification of the drawing data D (see FIG. 6) and miniaturization of figures FG1, FG2, FG3 (see FIG. 4) etc. included in the drawing data D (see FIG. 6).

Consequently, in the charged particle beam drawing apparatus 10 of the first embodiment, as shown in FIG. 8, although a start request for starting one of the Distributor processes PR1, PR4 (see FIG. 6) by using the calculating portion (CPUs) $10b1g2c1$ or the calculating portion (CPUs) $10b1g2c2$ of the processing portion (DDU) $10b1g2$, is transferred from the DPM process PR9 (see FIG. 6) performed by the calculating portion (CPU) $10b1g1c2$ of the writing control unit (WCU) $10b1g1$ to the daemon (sgsd) $10b1g2a$, if the daemon (sgsd) $10b1g2a$ of the processing portion (DDU) $10b1g2$ judges that there is a possibility of a shortage of the calculating portions (CPUs) $10b1g2c1$, $10b1g2c2$, $10b1g2c3$ etc. and the memory $10b1g2d$, on the basis of the utilization rate of the calculating portions (CPUs) $10b1g2c1$, $10b1g2c2$, $10b1g2c3$ etc. and the utilization rate of the memory $10b1g2d$, managed by the system (OS) $10b1g2b$, the start request for starting one of the Distributor processes PR1, PR4 (see FIG. 6) by using the calculating portion (CPU) $10b1g2c1$ or the calculating portion (CPU) $10b1g2c2$, is refused by the daemon (sgsd) $10b1g2a$, and then, a report that the start request from the DPM process PR9 (see FIG. 6) is refused, is transferred from the daemon (sgsd) $10b1g2a$ of the processing portion (DDU) $10b1g2$ to the DPM process PR9 (see FIG. 6) performed by the calculating portion (CPU) $10b1g1c2$ of the writing control unit (WCU) $10b1g1$. Namely, the report shows that a start error has happened.

In detail, in the charged particle beam drawing apparatus 10 of the first embodiment, as shown in FIG. 8, the other of the Distributor processes PR1, PR4 (see FIG. 6) is performed, and then, the possibility of the shortage of the calculating portions (CPUs) $10b1g2c1$, $10b1g2c2$, $10b1g2c3$ etc. and the memory $10b1g2d$ of the processing portion (DDU) $10b1g2$, does not exist. And then, the one of Distributor processes PR1, PR4 (see FIG. 6) is started by using the calculating portion (CPU) $10b1g2c1$ or the calculating portion (CPU) $10b1g2c2$ of the processing portion (DDU) $10b1g2$.

Accordingly, the charged particle beam drawing apparatus 10 of the first embodiment can increase throughput more than a charged particle beam drawing apparatus in which a next Converter process PR2, a next Shot process PR3, a next Distributor process PR4, a next Area process PR5, a next Prox process PR6 and/or a next Output process PR6 is started, although there is a possibility of a shortage of the calculating portions (CPUs) $10b1g2c1$, $10b1g2c2$ etc. and the memory $10b1g2d$ of the processing portion (DDU) $10b1g2$, a possibility of a shortage of the calculating portions (CPUs) $10b1g3c1$, $10b1g3c2$ etc. and the memory $10b1g3d$ of the processing portion (PPU) $10b1g3$, or a possibility of a shortage of the calculating portions (CPUs) $10b1g4c1$, $10b1g4c2$ etc. and the memory $10b1g4d$ of the processing portion (SDTS) $10b1g4$, so that, processing speed of the Distributor process PR1, the Converter process PR2, the Shot process PR3, the Distributor process PR4, the Area process PR5, the Prox process PR6 and/or the Output process PR7 may be considerably decreased.

Figure 12:
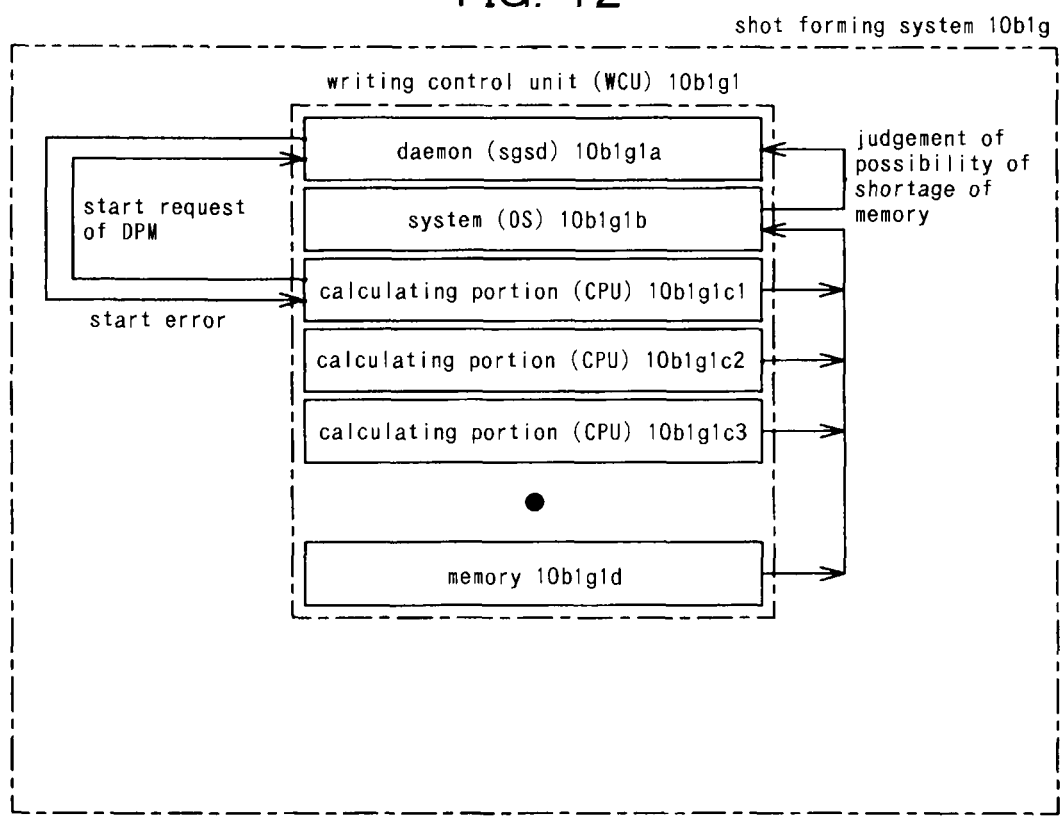
FIG. 12 shows an example in which a start request to a daemon (sgsd) 10$b$1$g$1$a$ of a writing control unit (WCU) 10$b$1$g$1 is refused.

FIG. 12 shows an example in which a start request to a daemon (sgsd) $10b1g1a$ of a writing control unit (WCU) $10b1g1$ is refused.

In the charged particle beam drawing apparatus 10 of the first embodiment, as shown in FIG. 12, a processing load while the WSM process PR8 (see FIG. 6) is performed, and a processing load while the DPM process PR9 (see FIG. 6) is performed, are estimated, and then, a predetermined number of the calculating portions (CPUs) 10$b$1$g$1$c$1, 10$b$1$g$1$c$2, 10$b$1$g$1$c$3 etc. of the writing control unit (WCU) 10$b$1$g$ are simultaneously used, so that a memory utilization rate of the memory 10$b$1$g$1$d$ of the writing control unit (WCU) 10$b$1$g$1 while the WSM process PR8 (see FIG. 6) and/or the DPM process PR9 (see FIG. 6) are performed, does not exceed a predetermined value.

In the charged particle beam drawing apparatus 10 of the first embodiment, as shown in FIG. 12, the memory 10$b$1$g$1$d$ of the writing control unit (WCU) 10$b$1$g$1 is used by the calculating portions (CPUs) 10$b$1$g$1$c$1, 10$b$1$g$1$c$2, 10$b$1$g$1$c$3 etc. which perform the WSM process PR8 (see FIG. 6) and the DPM process PR9 (see FIG. 6), as well as by another portions, such as a database (not shown).

Consequently, in the charged particle beam drawing apparatus 10 of the first embodiment, as shown in FIG. 12, although a start request for starting the DPM process PR9 (see FIG. 6) by using the calculating portion (CPUs) 10$b$1$g$1$c$2 and the memory 10$b$1$g$1$d$ of writing control unit (WCU) 10$b$1$g$, is transferred from the WSM process PR8 (see FIG. 6) performed by the calculating portion (CPU) 10$b$1$g$1$c$1 of the writing control unit (WCU) 10$b$1$g$1 to the daemon (sgsd) 10$b$1$g$1$a$ of the writing control unit (WCU) 10$b$1$g$1, if the daemon (sgsd) 10$b$1$g$1$a$ of the writing control unit (WCU) 10$b$1$g$1 judges that there is a possibility of a shortage of the memory 10$b$1$g$1$d$, on the basis of the utilization rate of the calculating portions (CPUs) 10$b$1$g$1$c$1, 10$b$1$g$1$c$2, 10$b$1$g$1$c$3 etc. and the utilization rate of the memory 10$b$1$g$1$d$, managed by the system (OS) 10$b$1$g$1$b$, the start request for starting the DPM process PR9 (see FIG. 6) by using the calculating portion (CPU) 10$b$1$g$1$c$2 and the memory 10$b$1$g$1$d$, is refused by the daemon (sgsd) 10$b$1$g$1$a$, and then, a report that the start request for starting the DPM process PR9 (see FIG. 6) from the WSM process PR8 (see FIG. 6) is refused, is transferred from the daemon (sgsd) 10$b$1$g$1$a$ of the writing control unit (WCU) 10$b$1$g$1 to the WSM process PR8 performed by the calculating portion (CPU) 10$b$1$g$1$c$1 of the writing control unit (WCU) 10$b$1$g$1. Namely, the report shows that a start error has happened.

Accordingly, the charged particle beam drawing apparatus 10 of the first embodiment can increase throughput more than a charged particle beam drawing apparatus in which a next DPM process PR9 is started, although there is a possibility of a shortage of the memory 10$b$1$g$1$d$ of the writing control unit (WCU) 10$b$1$g$1, so that, processing speed of the DPM process PR9 may be considerably decreased.

Figure 13:
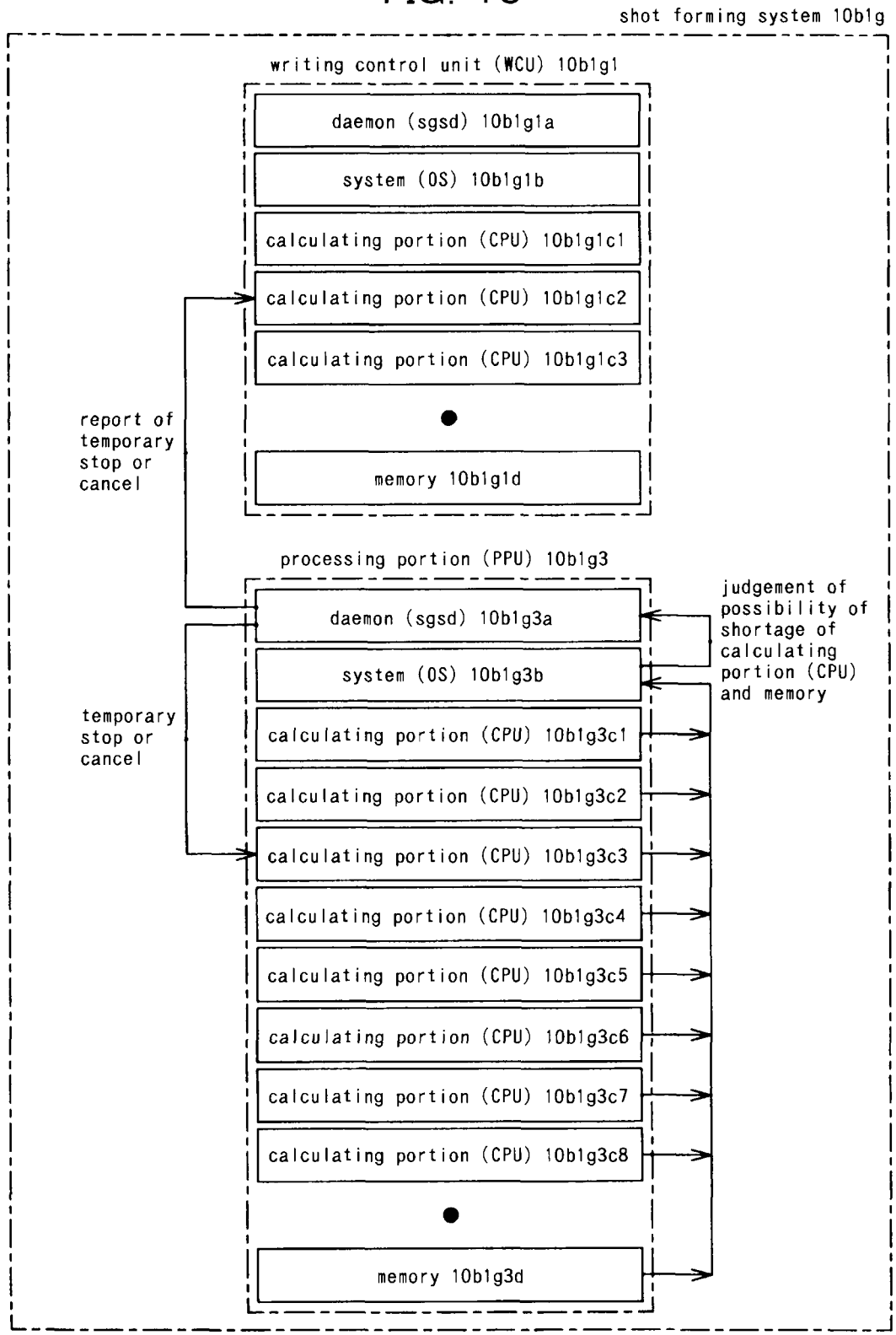
FIG. 13 shows an example in which a performance of an Area process PR5 or a Prox process PR6 by a calculating portion (CPU) 10$b$1$g$3$c$3 is temporarily stopped or canceled, when the Area process PR5 or the Prox process PR6 is performed by the calculating portion (CPU) 10$b$1$g$3$c$3 of the processing portion (PPU) 10$b$1$g$3.
Figure 14:
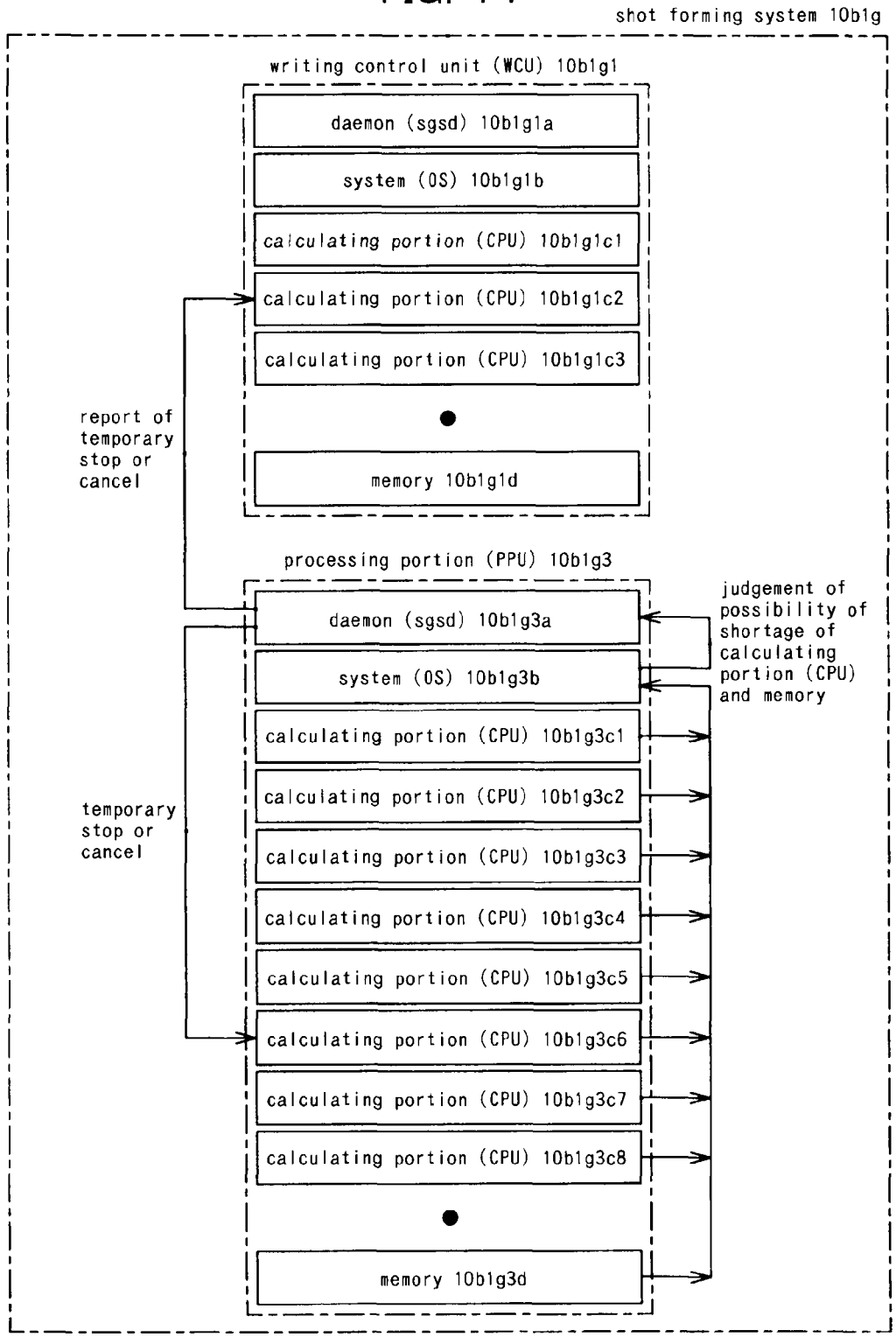
FIG. 14 shows an example in which a performance of a Converter process PR2 or a Shot process PR3 by a calculating portion (CPU) 10$b$1$g$3$c$6 is temporarily stopped or canceled, when the Converter process PR2 or the Shot process PR3 is performed by the calculating portion (CPU) 10$b$1$g$3$c$6 of the processing portion (PPU) 10$b$1$g$3.

FIG. 13 shows an example in which a performance of an Area process PR5 or a Prox process PR6 by the calculating portion (CPU) 10$b$1$g$3$c$3 is temporarily stopped or canceled, when the Area process PR5 or the Prox process PR6 is performed by the calculating portion (CPU) 10$b$1$g$3$c$3 of the processing portion (PPU) 10$b$1$g$3. FIG. 14 shows an example in which a performance of a Converter process PR2 or a Shot process PR3 by the calculating portion (CPU) 10$b$1$g$3$c$6 is temporarily stopped or canceled, when the Converter process PR2 or the Shot process PR3 is performed by the calculating portion (CPU) 10$b$1$g$3$c$6 of the processing portion (PPU) 10$b$1$g$3.

As mentioned above, in the charged particle beam drawing apparatus 10 of the first embodiment, a processing load while the Area process PR5 (see FIG. 6), the Prox process PR6 (see FIG. 6), the Converter process PR2 (see FIG. 6) or the Shot process PR3 (see FIG. 6) corresponding to the block frame DPB01 (see FIG. 7) is performed, a processing load while the Area process PR5 (see FIG. 6), the Prox process PR6 (see FIG. 6), the Converter process PR2 (see FIG. 6) or the Shot process PR3 (see FIG. 6) corresponding to the block frame DPB02 (see FIG. 7) is performed, and a processing load while the Area process PR5 (see FIG. 6), the Prox process PR6 (see FIG. 6), the Converter process PR2 (see FIG. 6) or the Shot process PR3 (see FIG. 6) corresponding to the block frame DPB03 (see FIG. 7) is performed, are estimated, and then, a predetermined number of the calculating portions (CPUs) 10$b$1$g$3$c$1, 10$b$1$g$3$c$2, 10$b$1$g$3$c$3 (see FIG. 8) etc. are simultaneously used, so that a memory utilization rate of the memory 10$b$1$g$3$d$ (see FIG. 8) of the processing portion (PPU) 10$b$1$g$3 (see FIG. 8) while the Area process PR5 (see FIG. 6), the Prox process PR6 (see FIG. 6), the Converter process PR2 (see FIG. 6) and/or the Shot process PR3 (see FIG. 6) are performed, does not exceed a predetermined value.

However, in one case, an actual processing load while the Area process PR5 (see FIG. 6) or the Prox process PR6 (see FIG. 6) corresponding to the block frames DPB01, DPB02, DPB03 (see FIG. 7) is performed, may be considerably larger than an estimated processing load, because of diversification of the drawing data D (see FIG. 6) and miniaturization of figures FG1, FG2, FG3 (see FIG. 4) etc. included in the drawing data D (see FIG. 6).

Consequently, in the charged particle beam drawing apparatus 10 of the first embodiment, as shown in FIG. 13, while the Area process PR5 (see FIG. 6) or the Prox process PR6 (see FIG. 6) corresponding to the block frames DPB01, DPB02, DPB03 (see FIG. 7) is performed by using the calculating portions (CPUs) 10$b$1$g$3$c$1, 10$b$1$g$3$c$2, 10$b$1$g$3$c$3 and the memory 10$b$1$g$3$d$, if the daemon (sgsd) 10$b$1$g$3$a$ of the processing portion (PPU) 10$b$1$g$3 judges that there is a possibility of a shortage of the calculating portions (CPUs) 10$b$1$g$3$c$1, 10$b$1$g$3$c$2, 10$b$1$g$3$c$3, 10$b$1$g$3$c$4, 10$b$1$g$3$c$5, 10$b$1$g$3$c$6, 10$b$1$g$3$c$7, 10$b$1$g$3$c$8 etc. and the memory 10$b$1$g$3$d$, on the basis of the utilization rate of the calculating portions (CPUs) 10$b$1$g$3$c$1, 10$b$1$g$3$c$2, 10$b$1$g$3$c$3, 10$b$1$g$3$c$4, 10$b$1$g$3$c$5, 10$b$1$g$3$c$6, 10$b$1$g$3$c$7, 10$b$1$g$3$c$8 etc. and the utilization rate of the memory 10$b$1$g$3$d$, managed by the system (OS) 10$b$1$g$3$b$, the daemon (sgsd) 10$b$1$g$3$a$ continues a performance of the Area process PR5 (see FIG. 6) or the Prox process PR6 (see FIG. 6) corresponding to the block frames DPB01, DPB02 (see FIG. 7), and the daemon (sgsd) 10$b$1$g$3$a$ temporarily stops or cancels a performance of the Area process PR5 (see FIG. 6) or the Prox process PR6 (see FIG. 6) corresponding to the block frame DPB03 (see FIG. 7), wherein the block frames DPB01, DPB02 have a drawing order priority, and wherein the block frame DPB03 has a drawing order posteriority. Namely, a drawing corresponding to the block frames DPB01, DPB02 which are placed on a left side of the stripe frame STR1 (see FIGS. 5 and 7), is performed, before a drawing corresponding to the block frame DPB03 which is placed on a right side of the stripe frame STR1 (see FIGS. 5 and 7), is performed.

Concretely, in the charged particle beam drawing apparatus 10 of the first embodiment, as shown in FIG. 13, an indication for temporarily stopping or canceling the performance of the Area process PR5 (see FIG. 6) or the Prox process PR6 (see FIG. 6) corresponding to the block frame DPB03 (see FIG. 7), is transferred from the daemon (sgsd) 10$b$1$g$3$a$ of the processing portion (PPU) 10$b$1$g$3 to the calculating portion 10$b$1$g$3$c$3 of the processing portion (PPU) 10$b$1$g$3, and then, a report that the performance of the Area process PR5 (see FIG. 6) or the Prox process PR6 (see FIG. 6)

corresponding to the block frame DPB03 (see FIG. 7) is temporarily stopped or canceled, is transferred from the daemon (sgsd) $10b1g3a$ of the processing portion (PPU) $10b1g3$ to the DPM process PR9 (see FIG. 6) performed by the calculating portion (CPU) $10b1g1c2$ of the writing control unit (WCU) $10b1g1$.

In detail, in the charged particle beam drawing apparatus 10 of the first embodiment, as shown in FIG. 13, if the performance of the Area process PR5 (see FIG. 6) or the Prox process PR6 (see FIG. 6) corresponding to the block frame DPB03 (see FIG. 7) is temporarily stopped, the Area process PR5 (see FIG. 6) or the Prox process PR6 (see FIG. 6) corresponding to the block frames DPB01, DPB02 (see FIG. 7) is performed, and then, the possibility of the shortage of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the memory $10b1g3d$ of the processing portion (PPU) $10b1g3$, does not exist. And then, the performance of the Area process PR5 (see FIG. 6) or the Prox process PR6 (see FIG. 6) corresponding to the block frame DPB03 (see FIG. 7) is restarted.

Conversely, in the charged particle beam drawing apparatus 10 of the first embodiment, as shown in FIG. 13, if the performance of the Area process PR5 (see FIG. 6) or the Prox process PR6 (see FIG. 6) corresponding to the block frame DPB03 (see FIG. 7) is canceled, a processing result of the performance of the Area process PR5 (see FIG. 6) or the Prox process PR6 (see FIG. 6) corresponding to the block frame DPB03 (see FIG. 7) which is canceled, is erased. Also, the Area process PR5 (see FIG. 6) or the Prox process PR6 (see FIG. 6) corresponding to the block frames DPB01, DPB02 (see FIG. 7) is performed, and then, the possibility of the shortage of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the memory $10b1g3d$ of the processing portion (PPU) $10b1g3$, does not exist. And then, the Area process PR5 (see FIG. 6) or the Prox process PR6 (see FIG. 6) corresponding to the block frame DPB03 (see FIG. 7) is started.

In another case, an actual processing load while the Converter process PR2 (see FIG. 6) or the Shot process PR3 (see FIG. 6) corresponding to the block frames DPB01, DPB02, DPB03 (see FIG. 7) is performed, may be considerably larger than an estimated processing load, because of diversification of the drawing data D (see FIG. 6) and miniaturization of figures FG1, FG2, FG3 (see FIG. 4) etc. included in the drawing data D (see FIG. 6).

Consequently, in the charged particle beam drawing apparatus 10 of the first embodiment, as shown in FIG. 14, while the Converter process PR2 (see FIG. 6) or the Shot process PR3 (see FIG. 6) corresponding to the block frames DPB01, DPB02, DPB03 (see FIG. 7) is performed by using the calculating portions (CPUs) $10b1g3c4$, $10b1g3c5$, $10b1g3c6$ and the memory $10b1g3d$, if the daemon (sgsd) $10b1g3a$ of the processing portion (PPU) $10b1g3$ judges that there is a possibility of a shortage of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the memory $10b1g3d$, on the basis of the utilization rate of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the utilization rate of the memory $10b1g3d$, managed by the system (OS) $10b1g3b$, the daemon (sgsd) $10b1g3a$ continues a performance of the Converter process PR2 (see FIG. 6) or the Shot process PR3 (see FIG. 6) corresponding to the block frames DPB01, DPB02 (see FIG. 7), and the daemon (sgsd) $10b1g3a$ temporarily stops or cancels a performance of the Converter process PR2 (see FIG. 6) or the Shot process PR3 (see FIG. 6) corresponding to the block frame DPB03 (see FIG. 7), wherein the block frames DPB01, DPB02 have the drawing order priority, and wherein the block frame DPB03 has the drawing order posteriority. Namely, the drawing corresponding to the block frames DPB01, DPB02 which are placed on the left side of the stripe frame STR1 (see FIGS. 5 and 7), is performed, before the drawing corresponding to the block frame DPB03 which is placed on the right side of the stripe frame STR1 (see FIGS. 5 and 7), is performed.

Concretely, in the charged particle beam drawing apparatus 10 of the first embodiment, as shown in FIG. 14, an indication for temporarily stopping or canceling the performance of the Converter process PR2 (see FIG. 6) or the Shot process PR3 (see FIG. 6) corresponding to the block frame DPB03 (see FIG. 7), is transferred from the daemon (sgsd) $10b1g3a$ of the processing portion (PPU) $10b1g3$ to the calculating portion $10b1g3c3$ of the processing portion (PPU) $10b1g3$, and then, a report that the performance of the Converter process PR2 (see FIG. 6) or the Shot process PR3 (see FIG. 6) corresponding to the block frame DPB03 (see FIG. 7) is temporarily stopped or canceled, is transferred from the daemon (sgsd) $10b1g3a$ of the processing portion (PPU) $10b1g3$ to the DPM process PR9 (see FIG. 6) performed by the calculating portion (CPU) $10b1g1c2$ of the writing control unit (WCU) $10b1g1$.

In detail, in the charged particle beam drawing apparatus 10 of the first embodiment, as shown in FIG. 14, if the performance of the Converter process PR2 (see FIG. 6) or the Shot process PR3 (see FIG. 6) corresponding to the block frame DPB03 (see FIG. 7) is temporarily stopped, the Converter process PR2 (see FIG. 6) or the Shot process PR3 (see FIG. 6) corresponding to the block frames DPB01, DPB02 (see FIG. 7) is performed, and then, the possibility of the shortage of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the memory $10b1g3d$ of the processing portion (PPU) $10b1g3$, does not exist. And then, the performance of the Converter process PR2 (see FIG. 6) or the Shot process PR3 (see FIG. 6) corresponding to the block frame DPB03 (see FIG. 7) is restarted.

Conversely, in the charged particle beam drawing apparatus 10 of the first embodiment, as shown in FIG. 14, if the performance of the Converter process PR2 (see FIG. 6) or the Shot process PR3 (see FIG. 6) corresponding to the block frame DPB03 (see FIG. 7) is canceled, a processing result of the performance of the Converter process PR2 (see FIG. 6) or the Shot process PR3 (see FIG. 6) corresponding to the block frame DPB03 (see FIG. 7) which is canceled, is erased. Also, the Converter process PR2 (see FIG. 6) or the Shot process PR3 (see FIG. 6) corresponding to the block frames DPB01, DPB02 (see FIG. 7) is performed, and then, the possibility of the shortage of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. and the memory $10b1g3d$ of the processing portion (PPU) $10b1g3$, does not exist. And then, the Converter process PR2 (see FIG. 6) or the Shot process PR3 (see FIG. 6) corresponding to the block frame DPB03 (see FIG. 7) is started.

In another case, an actual processing load while the Distributor processes PR1, PR4 (see FIG. 6) are performed, may be considerably larger than an estimated processing load, because of diversification of the drawing data D (see FIG. 6) and miniaturization of figures FG1, FG2, FG3 (see FIG. 4) etc. included in the drawing data D (see FIG. 6).

Consequently, in the charged particle beam drawing apparatus 10 of the first embodiment, as shown in FIG. 8, while the Distributor processes PR1, PR4 (see FIG. 6) are performed by using the calculating portions (CPUs) $10b1g2c1$, $10b1g2c2$, $10b1g2c3$ etc. and the memory $10b1g2d$ of the processing portion (DDU) $10b1g2$, if the daemon (sgsd) $10b1g2a$ of the processing portion (DDU) $10b1g2$ judges that there is a possibility of a shortage of the calculating portions (CPUs) $10b1g2c1$, $10b1g2c2$, $10b1g2c3$ etc. and the memory $10b1g2d$, on the basis of the utilization rate of the calculating portions (CPUs) $10b1g2c1$, $10b1g2c2$, $10b1g2c3$ etc. and the utilization rate of the memory $10b1g2d$, managed by the system (OS) $10b1g2b$, the daemon (sgsd) $10b1g2a$ continues a performance of the Distributor processes PR1, PR4 (see FIG. 6) corresponding to the block frames DPB01, DPB02, DPB03 (see FIG. 7), and the daemon (sgsd) $10b1g2a$ temporarily stops or cancels a performance of the Distributor processes PR1, PR4 (see FIG. 6) corresponding to the block frame DPB04, DPB05, DPB06 (see FIG. 7), wherein the block frames DPB01, DPB02, DPB03 have a drawing order priority, and wherein the block frames DPB04, DPB05, DPB06 has a drawing order posteriority. Namely, a drawing corresponding to the block frames DPB01, DPB02, DPB03 is performed, before a drawing corresponding to the block frames DPB04, DPB05, DPB06 is performed.

Concretely, in the charged particle beam drawing apparatus 10 of the first embodiment, as shown in FIG. 8, an indication for temporarily stopping or canceling the performance of the Distributor processes PR1, PR4 (see FIG. 6) corresponding to the block frames DPB04, DPB05, DPB06 (see FIG. 7), is transferred from the daemon (sgsd) $10b1g2a$ of the processing portion (DDU) $10b1g2$ to the calculating portion $10b1g2c3$ etc. of the processing portion (DDU) $10b1g2$, and then, a report that the performance of the Distributor processes PR1, PR4 (see FIG. 6) corresponding to the block frames DPB04, DPB05, DPB06 (see FIG. 7) is temporarily stopped or canceled, is transferred from the daemon (sgsd) $10b1g2a$ of the processing portion (DDU) $10b1g2$ to the DPM process PR9 (see FIG. 6) performed by the calculating portion (CPU) $10b1g1c2$ of the writing control unit (WCU) $10b1g1$.

In detail, in the charged particle beam drawing apparatus 10 of the first embodiment, as shown in FIG. 8, if the performance of the Converter processes PR1, PR4 (see FIG. 6) corresponding to the block frames DPB04, DPB05, DPB06 (see FIG. 7) is temporarily stopped, the Converter processes PR1, PR4 (see FIG. 6) corresponding to the block frames DPB01, DPB02, DPB03 (see FIG. 7) are performed, and then, the possibility of the shortage of the calculating portions (CPUs) $10b1g2c1$, $10b1g2c2$, $10b1g2c3$ etc. and the memory $10b1g2d$ of the processing portion (DDU) $10b1g2$, does not exist. And then, the performance of the Distributor processes PR1, PR4 (see FIG. 6) corresponding to the block frames DPB04, DPB05, DPB06 (see FIG. 7) is restarted.

Conversely, in the charged particle beam drawing apparatus 10 of the first embodiment, as shown in FIG. 8, if the performance of the Distributor processes PR1, PR4 (see FIG. 6) corresponding to the block frames DPB04, DPB05, DPB06 (see FIG. 7) is canceled, a processing result of the performance of the Distributor processes PR1, PR4 (see FIG. 6) corresponding to the block frames DPB04, DPB05, DPB06 (see FIG. 7) which is canceled, is erased. Also, the Distributor processes PR1, PR4 (see FIG. 6) corresponding to the block frames DPB01, DPB02, DPB03 (see FIG. 7) are performed, and then, the possibility of the shortage of the calculating portions (CPUs) $10b1g2c1$, $10b1g2c2$, $10b1g2c3$ etc. and the memory $10b1g2d$ of the processing portion (DDU) $10b1g2$, does not exist. And then, the Distributor processes PR1, PR4 (see FIG. 6) corresponding to the block frames DPB04, DPB05, DPB06 (see FIG. 7) are started.

In another case, an actual processing load while the Output process PR7 (see FIG. 6) is performed, may be considerably larger than an estimated processing load, because of diversification of the drawing data D (see FIG. 6) and miniaturization of figures FG1, FG2, FG3 (see FIG. 4) etc. included in the drawing data D (see FIG. 6).

Consequently, in the charged particle beam drawing apparatus 10 of the first embodiment, as shown in FIG. 8, while the Output process PR7 (see FIG. 6) is performed by using the calculating portions (CPUs) $10b1g4c1$, $10b1g4c2$, $10b1g4c3$ etc. and the memory $10b1g4d$ of the processing portion (SDTS) $10b1g4$, if the daemon (sgsd) $10b1g4a$ of the processing portion (SDTS) $10b1g4$ judges that there is a possibility of a shortage of the calculating portions (CPUs) $10b1g4c1$, $10b1g4c2$, $10b1g4c3$ etc. and the memory $10b1g4d$, on the basis of the utilization rate of the calculating portions (CPUs) $10b1g4c1$, $10b1g4c2$, $10b1g4c3$ etc. and the utilization rate of the memory $10b1g4d$, managed by the system (OS) $10b1g4b$, the daemon (sgsd) $10b1g4a$ continues a performance of the Output process PR7 (see FIG. 6) corresponding to the block frames DPB01, DPB02, DPB03 (see FIG. 7), and the daemon (sgsd) $10b1g4a$ temporarily stops or cancels a performance of the Output process PR7 (see FIG. 6) corresponding to the block frame DPB04, DPB05, DPB06 (see FIG. 7), wherein the block frames DPB01, DPB02, DPB03 have a drawing order priority, and wherein the block frames DPB04, DPB05, DPB06 has a drawing order posteriority. Namely, a drawing corresponding to the block frames DPB01, DPB02, DPB03 is performed, before a drawing corresponding to the block frames DPB04, DPB05, DPB06 is performed.

Concretely, in the charged particle beam drawing apparatus 10 of the first embodiment, as shown in FIG. 8, an indication for temporarily stopping or canceling the performance of the Output process PR7 (see FIG. 6) corresponding to the block frames DPB04, DPB05, DPB06 (see FIG. 7), is transferred from the daemon (sgsd) $10b1g4a$ of the processing portion (SDTS) $10b1g4$ to the calculating portion $10b1g4c3$ etc. of the processing portion (SDTS) $10b1g4$, and then, a report that the performance of the Output process PR7 (see FIG. 6) corresponding to the block frames DPB04, DPB05, DPB06 (see FIG. 7) is temporarily stopped or canceled, is transferred from the daemon (sgsd) $10b1g4a$ of the processing portion (SDTS) $10b1g4$ to the DPM process PR9 (see FIG. 6) performed by the calculating portion (CPU) $10b1g1c2$ of the writing control unit (WCU) $10b1g1$.

In detail, in the charged particle beam drawing apparatus 10 of the first embodiment, as shown in FIG. 8, if the performance of the Output process PR7 (see FIG. 6) corresponding to the block frames DPB04, DPB05, DPB06 (see FIG. 7) is temporarily stopped, the Output process PR7 (see FIG. 6) corresponding to the block frames DPB01, DPB02, DPB03 (see FIG. 7) are performed, and then, the possibility of the shortage of the calculating portions (CPUs) $10b1g4c1$, $10b1g4c2$, $10b1g4c3$ etc. and the memory $10b1g4d$ of the processing portion (SDTS) $10b1g4$, does not exist. And then, the performance of the Output process PR7 (see FIG. 6) corresponding to the block frames DPB04, DPB05, DPB06 (see FIG. 7) is restarted.

Conversely, in the charged particle beam drawing apparatus 10 of the first embodiment, as shown in FIG. 8, if the performance of the Output process PR7 (see FIG. 6) corresponding to the block frames DPB04, DPB05, DPB06 (see FIG. 7) is canceled, a processing result of the performance of the Output process PR7 (see FIG. 6) corresponding to the block frames DPB04, DPB05, DPB06 (see FIG. 7) which is canceled, is erased. Also, the Output process PR7 (see FIG. 6) corresponding to the block frames DPB01, DPB02, DPB03 (see FIG. 7) are performed, and then, the possibility of the shortage of the calculating portions (CPUs) $10b1g4c1$, $10b1g4c2$, $10b1g4c3$ etc. and the memory $10b1g4d$ of the processing portion (SDTS) $10b1g4$, does not exist. And then, the Output process PR7 (see FIG. 6) corresponding to the block frames DPB04, DPB05, DPB06 (see FIG. 7) are started.

Accordingly, the charged particle beam drawing apparatus 10 of the first embodiment can increase throughput more than a charged particle beam drawing apparatus in which a performance of the Distributor process PR1, the Converter process PR2, the Shot process R3, the Distributor process PR4, the Area process PR5, the Prox process PR6 and/or the Output process PR7 is continued, although there is a possibility of a shortage of the calculating portions (CPUs) $10b1g2c1$, $10b1g2c2$ etc., $10b1g3c1$, $10b1g3c2$ etc., $10b1g4c1$, $10b1g4c2$ etc. and the memories $10b1g2d$, $10b1g3d$, $10b1g4d$ of the processing portions $10b1g2$, $10b1g3$, $10b1g4$, so that, processing speed of the Distributor process PR1, the Converter process PR2, the Shot process R3, the Distributor process PR4, the Area process PR5, the Prox process PR6 and/or the Output process PR7 may be considerably decreased.

In the charged particle beam drawing apparatus 10 of the first embodiment, management by the daemons (sgsds) $10b1g2a$, $10b1g3a$, $10b1g4a$ (see FIG. 8) of the processing portions $10g1g2$, $10b1g3$, $10b1g4$ (see FIG. 8) are strengthened.

Figure 15:
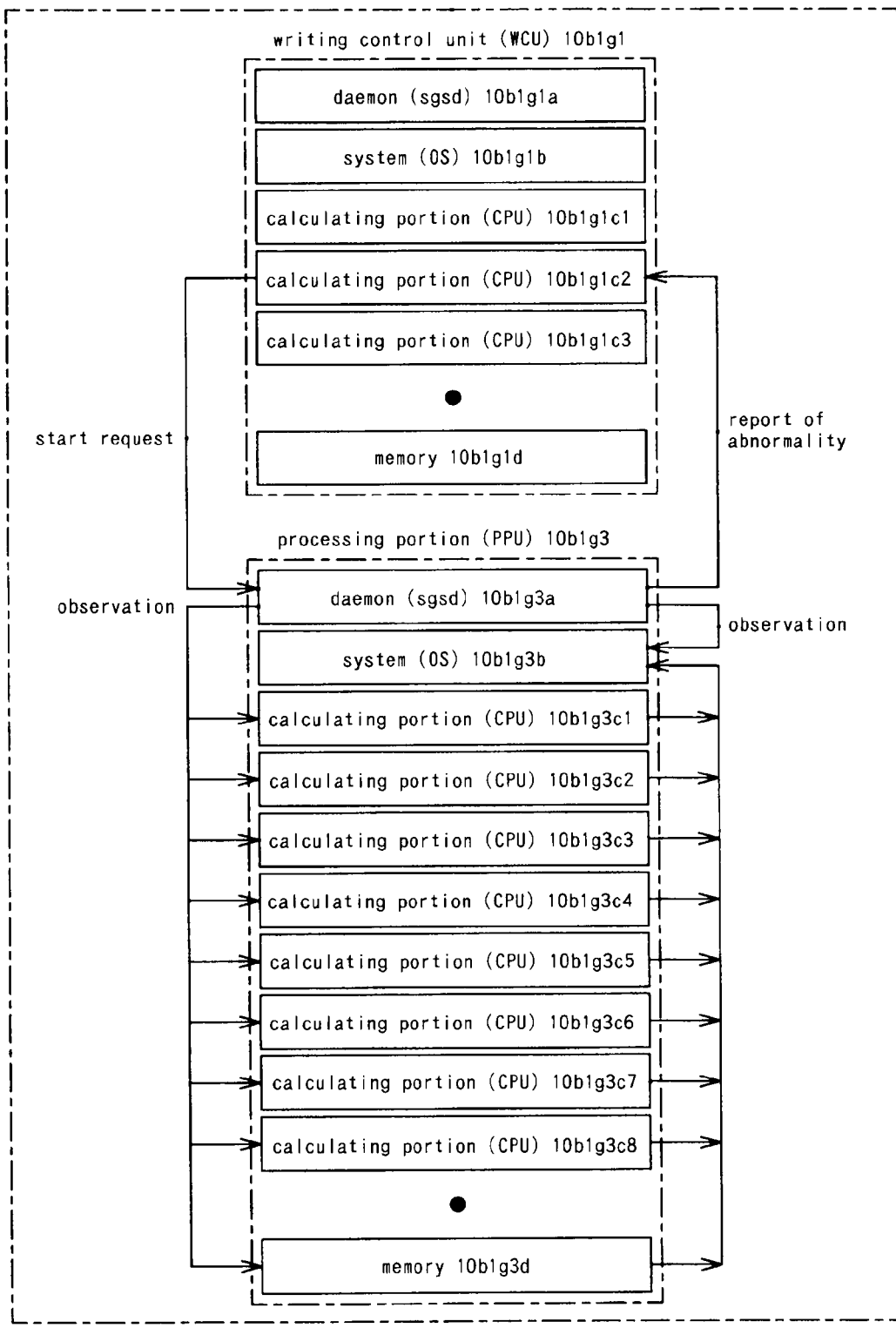
FIG. 15 shows an example of a report of abnormality transferred from the daemon (sgsd) 10$b$1$g$3$a$ of the processing portion (PPU) 10$b$1$g$3.

FIG. 15 shows an example of a report of abnormality transferred from the daemon (sgsd) $10b1g3a$ of the processing portion (PPU) $10b1g3$.

In the charged particle beam drawing apparatus 10 of the first embodiment, as shown in FIG. 15, the utilization rate of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$ and the utilization rate of the memory $10b1g3d$ of the processing portion (PPU) $10b1g3$ are managed by the system (OS) $10b1g3b$ of the processing portion (PPU) $10b1g3$. The system (OS) $10b1g3b$ of the processing portion (PPU) $10b1g3$ is managed by the daemon (sgsd) $10b1g3a$ of the processing portion (PPU) $10b1g3$. Normality of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$, the memory $10b1g3d$ of the processing portion (PPU) $10b1g3$, and communication in the processing portion (PPU) $10b1g3$ is managed by the daemon (sgsd) $10b1g3a$ of the processing portion (PPU) $10b1g3$.

In detail, in the charged particle beam drawing apparatus 10 of the first embodiment, as shown in FIG. 15, if a start request for starting the Converter process PR2 (see FIG. 6), the Shot process PR3 (see FIG. 6), the Area process PR5 (see FIG. 6) and/or the Prox process PR6 (see FIG. 6) corresponding to the block frames DPB01, DPB02, DPB03 (see FIG. 7) by using the calculating portions (CPUs) $10b1g3c1$, $10b1g3c2$, $10b1g3c3$, $10b1g3c4$, $10b1g3c5$, $10b1g3c6$, is transferred from the DPM process PR9 (see FIG. 6) performed by the calculating portion (CPU) $10b1g1c2$ of the writing control unit (WCU) $10b1g1$ to the daemon (sgsd) $10b1g3a$ of the processing portion (PPU) $10b1g3$, the daemon (sgsd) $10b1g3a$ of the processing portion (PPU) $10b1g3$ judges the normality of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$, the memory $10b1g3d$ of the processing portion (PPU) $10b1g3$, and the communication in the processing portion (PPU) $10b1g3$.

And then, in the charged particle beam drawing apparatus 10 of the first embodiment, as shown in FIG. 15, if at least one of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$, the memory $10b1g3d$ of the processing portion (PPU) $10b1g3$, and the communication in the processing portion (PPU) $10b1g3$, is abnormal, a report that at least one of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$, the memory $10b1g3d$ of the processing portion (PPU) $10b1g3$, and the communication in the processing portion (PPU) $10b1g3$, is abnormal, is transferred from the daemon (sgsd) $10b1g3a$ of the processing portion (PPU) $10b1g3$ to the DPM process PR9 (see FIG. 6) performed by the calculating portion (CPU) $10b1g1c2$ of the writing control unit (WCU) $10b1g1$.

Accordingly, the charged particle beam drawing apparatus 10 of the first embodiment can recognize an abnormality earlier, and can understand the abnormality in more detail, than a charged particle beam drawing apparatus in which the report that at least one of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$, the memory $10b1g3d$ of the processing portion (PPU) $10b1g3$, and the communication in the processing portion (PPU) $10b1g3$, is abnormal, is not transferred from the daemon (sgsd) $10b1g3a$ of the processing portion (PPU) $10b1g3$ to the DPM process PR9 (see FIG. 6), and the Converter process PR2 (see FIG. 6), the Shot process PR3 (see FIG. 6), the Area process PR5 (see FIG. 6) and/or the Prox process PR6 (see FIG. 6) is started, so that, the abnormality is not recognized until a timeout error of the Converter process PR2 (see FIG. 6), the Shot process PR3 (see FIG. 6), the Area process PR5 (see FIG. 6) and/or the Prox process PR6 (see FIG. 6) occurs.

In the charged particle beam drawing apparatus 10 of the first embodiment, as shown in FIG. 8, the utilization rate of the calculating portions (CPUs) $10b1g2c1$, $10b1g2c2$, $10b1g2c3$ etc. of the processing portion (DDU) $10b1g2$ and the utilization rate of the memory $10b1g2d$ of the processing portion (DDU) $10b1g2$ are managed by the system (OS) $10b1g2b$ of the processing portion (DDU) $10b1g2$. The system (OS) $10b1g2b$ of the processing portion (DDU) $10b1g2$ is managed by the daemon (sgsd) $10b1g2a$ of the processing portion (DDU) $10b1g2$. Normality of the calculating portions (CPUs) $10b1g2c1$, $10b1g2c2$, $10b1g2c3$ etc. of the processing portion (DDU) $10b1g2$, the memory $10b1g2d$ of the processing portion (DDU) $10b1g2$, and communication in the processing portion (DDU) $10b1g2$ is managed by the daemon (sgsd) $10b1g2a$ of the processing portion (DDU) $10b1g2$.

In detail, in the charged particle beam drawing apparatus 10 of the first embodiment, as shown in FIG. 8, if a start request for starting the Distributor processes PR1, PR4 (see FIG. 6) corresponding to the block frames DPB01, DPB02, DPB03 (see FIG. 7) by using the calculating portions (CPUs) $10b1g2c1$, $10b1g2c2$, is transferred from the DPM process PR9 (see FIG. 6) performed by the calculating portion (CPU) $10b1g1c2$ of the writing control unit (WCU) $10b1g1$ to the daemon (sgsd) $10b1g2a$ of the processing portion (DDU) $10b1g2$, the daemon (sgsd) $10b1g2a$ of the processing portion (DDU) $10b1g2$ judges the normality of the calculating portions (CPUs) $10b1g2c1$, $10b1g2c2$, $10b1g2c3$ etc. of the processing portion (DDU) $10b1g2$, the memory $10b1g2d$ of the processing portion (DDU) $10b1g2$, and the communication in the processing portion (DDU) $10b1g2$.

And then, in the charged particle beam drawing apparatus 10 of the first embodiment, as shown in FIG. 8, if at least one of the calculating portions (CPUs) $10b1g2c1$, $10b1g2c2$, $10b1g2c3$ etc. of the processing portion (DDU) $10b1g2$, the memory $10b1g2d$ of the processing portion (DDU) $10b1g2$, and the communication in the processing portion (DDU) $10b1g2$, is abnormal, a report that at least one of the calculating portions (CPUs) $10b1g2c1$, $10b1g2c2$, $10b1g2c3$ etc. of the processing portion (DDU) $10b1g2$, the memory $10b1g2d$ of the processing portion (DDU) $10b1g2$, and the communication in the processing portion (DDU) $10b1g2$, is abnormal, is transferred from the daemon (sgsd) $10b1g2a$ of the processing portion (DDU) $10b1g2$ to the DPM process PR9 (see FIG. 6) performed by the calculating portion (CPU) $10b1g1c2$ of the writing control unit (WCU) $10b1g1$.

Accordingly, the charged particle beam drawing apparatus 10 of the first embodiment can recognize an abnormality earlier, and can understand the abnormality in more detail, than a charged particle beam drawing apparatus in which the report that at least one of the calculating portions (CPUs) $10b1g2c1$, $10b1g2c2$, $10b1g2c3$ etc. of the processing portion (DDU) $10b1g2$, the memory $10b1g2d$ of the processing portion (DDU) $10b1g2$, and the communication in the processing portion (DDU) $10b1g2$, is abnormal, is not transferred from the daemon (sgsd) $10b1g2a$ of the processing portion (DDU) $10b1g2$ to the DPM process PR9 (see FIG. 6), and the Distributor processes PR1, PR4 (see FIG. 6) are started, so that, the abnormality is not recognized until a timeout error of the Distributor processes PR1, PR4 (see FIG. 6) occurs.

In the charged particle beam drawing apparatus 10 of the first embodiment, as shown in FIG. 8, the utilization rate of the calculating portions (CPUs) $10b1g4c1$, $10b1g4c2$, $10b1g4c3$ etc. of the processing portion (SDTS) $10b1g4$ and the utilization rate of the memory $10b1g4d$ of the processing portion (SDTS) $10b1g4$ are managed by the system (OS) $10b1g4b$ of the processing portion (SDTS) $10b1g4$. The system (OS) $10b1g4b$ of the processing portion (SDTS) $10b1g4$ is managed by the daemon (sgsd) $10b1g4a$ of the processing portion (SDTS) $10b1g4$. Normality of the calculating portions (CPUs) $10b1g4c1$, $10b1g4c2$, $10b1g4c3$ etc. of the processing portion (SDTS) $10b1g4$, the memory $10b1g4d$ of the processing portion (SDTS) $10b1g4$, and communication in the processing portion (SDTS) $10b1g4$ is managed by the daemon (sgsd) $10b1g4a$ of the processing portion (SDTS) $10b1g4$.

In detail, in the charged particle beam drawing apparatus 10 of the first embodiment, as shown in FIG. 8, if a start request for starting the Output process PR7 (see FIG. 6) corresponding to the block frames DPB01, DPB02, DPB03 (see FIG. 7) by using the calculating portions (CPUs) $10b1g4c1$, $10b1g4c2$, is transferred from the DPM process PR9 (see FIG. 6) performed by the calculating portion (CPU) $10b1g1c2$ of the writing control unit (WCU) $10b1g1$ to the daemon (sgsd) $10b1g4a$ of the processing portion (SDTS) $10b1g4$, the daemon (sgsd) $10b1g4a$ of the processing portion (SDTS) $10b1g4$ judges the normality of the calculating portions (CPUs) $10b1g4c1$, $10b1g4c2$, $10b1g4c3$ etc. of the processing portion (SDTS) $10b1g4$, the memory $10b1g4d$ of the processing portion (SDTS) $10b1g4$, and the communication in the processing portion (SDTS) $10b1g4$.

And then, in the charged particle beam drawing apparatus 10 of the first embodiment, as shown in FIG. 8, if at least one of the calculating portions (CPUs) $10b1g4c1$, $10b1g4c2$, $10b1g4c3$ etc. of the processing portion (SDTS) $10b1g4$, the memory $10b1g4d$ of the processing portion (SDTS) $10b1g4$, and the communication in the processing portion (SDTS) $10b1g4$, is abnormal, a report that at least one of the calculating portions (CPUs) $10b1g4c1$, $10b1g4c2$, $10b1g4c3$ etc. of the processing portion (SDTS) $10b1g4$, the memory $10b1g4d$ of the processing portion (SDTS) $10b1g4$, and the communication in the processing portion (SDTS) $10b1g4$, is abnormal, is transferred from the daemon (sgsd) $10b1g4a$ of the processing portion (SDTS) $10b1g4$ to the DPM process PR9 (see FIG. 6) performed by the calculating portion (CPU) $10b1g1c2$ of the writing control unit (WCU) $10b1g1$.

Accordingly, the charged particle beam drawing apparatus 10 of the first embodiment can recognize an abnormality earlier, and can understand the abnormality in more detail, than a charged particle beam drawing apparatus in which the report that at least one of the calculating portions (CPUs) $10b1g4c1$, $10b1g4c2$, $10b1g4c3$ etc. of the processing portion (SDTS) $10b1g4$, the memory $10b1g4d$ of the processing portion (SDTS) $10b1g4$, and the communication in the processing portion (SDTS) $10b1g4$, is abnormal, is not transferred from the daemon (sgsd) $10b1g4a$ of the processing portion (SDTS) $10b1g4$ to the DPM process PR9 (see FIG. 6), and the Output process PR7 (see FIG. 6) is started, so that, the abnormality is not recognized until a timeout error of the Output process PR7 (see FIG. 6) occurs.

Figure 16:
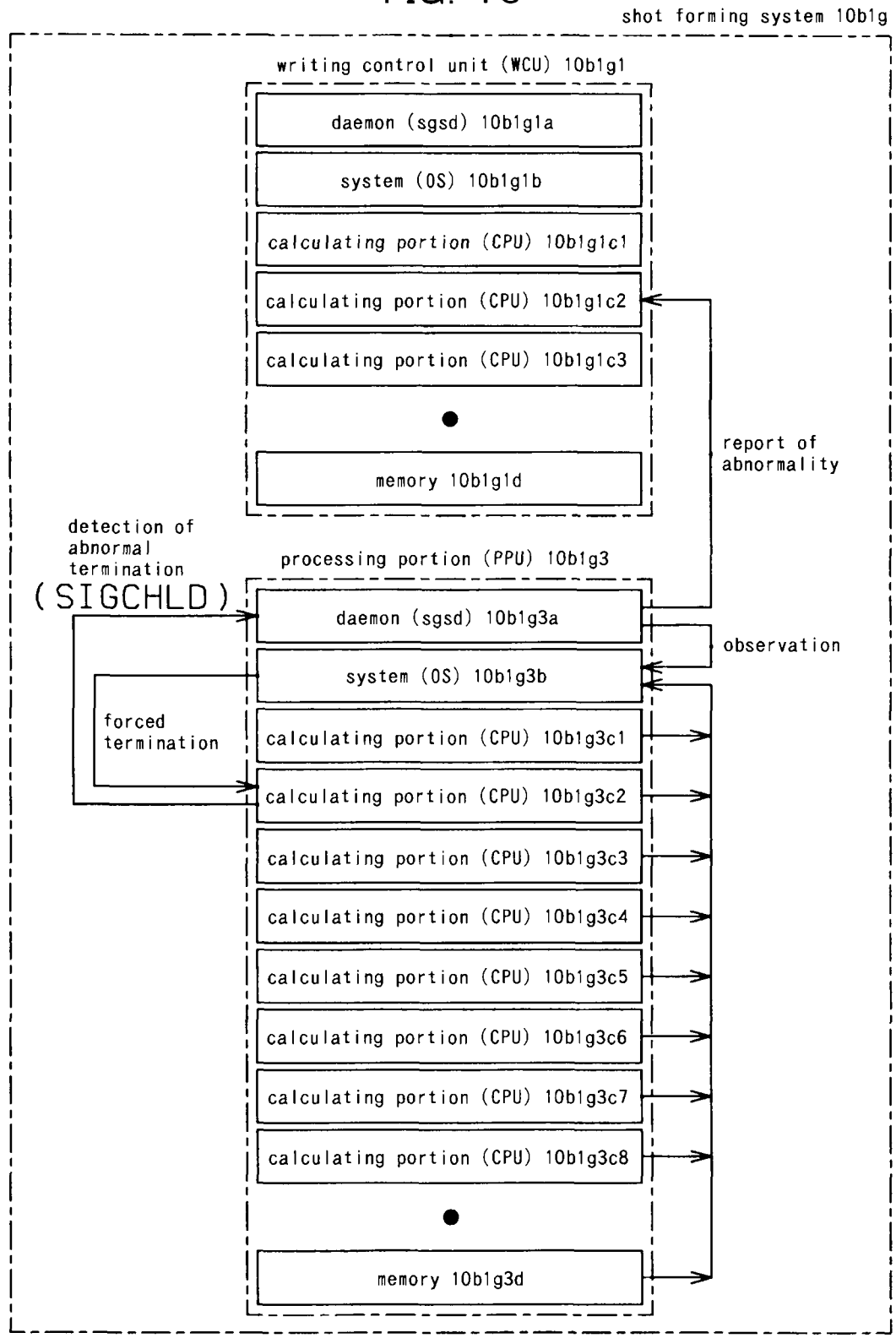
FIG. 16 shows another example of a report of abnormality transferred from the daemon (sgsd) 10$b$1$g$3$a$ of the processing portion (PPU) 10$b$1$g$3.

FIG. 16 shows another example of a report of abnormality transferred from the daemon (sgsd) $10b1g3a$ of the processing portion (PPU) $10b1g3$.

In the charged particle beam drawing apparatus 10 of the first embodiment, as shown in FIG. 16, the utilization rate of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$ and the utilization rate of the memory $10b1g3d$ of the processing portion (PPU) $10b1g3$ are managed by the system (OS) $10b1g3b$ of the processing portion (PPU) $10b1g3$. The system (OS) $10b1g3b$ of the processing portion (PPU) $10b1g3$ is managed by the daemon (sgsd) $10b1g3a$ of the processing portion (PPU) $10b1g3$. Also, in the charged particle beam drawing apparatus 10 of the first embodiment, as shown in FIG. 15, normality of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$, the memory $10b1g3d$ of the processing portion (PPU) $10b1g3$, and communication in the processing portion (PPU) $10b1g3$ is managed by the daemon (sgsd) $10b1g3a$ of the processing portion (PPU) $10b1g3$.

In detail, in the charged particle beam drawing apparatus 10 of the first embodiment, as shown in FIG. 16, if abnormality of the calculating portion (CPU) $10b1g3c2$ of the processing portion (PPU) $10b1g3$ occurs, and if the Converter process PR2 (see FIG. 6), the Shot process PR3 (see FIG. 6), the Area process PR5 (see FIG. 6) or the Prox process PR6 (see FIG. 6) performed by the calculating portion (CPU) $10b1g3c2$ of the processing portion (PPU) $10b1g3$ is forcedly terminated by the system (OS) $10b1g3b$ of the processing portion (PPU) $10b1g3$, an abnormal termination of the Converter process PR2 (see FIG. 6), the Shot process PR3 (see FIG. 6), the Area process PR5 (see FIG. 6) or the Prox process PR6 (see FIG. 6) is detected by the daemon (sgsd) $10b1g3a$ of the processing portion (PPU) $10b1g3$. And then, a report that the Converter process PR2 (see FIG. 6), the Shot process PR3 (see FIG. 6), the Area process PR5 (see FIG. 6) or the Prox process PR6 (see FIG. 6) performed by the calculating portion (CPU) $10b1g3c2$ of the processing portion (PPU) $10b1g3$ is abnormally terminated, is transferred from the daemon (sgsd) $10b1g3a$ of the processing portion (PPU)

$10b1g3$ to the DPM process PR9 (see FIG. 6) performed by the calculating portion (CPU) $10b1g1c2$ of the writing control unit (WCU) $10b1g1$. In detail, information such as node, name of process, pid (process identifier), name of core file, of the Converter process PR2 (see FIG. 6), the Shot process PR3 (see FIG. 6), the Area process PR5 (see FIG. 6) or the Prox process PR6 (see FIG. 6) which is abnormally terminated, is transferred from the daemon (sgsd) $10b1g3a$ of the processing portion (PPU) $10b1g3$ to the DPM process PR9 (see FIG. 6) performed by the calculating portion (CPU) $10b1g1c2$ of the writing control unit (WCU) $10b1g1$.

Accordingly, the charged particle beam drawing apparatus 10 of the first embodiment can recognize an abnormality earlier, and can understand the abnormality in more detail, than a charged particle beam drawing apparatus in which the report that the Converter process PR2 (see FIG. 6), the Shot process PR3 (see FIG. 6), the Area process PR5 (see FIG. 6) or the Prox process PR6 (see FIG. 6) performed by the calculating portion (CPU) $10b1g3c2$ of the processing portion (PPU) $10b1g3$ is abnormally terminated, is not transferred from the daemon (sgsd) $10b1g3a$ of the processing portion (PPU) $10b1g3$ to the DPM process PR9 (see FIG. 6), so that, the abnormality is not recognized until a timeout error of the Converter process PR2 (see FIG. 6), the Shot process PR3 (see FIG. 6), the Area process PR5 (see FIG. 6) or the Prox process PR6 (see FIG. 6) occurs.

In the charged particle beam drawing apparatus 10 of the first embodiment, as shown in FIG. 8, if abnormality of the calculating portion (CPU) $10b1g2c2$ of the processing portion (DDU) $10b1g2$ occurs, and if the Distributor process PR1 (see FIG. 6) or the Distributor process PR4 (see FIG. 6) performed by the calculating portion (CPU) $10b1g2c2$ of the processing portion (DDU) $10b1g2$ is forcedly terminated by the system (OS) $10b1g2b$ of the processing portion (DDU) $10b1g2$, an abnormal termination of the Distributor process PR1 (see FIG. 6) or the Distributor process PR4 (see FIG. 6) is detected by the daemon (sgsd) $10b1g2a$ of the processing portion (DDU) $10b1g2$. And then, a report that the Distributor process PR1 (see FIG. 6) or the Distributor process PR4 (see FIG. 6) performed by the calculating portion (CPU) $10b1g2c2$ of the processing portion (DDU) $10b1g2$ is abnormally terminated, is transferred from the daemon (sgsd) $10b1g2a$ of the processing portion (DDU) $10b1g2$ to the DPM process PR9 (see FIG. 6) performed by the calculating portion (CPU) $10b1g1c2$ of the writing control unit (WCU) $10b1g1$. In detail, information such as node, name of process, pid (process identifier), name of core file, of the Distributor process PR1 (see FIG. 6) or the Distributor process PR4 (see FIG. 6) which is abnormally terminated, is transferred from the daemon (sgsd) $10b1g2a$ of the processing portion (DDU) $10b1g2$ to the DPM process PR9 (see FIG. 6) performed by the calculating portion (CPU) $10b1g1c2$ of the writing control unit (WCU) $10b1g1$.

Accordingly, the charged particle beam drawing apparatus 10 of the first embodiment can recognize an abnormality earlier, and can understand the abnormality in more detail, than a charged particle beam drawing apparatus in which the report that the Distributor process PR1 (see FIG. 6) or the Distributor process PR4 (see FIG. 6) performed by the calculating portion (CPU) $10b1g2c2$ of the processing portion (DDU) $10b1g2$ is abnormally terminated, is not transferred from the daemon (sgsd) $10b1g2a$ of the processing portion (DDU) $10b1g2$ to the DPM process PR9 (see FIG. 6), so that, the abnormality is not recognized until a timeout error of the Distributor process PR1 (see FIG. 6) or the Distributor process PR4 (see FIG. 6) occurs.

In the charged particle beam drawing apparatus 10 of the first embodiment, as shown in FIG. 8, if abnormality of the calculating portion (CPU) $10b1g4c2$ of the processing portion (SDTS) $10b1g4$ occurs, and if the Output process PR7 (see FIG. 6) performed by the calculating portion (CPU) $10b1g4c2$ of the processing portion (SDTS) $10b1g4$ is forcedly terminated by the system (OS) $10b1g4b$ of the processing portion (SDTS) $10b1g4$, an abnormal termination of the Output process PR7 (see FIG. 6) is detected by the daemon (sgsd) $10b1g4a$ of the processing portion (SDTS) $10b1g4$. And then, a report that the Output process PR7 (see FIG. 6) performed by the calculating portion (CPU) $10b1g4c2$ of the processing portion (SDTS) $10b1g4$ is abnormally terminated, is transferred from the daemon (sgsd) $10b1g4a$ of the processing portion (SDTS) $10b1g4$ to the DPM process PR9 (see FIG. 6) performed by the calculating portion (CPU) $10b1g1c2$ of the writing control unit (WCU) $10b1g1$. In detail, information such as node, name of process, pid (process identifier), name of core file, of the Output process PR7 (see FIG. 6) which is abnormally terminated, is transferred from the daemon (sgsd) $10b1g4a$ of the processing portion (SDTS) $10b1g4$ to the DPM process PR9 (see FIG. 6) performed by the calculating portion (CPU) $10b1g1c2$ of the writing control unit (WCU) $10b1g1$.

Accordingly, the charged particle beam drawing apparatus 10 of the first embodiment can recognize an abnormality earlier, and can understand the abnormality in more detail, than a charged particle beam drawing apparatus in which the report that the Output process PR7 (see FIG. 6) performed by the calculating portion (CPU) $10b1g4c2$ of the processing portion (SDTS) $10b1g4$ is abnormally terminated, is not transferred from the daemon (sgsd) $10b1g4a$ of the processing portion (SDTS) $10b1g4$ to the DPM process PR9 (see FIG. 6), so that, the abnormality is not recognized until a timeout error of the Output process PR7 (see FIG. 6) occurs.

Figure 17:
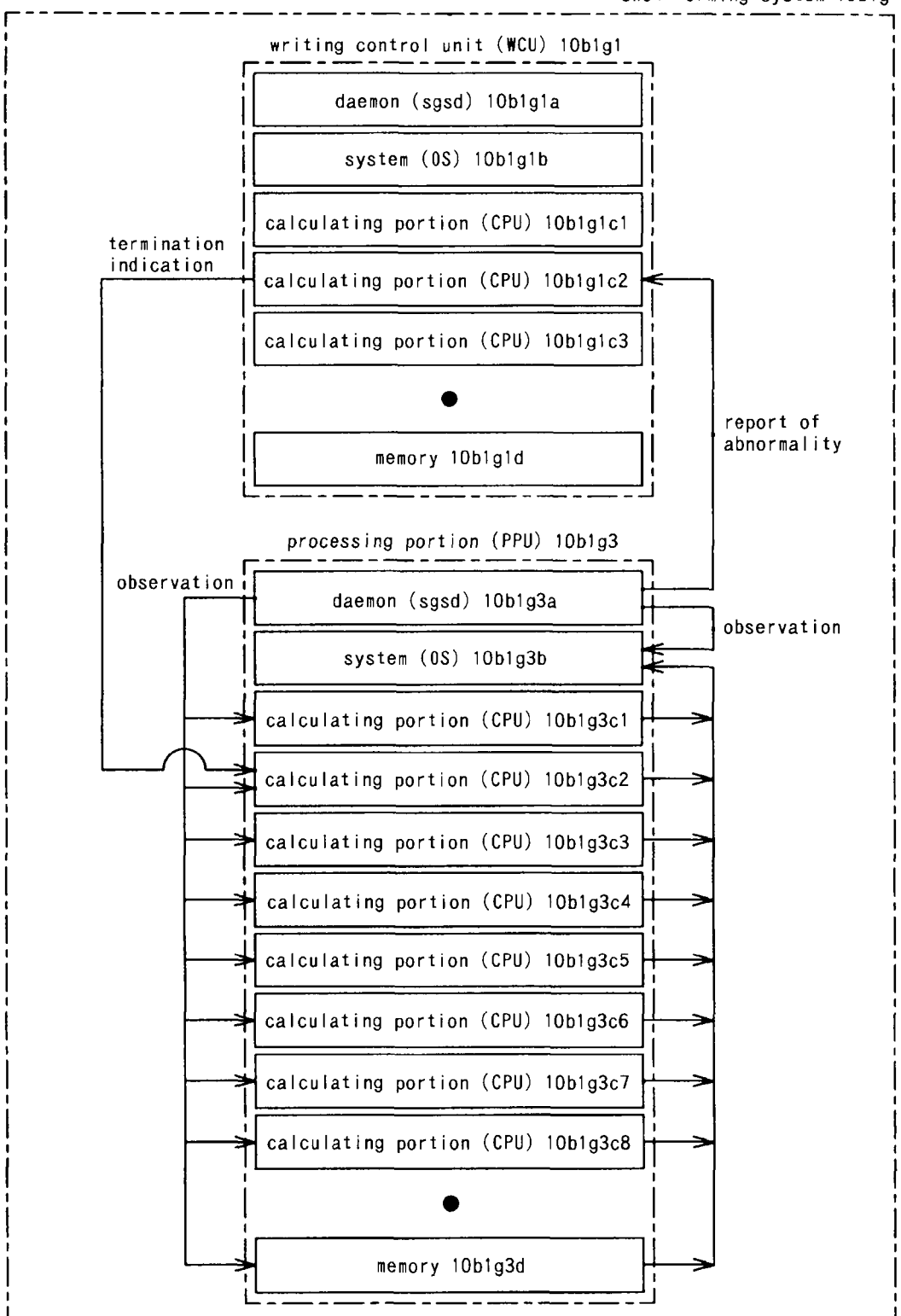
FIG. 17 shows another example of a report of abnormality transferred from the daemon (sgsd) 10$b$1$g$3$a$ of the processing portion (PPU) 10$b$1$g$3.

FIG. 17 shows another example of a report of abnormality transferred from the daemon (sgsd) $10b1g3a$ of the processing portion (PPU) $10b1g3$.

In the charged particle beam drawing apparatus 10 of the first embodiment, as shown in FIG. 17, the utilization rate of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$ and the utilization rate of the memory $10b1g3d$ of the processing portion (PPU) $10b1g3$ are managed by the system (OS) $10b1g3b$ of the processing portion (PPU) $10b1g3$. The system (OS) $10b1g3b$ of the processing portion (PPU) $10b1g3$ is managed by the daemon (sgsd) $10b1g3a$ of the processing portion (PPU) $10b1g3$. Normality of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$, the memory $10b1g3d$ of the processing portion (PPU) $10b1g3$, and communication in the processing portion (PPU) $10b1g3$ is managed by the daemon (sgsd) $10b1g3a$ of the processing portion (PPU) $10b1g3$.

In detail, in the charged particle beam drawing apparatus 10 of the first embodiment, as shown in FIG. 17, if abnormality of the Converter process PR2 (see FIG. 6), the Shot process PR3 (see FIG. 6), the Area process PR5 (see FIG. 6) or the Prox process PR6 (see FIG. 6) performed by the calculating portion (CPU) $10b1g3c2$ of the processing portion (PPU) $10b1g3$ occurs, and if the abnormality is not serious, so that forced termination (see FIG. 16) is not performed by the system (OS) $10b1g3b$ of the processing portion (PPU) $10b1g3$, a report of the abnormality including a reason why the daemon (sgsd) $10b1g3a$ of the processing portion (PPU) $10b1g3$ judges that the Converter process PR2 (see FIG. 6), the Shot process PR3 (see FIG. 6), the Area process PR5 (see FIG. 6) or the Prox process PR6 (see FIG. 6) is abnormal, is transferred from the daemon (sgsd) $10b1g3a$ of the processing portion (PPU) $10b1g3$ to the DPM process PR9 (see FIG. 6) performed by the calculating portion (CPU) $10b1g1c2$ of the writing control unit (WCU) $10b1g1$. And then, if the DPM process PR9 (see FIG. 6) also judges that the Converter process PR2 (see FIG. 6), the Shot process PR3 (see FIG. 6), the Area process PR5 (see FIG. 6) or the Prox process PR6 (see FIG. 6) is abnormal, a termination indication is transferred from the DPM process PR9 (see FIG. 6) performed by the calculating portion (CPU) $10b1g1c2$ of the writing control unit (WCU) $10b1g1$, to the Converter process PR2 (see FIG. 6), the Shot process PR3 (see FIG. 6), the Area process PR5 (see FIG. 6) or the Prox process PR6 (see FIG. 6) performed by the calculating portion (CPU) $10b1g3c2$ of the processing portion (PPU) $10b1g3$. And then, the Converter process PR2 (see FIG. 6), the Shot process PR3 (see FIG. 6), the Area process PR5 (see FIG. 6) or the Prox process PR6 (see FIG. 6) is terminated on the basis of the termination indication.

Accordingly, the charged particle beam drawing apparatus 10 of the first embodiment can recognize an abnormality earlier, and can understand the abnormality in more detail, than a charged particle beam drawing apparatus in which the report of the abnormality of the Converter process PR2 (see FIG. 6), the Shot process PR3 (see FIG. 6), the Area process PR5 (see FIG. 6) or the Prox process PR6 (see FIG. 6) performed by the calculating portion (CPU) $10b1g3c2$ of the processing portion (PPU) $10b1g3$, is not transferred from the daemon (sgsd) $10b1g3a$ of the processing portion (PPU) $10b1g3$ to the DPM process PR9 (see FIG. 6), so that, the performance of the Converter process PR2 (see FIG. 6), the Shot process PR3 (see FIG. 6), the Area process PR5 (see FIG. 6) or the Prox process PR6 (see FIG. 6) is continued until a timeout error of the Converter process PR2 (see FIG. 6), the Shot process PR3 (see FIG. 6), the Area process PR5 (see FIG. 6) or the Prox process PR6 (see FIG. 6) occurs.

In the charged particle beam drawing apparatus 10 of the first embodiment, as shown in FIG. 8, if abnormality of the Distributor process PR1 (see FIG. 6) or the Distributor process PR4 (see FIG. 6) performed by the calculating portion (CPU) $10b1g2c2$ of the processing portion (DDU) $10b1g2$ occurs, and if the abnormality is not serious, so that forced termination is not performed by the system (OS) $10b1g2b$ of the processing portion (DDU) $10b1g2$, a report of the abnormality including a reason why the daemon (sgsd) $10b1g2a$ of the processing portion (DDU) $10b1g2$ judges that the Distributor process PR1 (see FIG. 6) or the Distributor process PR4 (see FIG. 6) is abnormal, is transferred from the daemon (sgsd) $10b1g2a$ of the processing portion (DDU) $10b1g2$ to the DPM process PR9 (see FIG. 6) performed by the calculating portion (CPU) $10b1g1c2$ of the writing control unit (WCU) $10b1g1$. And then, if the DPM process PR9 (see FIG. 6) also judges that the Distributor process PR1 (see FIG. 6) or the Distributor process PR4 (see FIG. 6) is abnormal, a termination indication is transferred from the DPM process PR9 (see FIG. 6) performed by the calculating portion (CPU) $10b1g1c2$ of the writing control unit (WCU) $10b1g1$, to the Distributor process PR1 (see FIG. 6) or the Distributor process PR4 (see FIG. 6) performed by the calculating portion (CPU) $10b1g2c2$ of the processing portion (DDU) $10b1g2$. And then, the Distributor process PR1 (see FIG. 6) or the Distributor process PR4 (see FIG. 6) is terminated on the basis of the termination indication.

Accordingly, the charged particle beam drawing apparatus 10 of the first embodiment can recognize an abnormality earlier, and can understand the abnormality in more detail, than a charged particle beam drawing apparatus in which the report of the abnormality of the Distributor process PR1 (see FIG. 6) or the Distributor process PR4 (see FIG. 6) performed by the calculating portion (CPU) $10b1g2c2$ of the processing portion (DDU) $10b1g2$, is not transferred from the daemon (sgsd) $10b1g2a$ of the processing portion (DDU) $10b1g2$ to the DPM process PR9 (see FIG. 6), so that, the performance of the Distributor process PR1 (see FIG. 6) or the Distributor process PR4 (see FIG. 6) is continued until a timeout error of the Distributor process PR1 (see FIG. 6) or the Distributor process PR4 (see FIG. 6) occurs.

In the charged particle beam drawing apparatus 10 of the first embodiment, as shown in FIG. 8, if abnormality of the Output process PR7 (see FIG. 6) performed by the calculating portion (CPU) $10b1g4c2$ of the processing portion (SDTS) $10b1g4$ occurs, and if the abnormality is not serious, so that forced termination is not performed by the system (OS) $10b1g4b$ of the processing portion (SDTS) $10b1g4$, a report of the abnormality including a reason why the daemon (sgsd) $10b1g4a$ of the processing portion (SDTS) $10b1g4$ judges that the Output process PR7 (see FIG. 6) is abnormal, is transferred from the daemon (sgsd) $10b1g4a$ of the processing portion (SDTS) $10b1g4$ to the DPM process PR9 (see FIG. 6) performed by the calculating portion (CPU) $10b1g1c2$ of the writing control unit (WCU) $10b1g1$. And then, if the DPM process PR9 (see FIG. 6) also judges that the Output process PR7 (see FIG. 6) is abnormal, a termination indication is transferred from the DPM process PR9 (see FIG. 6) performed by the calculating portion (CPU) $10b1g1c2$ of the writing control unit (WCU) $10b1g1$, to the Output process PR7 (see FIG. 6) performed by the calculating portion (CPU) $10b1g4c2$ of the processing portion (SDTS) $10b1g4$. And then, the Output process PR7 (see FIG. 6) is terminated on the basis of the termination indication.

Accordingly, the charged particle beam drawing apparatus 10 of the first embodiment can recognize an abnormality earlier, and can understand the abnormality in more detail, than a charged particle beam drawing apparatus in which the report of the abnormality of the Output process PR7 (see FIG. 6) performed by the calculating portion (CPU) $10b1g4c2$ of the processing portion (SDTS) $10b1g4$, is not transferred from the daemon (sgsd) $10b1g4a$ of the processing portion (SDTS) $10b1g4$ to the DPM process PR9 (see FIG. 6), so that, the performance of the Output process PR7 (see FIG. 6) is continued until a timeout error of the Output process PR7 (see FIG. 6) occurs.

Figure 18:
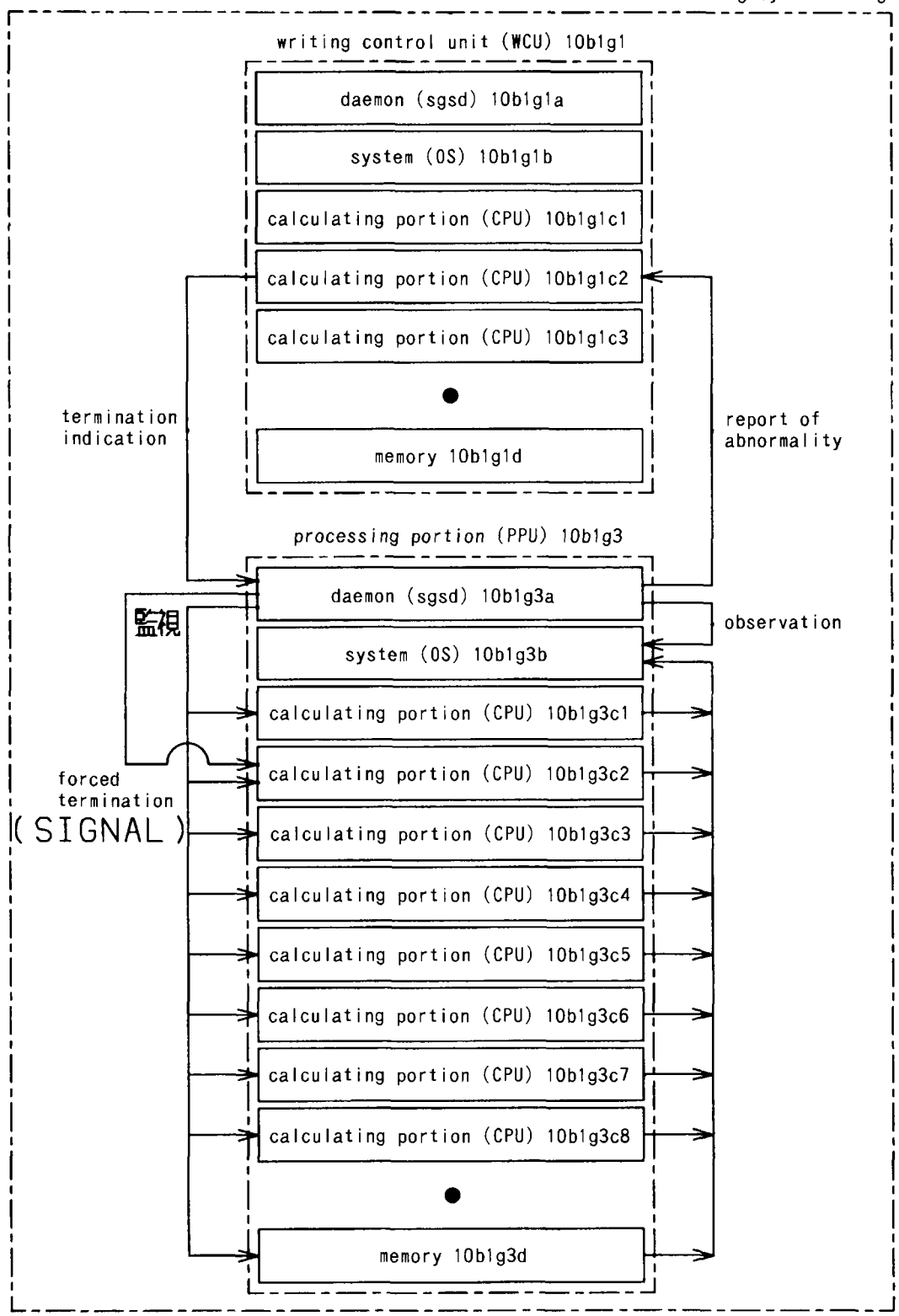
FIG. 18 shows another example of a report of abnormality transferred from the daemon (sgsd) 10$b$1$g$3$a$ of the processing portion (PPU) 10$b$1$g$3.

FIG. 18 shows another example of a report of abnormality transferred from the daemon (sgsd) $10b1g3a$ of the processing portion (PPU) $10b1g3$.

In the charged particle beam drawing apparatus 10 of the first embodiment, as shown in FIG. 18, the utilization rate of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$ and the utilization rate of the memory $10b1g3d$ of the processing portion (PPU) $10b1g3$ are managed by the system (OS) $10b1g3b$ of the processing portion (PPU) $10b1g3$. The system (OS) $10b1g3b$ of the processing portion (PPU) $10b1g3$ is managed by the daemon (sgsd) $10b1g3a$ of the processing portion (PPU) $10b1g3$. Normality of the calculating portions (CPUs) $10b1g3c1$, $10b1g3c2$, $10b1g3c3$, $10b1g3c4$, $10b1g3c5$, $10b1g3c6$, $10b1g3c7$, $10b1g3c8$ etc. of the processing portion (PPU) $10b1g3$, the memory $10b1g3d$ of the processing portion (PPU) $10b1g3$, and communication in the processing portion (PPU) $10b1g3$ is managed by the daemon (sgsd) $10b1g3a$ of the processing portion (PPU) $10b1g3$.

In detail, in the charged particle beam drawing apparatus 10 of the first embodiment, as shown in FIG. 18, if abnormality of the Converter process PR2 (see FIG. 6), the Shot process PR3 (see FIG. 6), the Area process PR5 (see FIG. 6) or the Prox process PR6 (see FIG. 6) performed by the calculating portion (CPU) $10b1g3c2$ of the processing portion (PPU) $10b1g3$ occurs, and if the abnormality is not serious, so that forced termination (see FIG. 16) is not performed by the system (OS) $10b1g3b$ of the processing portion (PPU) $10b1g3$, a report of the abnormality including a reason why the daemon (sgsd) $10b1g3a$ of the processing portion (PPU) $10b1g3$ judges that the Converter process PR2 (see FIG. 6), the Shot process PR3 (see FIG. 6), the Area process PR5 (see FIG. 6) or the Prox process PR6 (see FIG. 6) is abnormal, is transferred from the daemon (sgsd) $10b1g3a$ of the processing portion (PPU) $10b1g3$ to the DPM process PR9 (see FIG. 6) performed by the calculating portion (CPU) $10b1g1c2$ of the writing control unit (WCU) $10b1g1$. And then, if the DPM process PR9 (see FIG. 6) also judges that the Converter process PR2 (see FIG. 6), the Shot process PR3 (see FIG. 6), the Area process PR5 (see FIG. 6) or the Prox process PR6 (see FIG. 6) is abnormal, and if the Converter process PR2 (see FIG. 6), the Shot process PR3 (see FIG. 6), the Area process PR5 (see FIG. 6) or the Prox process PR6 (see FIG. 6) cannot be terminated on the basis of a termination indication (see FIG. 17) transferred from the DPM process PR9 (see FIG. 6) to the Converter process PR2 (see FIG. 6), the Shot process PR3 (see FIG. 6), the Area process PR5 (see FIG. 6) or the Prox process PR6 (see FIG. 6), another termination indication is transferred from the DPM process PR9 (see FIG. 6) performed by the calculating portion (CPU) $10b1g1c2$ of the writing control unit (WCU) $10b1g1$, to the daemon (sgsd) $10b1g3a$ of the processing portion (PPU) $10b1g3$. And then, the Converter process PR2 (see FIG. 6), the Shot process PR3 (see FIG. 6), the Area process PR5 (see FIG. 6) or the Prox process PR6 (see FIG. 6) is forcedly terminated by the daemon (sgsd) $10b1g3a$ of the processing portion (PPU) $10b1g3$ on the basis of the termination indication. In detail, detail error information, such as core file, is collected by the daemon (sgsd) $10b1g3a$ of the processing portion (PPU) $10b1g3$.

Accordingly, the charged particle beam drawing apparatus 10 of the first embodiment can recognize an abnormality earlier, and can understand the abnormality in more detail, than a charged particle beam drawing apparatus in which the report of the abnormality of the Converter process PR2 (see FIG. 6), the Shot process PR3 (see FIG. 6), the Area process PR5 (see FIG. 6) or the Prox process PR6 (see FIG. 6) performed by the calculating portion (CPU) $10b1g3c2$ of the processing portion (PPU) $10b1g3$, is not transferred from the daemon (sgsd) $10b1g3a$ of the processing portion (PPU) $10b1g3$ to the DPM process PR9 (see FIG. 6), so that, the performance of the Converter process PR2 (see FIG. 6), the Shot process PR3 (see FIG. 6), the Area process PR5 (see FIG. 6) or the Prox process PR6 (see FIG. 6) is continued until a timeout error of the Converter process PR2 (see FIG. 6), the Shot process PR3 (see FIG. 6), the Area process PR5 (see FIG. 6) or the Prox process PR6 (see FIG. 6) occurs.

In the charged particle beam drawing apparatus 10 of the first embodiment, as shown in FIG. 8, if abnormality of the Distributor process PR1 (see FIG. 6) or the Distributor process PR4 (see FIG. 6) performed by the calculating portion (CPU) $10b1g2c2$ of the processing portion (DDU) $10b1g2$ occurs, and if the abnormality is not serious, so that forced termination is not performed by the system (OS) $10b1g2b$ of the processing portion (DDU) $10b1g2$, a report of the abnormality including a reason why the daemon (sgsd) $10b1g2a$ of the processing portion (DDU) $10b1g2$ judges that the Distributor process PR1 (see FIG. 6) or the Distributor process PR4 (see FIG. 6) is abnormal, is transferred from the daemon (sgsd) $10b1g2a$ of the processing portion (DDU) $10b1g2$ to the DPM process PR9 (see FIG. 6) performed by the calculating portion (CPU) $10b1g1c2$ of the writing control unit (WCU) $10b1g1$. And then, if the DPM process PR9 (see FIG. 6) also judges that the Distributor process PR1 (see FIG. 6) or the Distributor process PR4 (see FIG. 6) is abnormal, and if the Distributor process PR1 (see FIG. 6) or the Distributor process PR4 (see FIG. 6) cannot be terminated on the basis of a termination indication transferred from the DPM process PR9 (see FIG. 6) to the Distributor process PR1 (see FIG. 6) or the Distributor process PR4 (see FIG. 6), another termination indication is transferred from the DPM process PR9 (see FIG. 6) performed by the calculating portion (CPU) $10b1g1c2$ of the writing control unit (WCU) $10b1g1$, to the daemon (sgsd) $10b1g2a$ of the processing portion (DDU) $10b1g2$. And then, the Distributor process PR1 (see FIG. 6) or the Distributor process PR4 (see FIG. 6) is forcedly terminated by the daemon (sgsd) $10b1g2a$ of the processing portion (DDU) $10b1g2$ on the basis of the termination indication. In detail, detail error information, such as core file, is collected by the daemon (sgsd) $10b1g2a$ of the processing portion (DDU) $10b1g2$.

Accordingly, the charged particle beam drawing apparatus 10 of the first embodiment can recognize an abnormality earlier, and can understand the abnormality in more detail, than a charged particle beam drawing apparatus in which the report of the abnormality of the Distributor process PRI (see FIG. 6) or the Distributor process PR4 (see FIG. 6) performed by the calculating portion (CPU) $10b1g2c2$ of the processing portion (DDU) $10b1g2$, is not transferred from the daemon (sgsd) $10b1g2a$ of the processing portion (DDU) $10b1g2$ to the DPM process PR9 (see FIG. 6), so that, the performance of the Distributor process PR1 (see FIG. 6) or the Distributor process PR4 (see FIG. 6) is continued until a timeout error of the Distributor process PR1 (see FIG. 6) or the Distributor process PR4 (see FIG. 6) occurs.

In the charged particle beam drawing apparatus 10 of the first embodiment, as shown in FIG. 8, if abnormality of the Output process PR7 (see FIG. 6) performed by the calculating portion (CPU) $10b1g4c2$ of the processing portion (SDTS) $10b1g4$ occurs, and if the abnormality is not serious, so that forced termination is not performed by the system (OS) $10b1g4b$ of the processing portion (SDTS) $10b1g4$, a report of the abnormality including a reason why the daemon (sgsd) $10b1g4a$ of the processing portion (SDTS) $10b1g4$ judges that the Output process PR7 (see FIG. 6) is abnormal, is transferred from the daemon (sgsd) $10b1g4a$ of the processing portion (SDTS) $10b1g4$ to the DPM process PR9 (see FIG. 6) performed by the calculating portion (CPU) $10b1g1c2$ of the writing control unit (WCU) $10b1g1$. And then, if the DPM process PR9 (see FIG. 6) also judges that the Output process PR7 (see FIG. 6) is abnormal, and if the Output process PR7 (see FIG. 6) cannot be terminated on the basis of a termination indication transferred from the DPM process PR9 (see FIG. 6) to the Output process PR7 (see FIG. 6), another termination indication is transferred from the DPM process PR9 (see FIG. 6) performed by the calculating portion (CPU) $10b1g1c2$ of the writing control unit (WCU) $10b1g1$, to the daemon (sgsd) $10b1g4a$ of the processing portion (SDTS) $10b1g4$. And then, the Output process PR7 (see FIG. 6) is forcedly terminated by the daemon (sgsd) $10b1g4a$ of the processing portion (SDTS) $10b1g4$ on the basis of the termination indication. In detail, detail error information, such as core file, is collected by the daemon (sgsd) $10b1g4a$ of the processing portion (SDTS) $10b1g4$.

Accordingly, the charged particle beam drawing apparatus 10 of the first embodiment can recognize an abnormality earlier, and can understand the abnormality in more detail, than a charged particle beam drawing apparatus in which the report of the abnormality of the Output process PR7 (see FIG. 6) performed by the calculating portion (CPU) 10b1g4c2 of the processing portion (SDTS) 10b1g4, is not transferred from the daemon (sgsd) 10b1g4a of the processing portion (SDTS) 10b1g4 to the DPM process PR9 (see FIG. 6), so that, the performance of the Output process PR7 (see FIG. 6) is continued until a timeout error of the Output process PR7 (see FIG. 6) occurs.

In the charged particle beam drawing apparatus 10 of the first embodiment, the processing portion (DDU) 10b1g2, the processing portion (PPU) 10b1g3 and the processing portion (SDTS) 10b1g4 are separately provided with the shot forming system 10b1g. In the charged particle beam drawing apparatus 10 of a third embodiment, one processing portion (not shown) is provided with the shot forming system 10b1g, and the processing portion (not shown) includes a plurality of calculating portions (CPUs) (not shown). In detail, in the charged particle beam drawing apparatus 10 of the third embodiment, the Distributor process PR1, the Converter process PR2, the Shot process PR3, the Distributor process PR4, the Area process PR5, the Prox process PR6 and the Output process PR7 are performed by the calculating portions (CPUs) (not shown).

In the charged particle beam drawing apparatus 10 of a forth embodiment, above mentioned first to third embodiments, and examples are appropriately combined.

As many apparently widely different embodiments of this invention may be made without departing from the spirit and scope thereof, it is to be understood that the invention is not limited to the specific embodiments thereof except as defined in the appended claims.

What is claimed is:

1. A charged particle beam drawing apparatus, comprising:
    a drawing portion configured to draw patterns corresponding to figures included in a drawing data, in a drawing area of a workpiece, by irradiating the workpiece with a charged particle beam, wherein the workpiece is formed by applying a resist to an upper surface of the workpiece;
    a shot forming system configured to form and output a shot data on the basis of the drawing data, in order to apply the charged particle beam;
    a plurality of processing portions configured to perform a process for forming the shot data, and to perform a process for outputting the shot data, wherein the plurality of processing portions is provided with the shot forming system;
    a writing control unit configured to perform a process for managing the plurality of processing portions, wherein the writing control unit is provided with the shot forming system;
    a plurality of calculating portions provided with each of the plurality of processing portions;
    at least one memory provided with each of the plurality of processing portions, wherein the memory is used by the plurality of calculating portions; and
    at least one daemon provided with each of the plurality of processing portions,
    wherein the daemon judges if at least one of the calculating portions is free, judges if the memory includes a free portion, and judges if there is a possibility of a shortage of the calculating portions and the memory, and wherein if at least one of the calculating portions is free and the memory includes the free portion, a report that a next process can be additionally started by using at least one free calculating portion and the free portion of the memory, is transferred from the daemon to the writing control unit, and the next process is additionally started by the daemon on the basis of a start request transferred from the writing control unit to the daemon, and wherein if there is a possibility of a shortage of the calculating portions and the memory, and if a start request for starting a next process is transferred from the writing control unit to the daemon, the start request for starting the next process is refused by the daemon, and
    wherein a first process is performed for a plurality of block frames into which the drawing area is virtually divided, in parallel by a first calculating portion of the plurality of calculating portions,
    a second process is performed for the plurality of block frames, in parallel by a second calculating portion of the plurality of calculating portions, and
    a daemon provided with the first processing portion, in case that the calculating portions include a free calculating portion and the memory includes a free portion in the first processing portion while the first process is performed by the first processing portion, controls so that the second process can be additionally started for a next block frame by using the free calculating portion and the free portion of the memory in the first processing portion.

2. The charged particle beam drawing apparatus according to claim 1, further comprising:
    a memory provided with the writing control unit; and
    a daemon provided with the writing control unit,
    wherein the daemon of the writing control unit judges if there is a possibility of a shortage of the memory of the writing control unit, and wherein if there is a possibility of a shortage of the memory of the writing control unit, and if a start request for starting a next process by using the memory of the writing control unit is transferred to the daemon of the writing control unit, the start request for starting the next process by using the memory of the writing control unit is refused by the daemon of the writing control unit.

3. The charged particle beam drawing apparatus according to claim 1, wherein while a plurality of processes are performed by using the calculating portions of the processing portion and the memory of the processing portion, if there is a possibility of a shortage of the calculating portions of the processing portion and the memory of the processing portion, the daemon of the processing portion temporarily stops a performance of at least one of the processes, wherein the at least one of the processes has a drawing order posteriority.

4. The charged particle beam drawing apparatus according to claim 3, wherein the performance of the at least one of the processes having the drawing order posteriority is restarted by the daemon of the processing portion, after at least one other process having a drawing order priority is performed and the possibility of the shortage of the calculating portions of the processing portion and the memory of the processing portion does not exist.

5. The charged particle beam drawing apparatus according to claim 1, wherein while a plurality of processes are performed by using the calculating portions of the processing portion and the memory of the processing portion, if there is a possibility of a shortage of the calculating portions of the processing portion and the memory of the processing portion, the daemon of the processing portion cancels a performance of at least one of the processes, wherein the at least one of the processes has a drawing order posteriority.

6. A control method of a charged particle beam drawing apparatus for drawing patterns corresponding to figures included in a drawing data, in a drawing area of a workpiece, by irradiating the workpiece with a charged particle beam, wherein the workpiece is formed by applying a resist to an upper surface of the workpiece, comprising:

performing a process for forming a shot data and a process for outputting the shot data, by using a plurality of processing portions provided with a shot forming system, on the basis of the drawing data, in order to apply the charged particle beam;

performing a process for managing the a plurality of processing portions, by using a writing control unit provided with the shot forming system;

judging if at least one of calculating portions provided with each of the plurality of processing portions is free, by using at least one daemon provided with a corresponding processing portion of the plurality of processing portions;

judging if at least one memory provided with each of the plurality of processing portions includes a free portion, by using the at least one daemon provided with the corresponding processing portion, wherein the memory is used by the calculating portions; and judging if there is a possibility of a shortage of the calculating portions and the memory provided with each of the corresponding processing portions, by using the at least one daemon provided with the corresponding processing portion, wherein if at least one of the calculating portions is free and the memory includes the free portion, a report that a next process can be additionally started by using at least one free calculating portion and the free portion of the memory, is transferred from the daemon to the writing control unit, and the next process is additionally started by the daemon on the basis of a start request transferred from the writing control unit to the daemon, wherein if there is a possibility of a shortage of the calculating portions and the memory, and if a start request for starting a next process is transferred from the writing control unit to the daemon, the start request for starting the next process is refused by the daemon, and wherein a first process is performed for a plurality of block frames into which the drawing area is virtually divided, in parallel by a first calculating portion of the plurality of calculating portions, a second process is performed for the plurality of block frames, in parallel by a second calculating portion of the plurality of calculating portions, and a daemon provided with the first processing portion, in case that the calculating portions include a free calculating portion and the memory includes a free portion in the first processing portion while the first process is performed by the first processing portion, controls so that the second process can be additionally started for a next block frame by using the free calculating portion and the free portion of the memory in the first processing portion.

7. The control method of the charged particle beam drawing apparatus according to claim 6, further comprising:

judging if there is a possibility of a shortage of a memory provided with the writing control unit, by using a daemon provided with the writing control unit, wherein if there is a possibility of a shortage of the memory of the writing control unit, and if a start request for starting a next process by using the memory of the writing control unit is transferred to the daemon of the writing control unit, the start request for starting the next process by using the memory of the writing control unit is refused by the daemon of the writing control unit.

8. The control method of the charged particle beam drawing apparatus according to claim 6, wherein while a plurality of processes are performed by using the calculating portions of the processing portion and the memory of the processing portion, if there is a possibility of a shortage of the calculating portions of the processing portion and the memory of the processing portion, the daemon of the processing portion temporarily stops a performance of at least one of the processes, wherein the at least one of the processes has a drawing order posteriority.

9. The control method of the charged particle beam drawing apparatus according to claim 8, wherein the performance of the at least one of the processes having the drawing order posteriority is restarted by the daemon of the processing portion, after at least one other process having a drawing order priority is performed and the possibility of the shortage of the calculating portions of the processing portion and the memory of the processing portion does not exist.

10. The control method of the charged particle beam drawing apparatus according to claim 6, wherein while a plurality of processes are performed by using the calculating portions of the processing portion and the memory of the processing portion, if there is a possibility of a shortage of the calculating portions of the processing portion and the memory of the processing portion, the daemon of the processing portion cancels a performance of at least one of the processes, wherein the at least one of the processes has a drawing order posteriority.

* * * * *